US010510738B2

(12) United States Patent
Kim et al.

(10) Patent No.: US 10,510,738 B2
(45) Date of Patent: Dec. 17, 2019

(54) THREE-DIMENSIONAL MEMORY DEVICE HAVING SUPPORT-DIE-ASSISTED SOURCE POWER DISTRIBUTION AND METHOD OF MAKING THEREOF

(71) Applicant: SANDISK TECHNOLOGIES LLC, Addison, TX (US)

(72) Inventors: Kwang-Ho Kim, Pleasanton, CA (US); Masaaki Higashitani, Cupertino, CA (US); Fumiaki Toyama, Cupertino, CA (US); Akio Nishida, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/243,469

(22) Filed: Jan. 9, 2019

(65) Prior Publication Data

US 2019/0221557 A1 Jul. 18, 2019

Related U.S. Application Data

(63) Continuation-in-part of application No. 15/873,101, filed on Jan. 17, 2018, now Pat. No. 10,283,493.

(51) Int. Cl.
*H01L 23/52* (2006.01)
*H01L 27/11582* (2017.01)
(Continued)

(52) U.S. Cl.
CPC .............. *H01L 25/18* (2013.01); *H01L 24/08* (2013.01); *H01L 24/80* (2013.01); *H01L 25/50* (2013.01);
(Continued)

(58) Field of Classification Search
CPC ......... H01L 27/11582; H01L 27/11556; H01L 27/0688; H01L 27/11578; H01L 27/11551;
(Continued)

(56) References Cited

U.S. PATENT DOCUMENTS

| 5,387,530 A | 2/1995 | Doyle et al. |
| 5,915,167 A | 6/1999 | Leedy |

(Continued)

FOREIGN PATENT DOCUMENTS

| EP | 1398831 A2 | 3/2004 |
| JP | 2011-204829 A | 10/2011 |

(Continued)

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Hsien Ming Lee

(74) *Attorney, Agent, or Firm* — The Marbury Law Group, PLLC

(57) ABSTRACT

A memory-containing die includes a three-dimensional memory array, a memory dielectric material layer located on a first side of the three-dimensional memory array, and memory-side bonding pads. A logic die includes a peripheral circuitry configured to control operation of the three-dimensional memory array, logic dielectric material layers located on a first side of the peripheral circuitry, and logic-side bonding pads included in the logic dielectric material layers. The logic-side bonding pads includes a pad-level mesh structure electrically connected to a source power supply circuit within the peripheral circuitry and containing an array of discrete openings therethrough, and discrete logic-side bonding pads. The logic-side bonding pads are bonded to a respective one, or a respective subset, of the memory-side bonding pads. The pad-level mesh structure can be used as a component of a source power distribution network.

20 Claims, 56 Drawing Sheets

(51) Int. Cl.
    *H01L 25/18*     (2006.01)
    *H01L 23/00*     (2006.01)
    *H01L 25/00*     (2006.01)
    *H01L 23/48*     (2006.01)
    *H01L 27/11519*     (2017.01)
    *H01L 27/11556*     (2017.01)
    *H01L 27/11529*     (2017.01)
    *H01L 27/11565*     (2017.01)
    *H01L 27/11573*     (2017.01)
    *H01L 23/522*     (2006.01)

(52) U.S. Cl.
    CPC ........ *H01L 23/481* (2013.01); *H01L 23/5226* (2013.01); *H01L 27/11519* (2013.01); *H01L 27/11529* (2013.01); *H01L 27/11556* (2013.01); *H01L 27/11565* (2013.01); *H01L 27/11573* (2013.01); *H01L 27/11582* (2013.01); *H01L 2224/08145* (2013.01); *H01L 2224/8083* (2013.01); *H01L 2924/1431* (2013.01); *H01L 2924/14511* (2013.01)

(58) Field of Classification Search
    CPC ......... H01L 27/11529; H01L 27/11524; H01L 27/1157; H01L 25/0657; H01L 2225/06541; H01L 2224/80895; H01L 2224/08145
    See application file for complete search history.

(56) References Cited

U.S. PATENT DOCUMENTS

| | | |
|---|---|---|
| 6,881,994 B2 | 4/2005 | Lee et al. |
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,696,559 B2 | 4/2010 | Arai et al. |
| 7,745,265 B2 | 6/2010 | Mokhlesi et al. |
| 7,746,680 B2 | 6/2010 | Scheuerlein et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,107,270 B2 | 1/2012 | Scheuerlein et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,349,716 B2 | 3/2013 | Alsmeier et al. |
| 8,394,716 B2 | 3/2013 | Hwang et al. |
| 8,445,347 B2 | 5/2013 | Alsmeier |
| 8,450,181 B2 | 5/2013 | Chen et al. |
| 8,614,126 B1 | 12/2013 | Lee et al. |
| 8,658,499 B2 | 2/2014 | Makala et al. |
| 8,741,761 B2 | 6/2014 | Lee et al. |
| 8,847,302 B2 | 9/2014 | Alsmeier et al. |
| 8,878,278 B2 | 11/2014 | Alsmeier et al. |
| 8,884,357 B2 | 11/2014 | Wang et al. |
| 8,946,023 B2 | 2/2015 | Makala et al. |
| 8,987,089 B1 | 3/2015 | Pachamuthu et al. |
| 9,023,719 B2 | 5/2015 | Pachamuthu et al. |
| 9,230,973 B2 | 1/2016 | Pachamuthu et al. |
| 9,230,987 B2 | 1/2016 | Pachamuthu et al. |
| 9,305,934 B1 | 4/2016 | Ding et al. |
| 9,412,749 B1 | 8/2016 | Shimabukuro et al. |
| 9,449,982 B2 | 9/2016 | Lu et al. |
| 9,449,983 B2 | 9/2016 | Yada et al. |
| 9,449,987 B1 | 9/2016 | Miyata et al. |
| 9,455,263 B2 | 9/2016 | Zhang et al. |
| 9,460,931 B2 | 10/2016 | Pachamuthu et al. |
| 9,502,471 B1 | 11/2016 | Lu et al. |
| 9,530,790 B1 | 12/2016 | Lu et al. |
| 9,543,318 B1 | 1/2017 | Lu et al. |
| 9,559,117 B2 | 1/2017 | Pachamuthu et al. |
| 9,589,981 B2 | 3/2017 | Nishikawa et al. |
| 9,620,512 B1 | 4/2017 | Nishikawa et al. |
| 9,627,403 B2 | 4/2017 | Liu et al. |
| 9,646,981 B2 | 5/2017 | Nishikawa et al. |
| RE46,435 E | 6/2017 | Scheuerlein et al. |
| 9,728,032 B2 | 8/2017 | Kelly et al. |
| 9,853,043 B2 | 12/2017 | Lu et al. |
| 9,876,031 B1 | 1/2018 | Shimizu et al. |
| 9,985,098 B2 | 5/2018 | Matsumoto et al. |
| 10,008,570 B2 | 6/2018 | Yu et al. |
| 10,020,363 B2 | 7/2018 | Ogawa et al. |
| 2003/0068859 A1 | 4/2003 | Leung et al. |
| 2003/0107092 A1 | 6/2003 | Chevallier |
| 2003/0232472 A1 | 12/2003 | Wu |
| 2006/0003531 A1 | 1/2006 | Chang et al. |
| 2006/0258076 A1 | 11/2006 | Mizushima et al. |
| 2007/0210338 A1 | 9/2007 | Orlowski |
| 2007/0252201 A1 | 11/2007 | Kito et al. |
| 2008/0067583 A1 | 3/2008 | Kidoh et al. |
| 2008/0169496 A1 | 7/2008 | Keller et al. |
| 2009/0230449 A1 | 9/2009 | Sakaguchi et al. |
| 2009/0242967 A1 | 10/2009 | Katsumata et al. |
| 2010/0044778 A1 | 2/2010 | Seol |
| 2010/0059811 A1 | 3/2010 | Sekine et al. |
| 2010/0112769 A1 | 5/2010 | Son et al. |
| 2010/0117143 A1 | 5/2010 | Lee et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0171162 A1 | 7/2010 | Katsumata et al. |
| 2010/0181610 A1 | 7/2010 | Kim et al. |
| 2010/0207195 A1 | 8/2010 | Fukuzumi et al. |
| 2010/0213458 A1 | 8/2010 | Prall |
| 2010/0320528 A1 | 12/2010 | Jeong et al. |
| 2011/0065270 A1 | 3/2011 | Shim |
| 2011/0076819 A1 | 3/2011 | Kim et al. |
| 2011/0133606 A1 | 6/2011 | Yoshida et al. |
| 2011/0151667 A1 | 6/2011 | Hwang et al. |
| 2011/0169067 A1 | 7/2011 | Ernst et al. |
| 2011/0266606 A1 | 11/2011 | Park et al. |
| 2011/0287612 A1 | 11/2011 | Lee et al. |
| 2011/0312174 A1 | 12/2011 | Lee et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0003800 A1 | 1/2012 | Lee et al. |
| 2012/0012920 A1 | 1/2012 | Shin et al. |
| 2012/0032250 A1 | 2/2012 | Son et al. |
| 2012/0052674 A1 | 3/2012 | Lee et al. |
| 2012/0068242 A1 | 3/2012 | Shin et al. |
| 2012/0074367 A1 | 3/2012 | Costa et al. |
| 2012/0119287 A1 | 5/2012 | Park et al. |
| 2012/0140562 A1 | 6/2012 | Choe et al. |
| 2012/0153376 A1 | 6/2012 | Alsmeier et al. |
| 2012/0208347 A1 | 8/2012 | Hwang et al. |
| 2012/0256247 A1 | 10/2012 | Alsmeier et al. |
| 2012/0261638 A1 | 10/2012 | Sills et al. |
| 2012/0276719 A1 | 11/2012 | Han et al. |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2013/0313717 A1 | 11/2013 | Holmes et al. |
| 2013/0322174 A1 | 12/2013 | Li et al. |
| 2014/0061750 A1 | 3/2014 | Kwon et al. |
| 2014/0061849 A1 | 3/2014 | Tanzawa |
| 2014/0199815 A1 | 7/2014 | Hwang et al. |
| 2014/0264533 A1 | 9/2014 | Simsek-Ege et al. |
| 2014/0264542 A1 | 9/2014 | Simsek-Ege et al. |
| 2014/0264545 A1 | 9/2014 | Takahashi et al. |
| 2014/0273373 A1 | 9/2014 | Makala et al. |
| 2015/0003158 A1 | 1/2015 | Aritome |
| 2015/0236038 A1 | 8/2015 | Pachamuthu et al. |
| 2016/0049421 A1 | 2/2016 | Zhang et al. |
| 2016/0079164 A1 | 3/2016 | Fukuzumi et al. |
| 2016/0181228 A1 | 6/2016 | Higuchi et al. |

(56) References Cited

U.S. PATENT DOCUMENTS

| | | | |
|---|---|---|---|
| 2017/0069598 A1 | 3/2017 | Nelson et al. | |
| 2017/0236835 A1 | 8/2017 | Nakamura et al. | |
| 2017/0373079 A1 | 12/2017 | Sharangpani et al. | |
| 2017/0373197 A1 | 12/2017 | Sharangpani et al. | |
| 2018/0122904 A1 | 5/2018 | Matsumoto et al. | |
| 2018/0122905 A1 | 5/2018 | Ogawa et al. | |
| 2018/0122906 A1 | 5/2018 | Yu et al. | |
| 2018/0151497 A1 | 5/2018 | Makala et al. | |
| 2018/0331118 A1 | 11/2018 | Amano | |
| 2018/0342455 A1 | 11/2018 | Nosho et al. | |
| 2019/0006381 A1 | 1/2019 | Nakatsuji et al. | |
| 2019/0081069 A1* | 3/2019 | Lu | H01L 27/11582 |

FOREIGN PATENT DOCUMENTS

| | | |
|---|---|---|
| WO | WO2002/015277 A2 | 2/2002 |
| WO | WO2008/118433 A1 | 10/2008 |
| WO | WO2009/085078 A1 | 7/2009 |
| WO | WO2012/003301 A2 | 1/2012 |
| WO | WO2015/012664 A1 | 8/2015 |

OTHER PUBLICATIONS

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

Chen et al., "Reliability Characteristics of NiSi Nanocrystals Embedded in Oxide and Nitride Layers for Nonvolatile Memory Application," Applied Physics Letters 92, 152114 (2008).

Ooshita et al., Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Li, W. et al., "Sacrificial Polymers for Nanofluidic Channels in Biological Applications", Nanotechnology 14 (2003) 578-583.

International Search Report & Written Opinion, PCT/US2011/042566, dated Jan. 17, 2012.

Invitation to Pay Additional Fees & Partial International Search Report, PCT/US2011/042566, dated Sep. 28, 2011.

International Search Report, PCT/US2013/035567, dated Sep. 30, 2013, 6pgs.

International Search Report, PCT/US2016/036656, dated Nov. 10, 2016, 17pgs.

Invitation to Pay Additional Fees and Partial Search Report, PCT/US2016/036656, dated Sep. 16, 2016, 7pgs.

Notice of Allowance, U.S. Appl. No. 14/995,017, filed May 20, 2016, 14pgs.

Invitation to Pay Additional Fees, PCT/US2013/024638, dated Apr. 24, 2013.

International Search Report and Written Opinion, PCT/US2014/020290, dated Jun. 25, 2014, 10pgs.

International Search Report and Written Opinion, PCT/US2014/023276, dated Jun. 30, 2014, 13pgs.

Invitation to Pay Additional Fees and Partial Search Report, PCT/US2015/015155, dated May 25, 2015, 8pgs.

U.S. Appl. No. 15/873,101, filed Jan. 17, 2018, SanDisk Technologies LLC.

U.S. Appl. No. 15/892,648, filed Feb. 9, 2018, SanDisk Technologies LLC.

U.S. Appl. No. 15/928,340, filed Mar. 22, 2018, SanDisk Technologies LLC.

U.S. Appl. No. 15/928,407, filed Mar. 22, 2018, SanDisk Technologies LLC.

U.S. Appl. No. 15/960,267, filed Apr. 24, 2018, SanDisk Technologies LLC.

U.S. Appl. No. 15/979,885, filed May 15, 2018, SanDisk Technologies LLC.

U.S. Appl. No. 16/231,752, filed Dec. 24, 2018, SanDisk Technologies LLC.

U.S. Appl. No. 16/242,216, filed Jan. 8, 2019, SanDisk Technologies LLC.

International Search Report and Written Opinion of the International Search Authority for International Patent Application No. PCT/US2018/061639, dated Mar. 11, 2019, 14 pages.

* cited by examiner

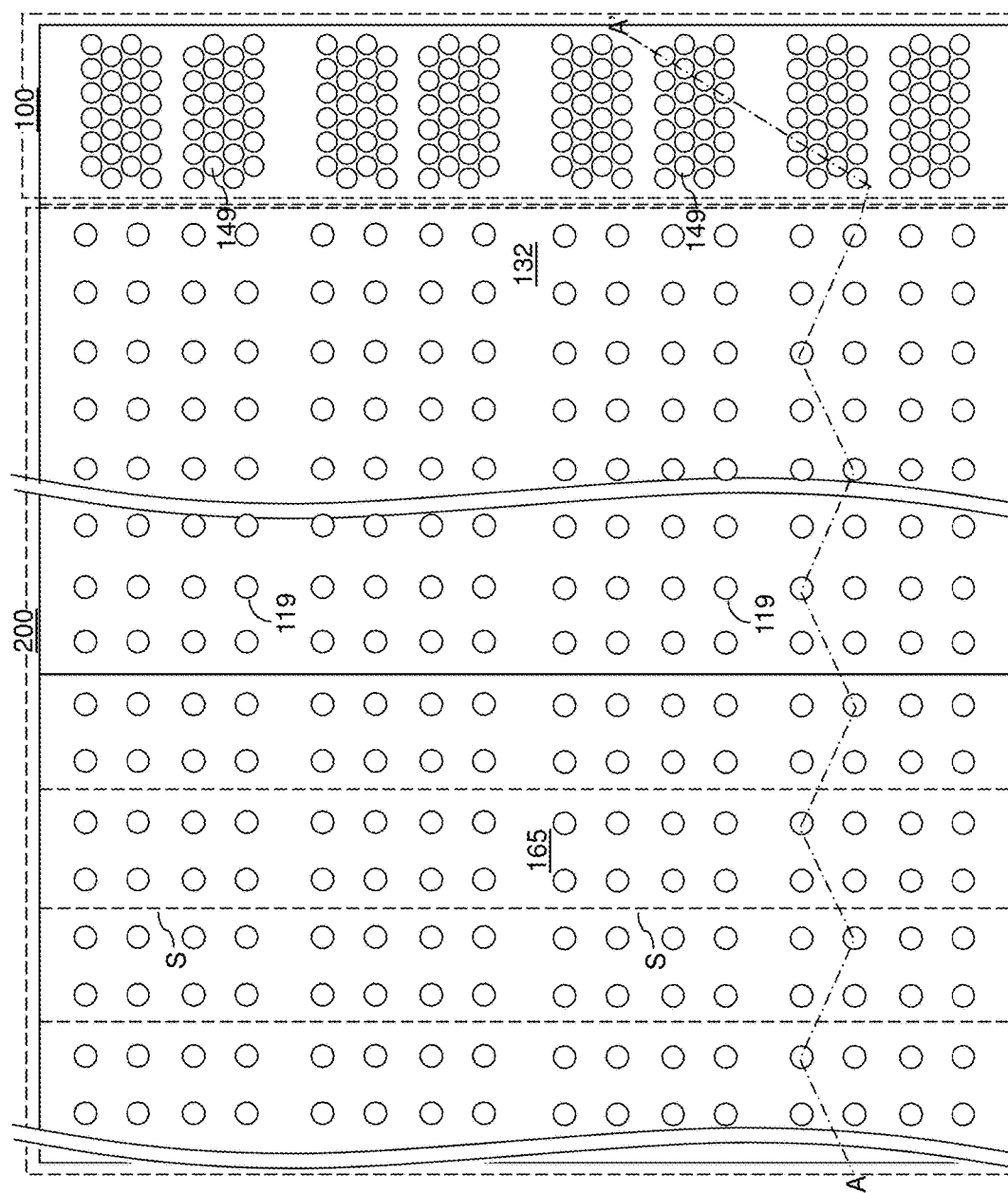

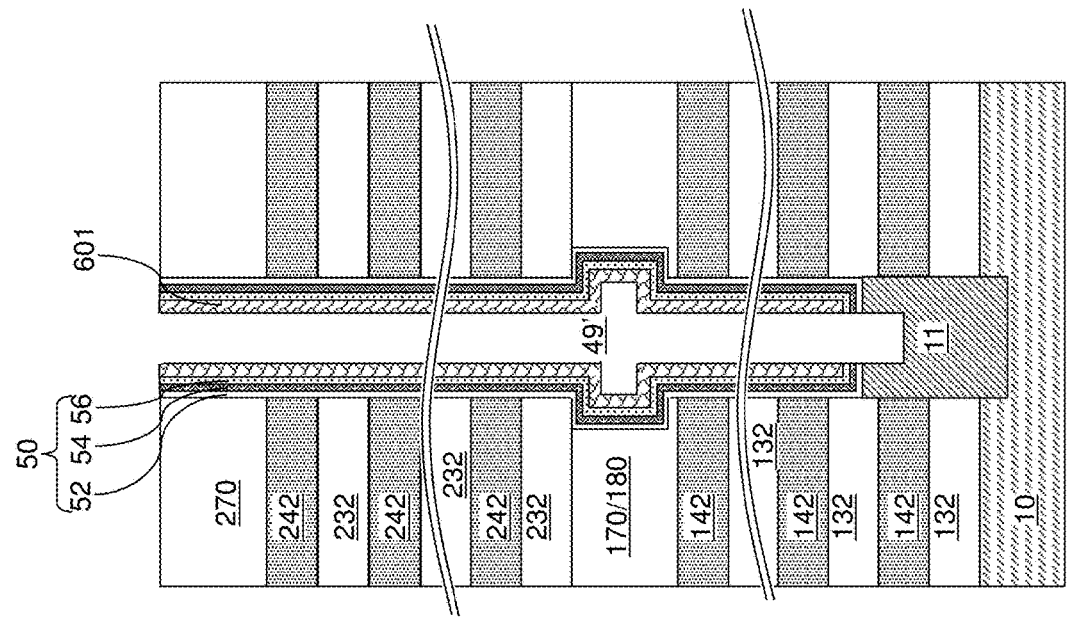
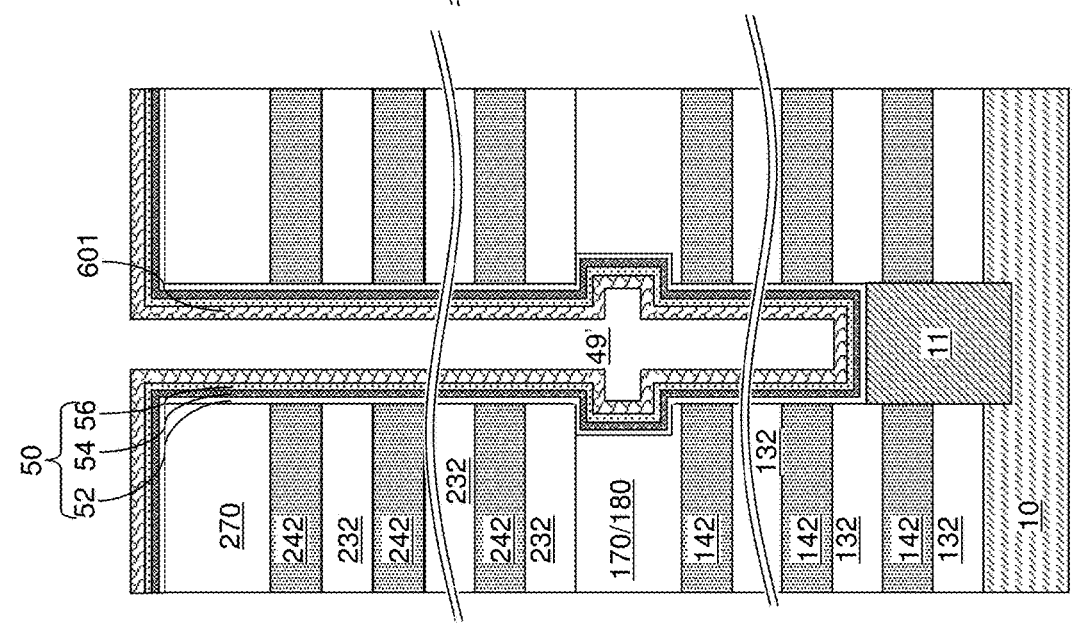

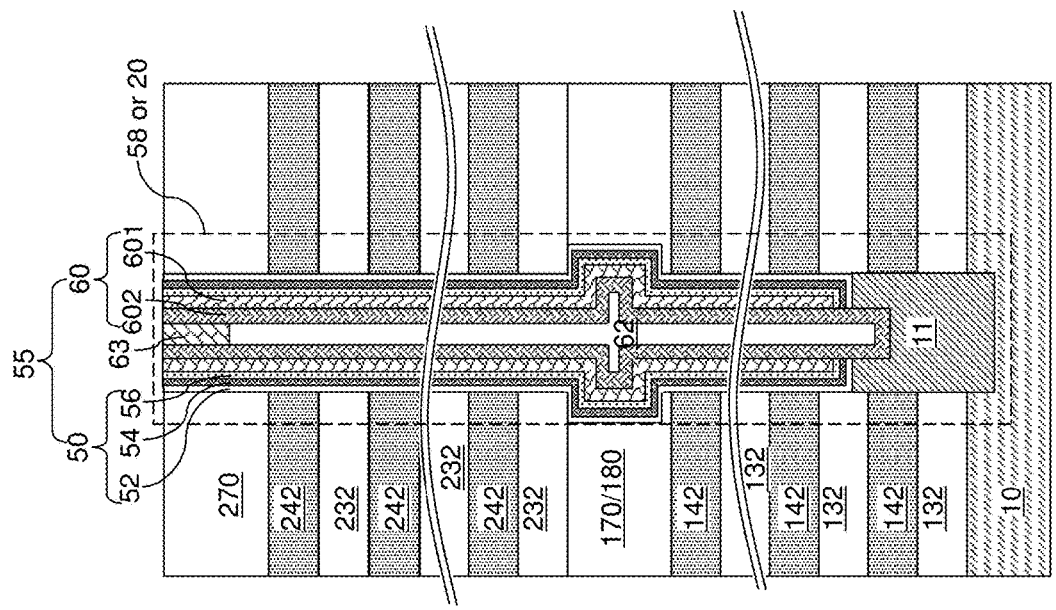
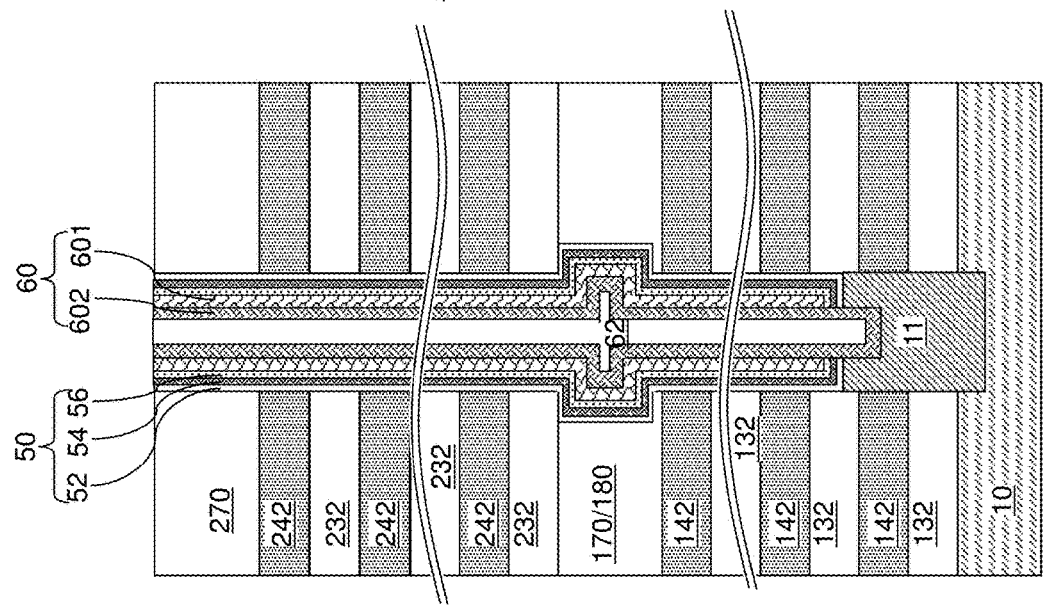

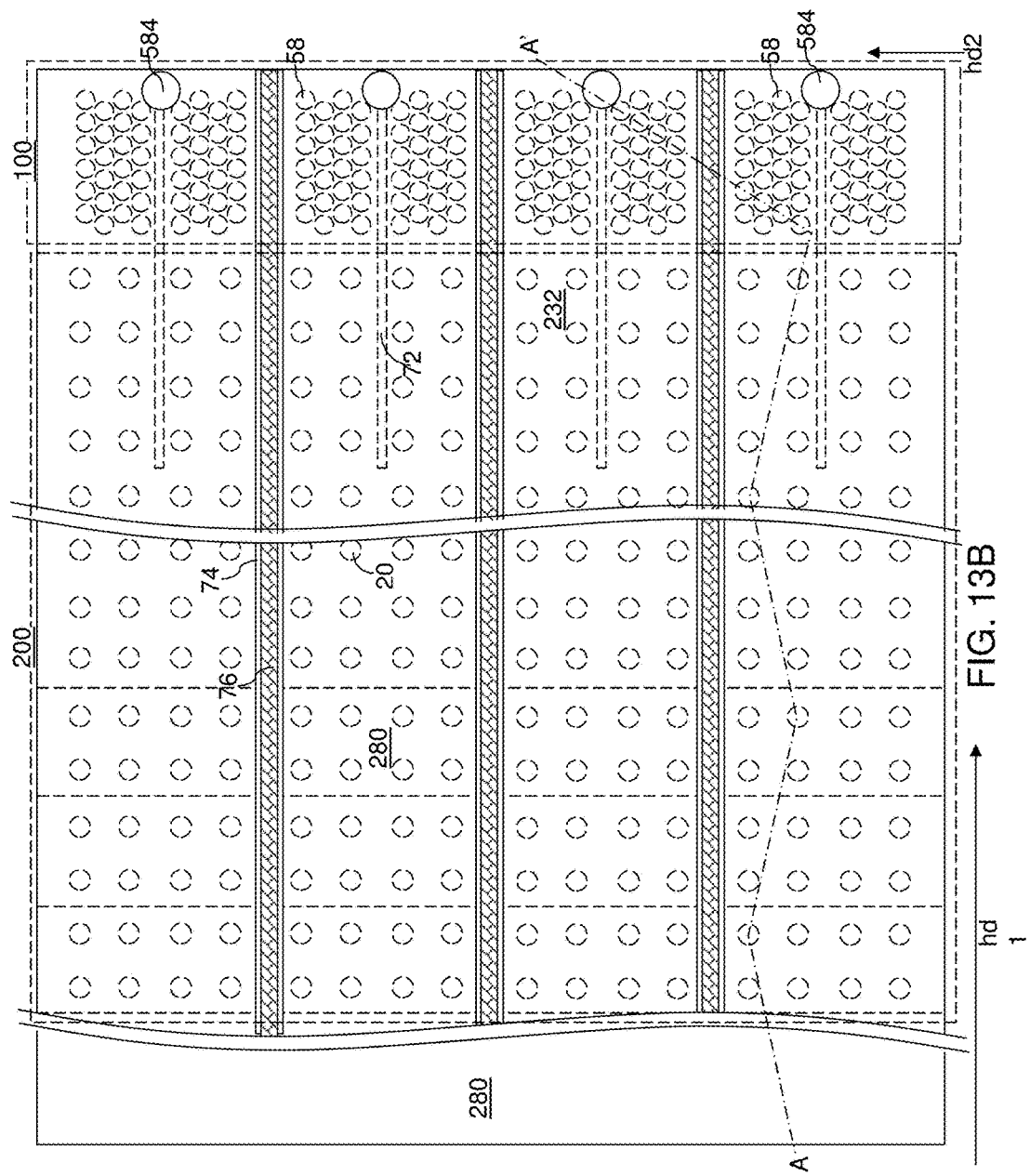

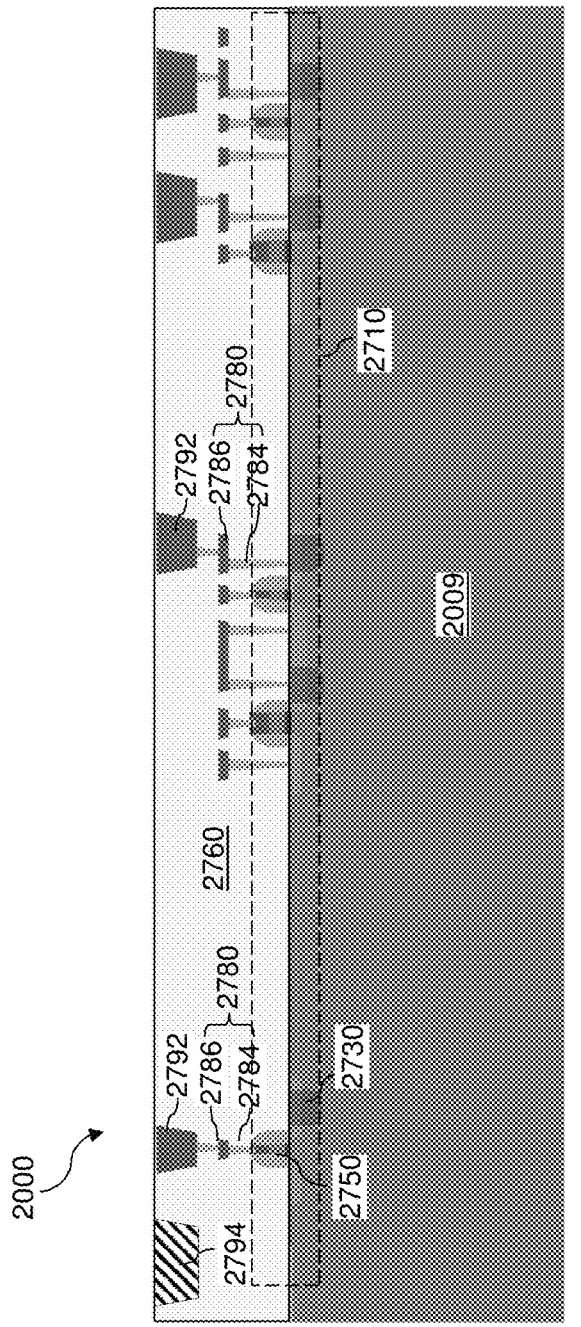
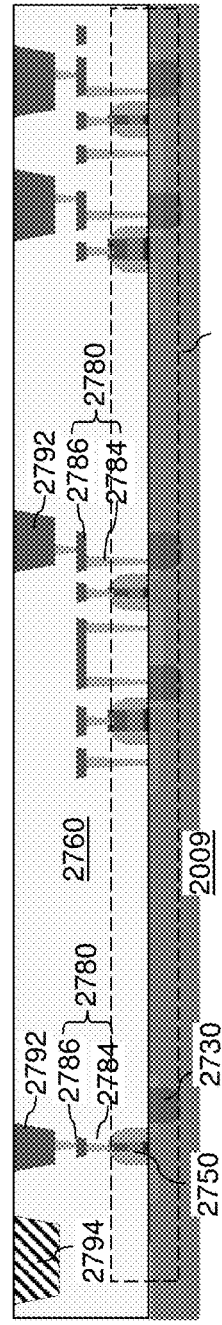
FIG. 19
FIG. 20

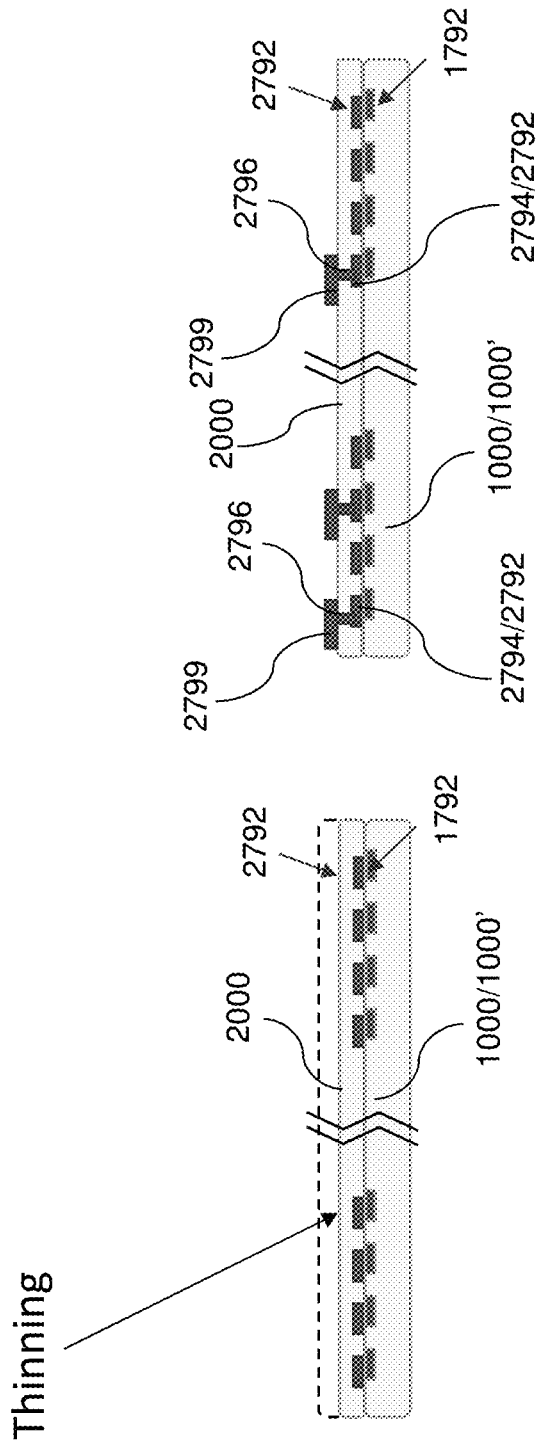

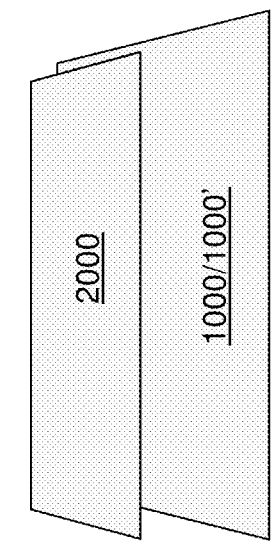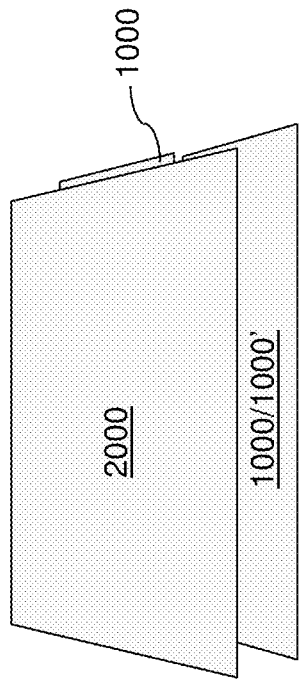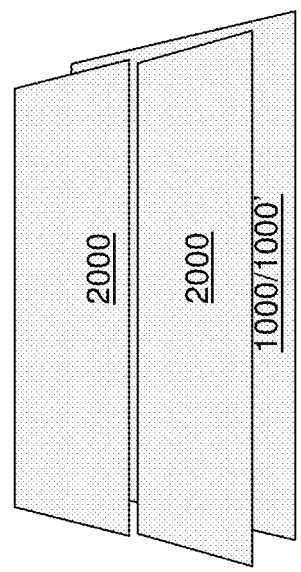

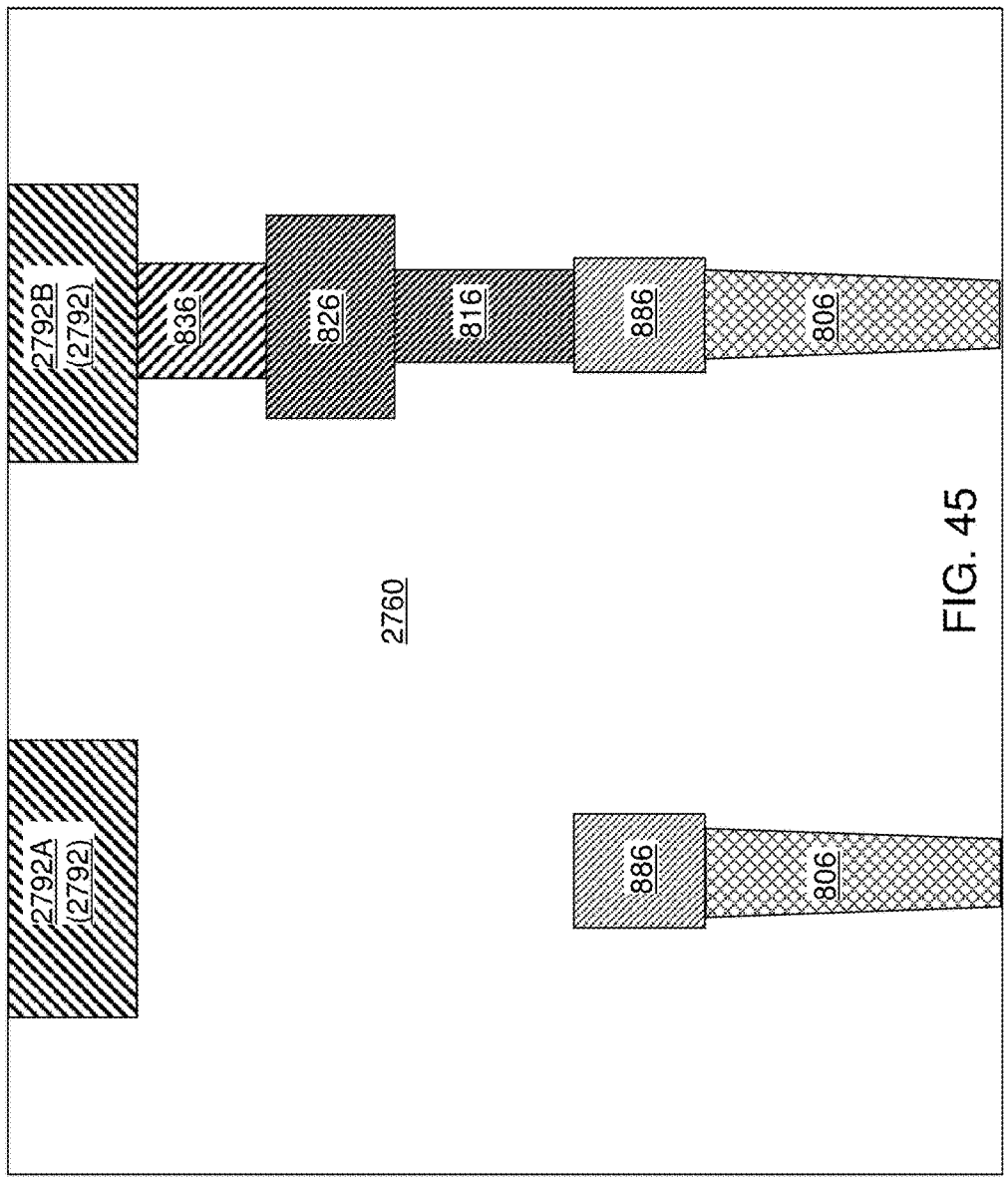

THREE-DIMENSIONAL MEMORY DEVICE HAVING SUPPORT-DIE-ASSISTED SOURCE POWER DISTRIBUTION AND METHOD OF MAKING THEREOF

RELATED APPLICATIONS

The present application is a continuation-in-part application of U.S. application Ser. No. 15/873,101 filed on Jan. 17, 2018, the entire contents of which are incorporated herein by reference.

FIELD

The present disclosure relates generally to the field of semiconductor devices and specifically to a three-dimensional memory device having support-die-assisted source power distribution and methods of making the same.

BACKGROUND

Recently, ultra-high density storage devices using three-dimensional (3D) memory stack structures have been proposed. For example, a 3D NAND stacked memory device can be formed from an array of an alternating stack of insulating materials and spacer material layers that are formed as electrically conductive layers or replaced with electrically conductive layers over a substrate containing peripheral devices (e.g., driver/logic circuits). Memory openings are formed through the alternating stack, and are filled with memory stack structures, each of which includes a vertical stack of memory elements and a vertical semiconductor channel.

SUMMARY

According to an aspect of the present disclosure, a three-dimensional memory device is provided, which comprises: a memory-containing die comprising a three-dimensional memory array, a memory dielectric material layer located on a first side of the three-dimensional memory array, and memory-side bonding pads included in the memory dielectric material layer and electrically connected to a respective node within the three-dimensional memory array; and a logic die comprising a peripheral circuitry configured to control operation of the three-dimensional memory array, logic dielectric material layers located on a first side of the peripheral circuitry, and logic-side bonding pads included in the logic dielectric material layers and electrically connected to a respective node of the peripheral circuitry and bonded to a respective one, or a respective subset, of the memory-side bonding pads, wherein the logic-side bonding pads comprise: a pad-level mesh structure electrically connected to a source power supply circuit within the peripheral circuitry and including an array of discrete openings therethrough; and discrete logic-side bonding pads electrically isolated one from another and from the pad-level mesh structure.

According to another aspect of the present disclosure, a method of forming a three-dimensional memory device is provided, which comprises: providing a memory-containing die comprising a three-dimensional memory array, a memory dielectric material layer located on a first side of the three-dimensional memory array, and memory-side bonding pads included in the memory dielectric material layer and electrically connected to a respective node within the three-dimensional memory array; and providing a logic die comprising a peripheral circuitry configured to control operation of the three-dimensional memory array, logic dielectric material layers located on a first side of the peripheral circuitry, and logic-side bonding pads included in the logic dielectric material layers and electrically connected to a respective node of the peripheral circuitry, wherein the logic-side bonding pads comprise a pad-level mesh structure electrically connected to a source power supply circuit within the peripheral circuitry and including an array of discrete openings therethrough, and discrete logic-side bonding pads electrically isolated one from another and from the pad-level mesh structure; and bonding the logic-side bonding pads to a respective one, or a respective subset, of the memory-side bonding pads.

According to an aspect of the present disclosure, a semiconductor structure is provided, which comprises: a first die comprising a three-dimensional memory device including a three-dimensional array of memory elements, a first dielectric material layer overlying, or underlying, the three-dimensional array of memory elements, and first bonding pads included in the first dielectric material layer and electrically connected to a respective node within the three-dimensional memory device; and a second die comprising a semiconductor substrate, a peripheral logic circuitry that includes complementary metal oxide semiconductor (CMOS) devices located on the semiconductor substrate, a second dielectric material layer overlying, or underlying, the CMOS devices, and second bonding pads included in the second dielectric material layer and electrically connected to a respective node within the CMOS devices, wherein the first bonding pads are bonded with the second bonding pads through copper interdiffusion to provide multiple bonded pairs of a respective first bonding pad and a respective second bonding pad at an interface between the first die and the second die.

According to another aspect of the present disclosure, a semiconductor structure comprises a first die comprising a three-dimensional memory device including a three-dimensional array of NAND memory elements, and a second die comprising a semiconductor substrate, a peripheral logic circuitry that includes complementary metal oxide semiconductor (CMOS) devices located on the semiconductor substrate. The first die is bonded to the second die. Gate structures of the CMOS devices of the second die are located between the three-dimensional array of NAND memory elements of the first die and the semiconductor substrate of the second die containing active regions separated by a channel of the CMOS devices.

According to another aspect of the present disclosure, a method of forming a semiconductor structure includes providing a first die comprising a three-dimensional memory device including a three-dimensional array of NAND memory elements, providing a second die comprising a semiconductor substrate and peripheral logic circuitry that includes complementary metal oxide semiconductor (CMOS) devices located on the semiconductor substrate, and forming a bonded assembly by bonding the first die to the second die.

BRIEF DESCRIPTION OF THE DRAWINGS

FIG. 4B is a horizontal cross-sectional view of the first exemplary structure along the horizontal plane B-B' in FIG. 4A. The zig-zag vertical plane A-A' corresponds to the plane of the vertical cross-sectional view of FIG. 4A.

FIGS. 9A-9H are sequential vertical cross-sectional views of an inter-tier memory opening during formation of a pillar channel portion, a memory stack structure, a dielectric core, and a drain region according to an embodiment of the present disclosure.

FIG. 13B is a horizontal cross-sectional view of the first exemplary structure along the horizontal plane B-B' in FIG. 13A. The zig-zag vertical plane A-A' corresponds to the plane of the vertical cross-sectional view of FIG. 13A.

FIG. 19 is a vertical cross-sectional view of a second exemplary structure that can be used to provide a second die according to an embodiment of the present disclosure.

FIG. 20 is a vertical cross-sectional view of the second exemplary structure after thinning the backside of a semiconductor substrate according to an embodiment of the present disclosure.

FIGS. 30A-30F are sequential vertical cross-sectional views of an exemplary structure during bonding of two dies according to an embodiment of the present disclosure.

FIGS. 31A-31D illustrate various configurations of areal overlap in a bonded assembly of a first die and a second die according to various embodiments of the present disclosure.

FIG. 45 is a vertical cross-sectional view along the vertical cross-sectional plane Y-Y' of FIGS. 40, 41, 42, and 43 of the second magnified region M2 according to an embodiment of the present disclosure.

DETAILED DESCRIPTION

Figure 1:
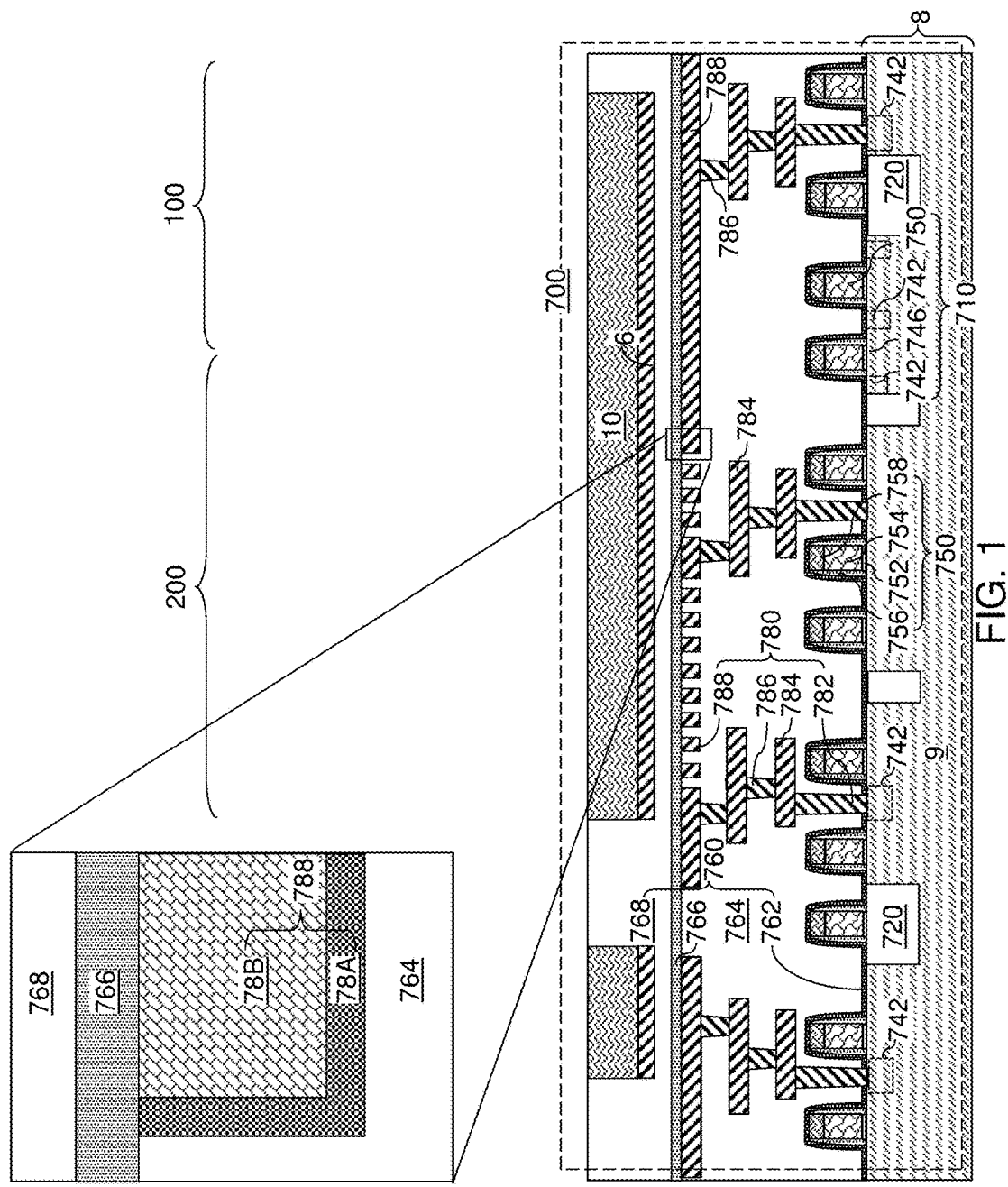
FIG. 1 is a vertical cross-sectional view of a first exemplary structure after formation of semiconductor devices, lower level dielectric layers including a silicon nitride layer, lower metal interconnect structures, and a planar semiconductor material layer on a semiconductor substrate according to a first embodiment of the present disclosure.

As three-dimensional memory devices scale to smaller device dimensions, the device area for peripheral devices (which can be referred to interchangeably as driver devices, driver circuits, logic circuitry, logic devices, peripheral circuits, etc.) can take up a significant portion of the total chip area. The peripheral logic circuitry provides control of the various nodes of the memory devices. Typically, complementary metal oxide semiconductor (CMOS) devices are formed on a same substrate as the three-dimensional memory device. Manufacture of a three-dimensional memory array typically involves many high temperature processing steps, such as activation anneals and high temperature layer deposition steps. Such high temperature processing steps have an adverse impact on logic devices formed on a same substrate as the three-dimensional memory array. However, degradation of CMOS devices due to collateral thermal cycling and hydrogen diffusion during manufacture of the three-dimensional memory device places a severe constraint on performance of the support circuitry including the CMOS devices. However, high performance peripheral devices are necessary to provide high performance for a three-dimensional memory device. Further, performance of the three-dimensional memory device can be significantly degraded due to voltage drops in a power distribution network such as a source voltage distribution network. The embodiments of the present disclosure provide a peripheral circuit die containing logic devices, such as CMOS devices, which is bonded to the memory-containing die containing a three-dimensional memory device. This configuration avoids or reduces the negative effect of the high temperature processing steps on the logic devices.

The embodiments of the present disclosure can be used to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are used merely to identify similar elements, and different ordinals may be used across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device Three-dimensional memory devices of various embodiments of the present disclosure include a monolithic three-dimensional NAND string memory device, and can be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Referring to FIG. 1, a first exemplary structure according to an embodiment of the present disclosure is illustrated. The first exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which is herein referred to as lower level dielectric layers 760. The lower level dielectric layers 760 constitute a dielectric layer stack in which each lower level dielectric layer 760 overlies or underlies other lower level dielectric layers 760. The lower level dielectric layers 760 can include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride layer (e.g., hydrogen diffusion barrier) 766 that overlies the dielectric material layer 764, and at least one second dielectric layer 768.

The dielectric layer stack including the lower level dielectric layers 760 functions as a matrix for lower metal interconnect structures 780 that provide electrical wiring between the various nodes of the semiconductor devices and landing pads for through-stack contact via structures to be subsequently formed. The lower metal interconnect structures 780 are included within the dielectric layer stack of the lower level dielectric layers 760, and comprise a lower metal line structure located under and optionally contacting a bottom surface of the silicon nitride layer 766.

For example, the lower metal interconnect structures 780 can be included within the at least one first dielectric material layer 764. The at least one first dielectric material layer 764 may be a plurality of dielectric material layers in which various elements of the lower metal interconnect structures 780 are sequentially included. Each dielectric material layer of the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 can comprise, or consist essentially of, dielectric material layers having dielectric constants that do not exceed the dielectric constant of undoped silicate glass (silicon oxide) of 3.9.

The lower metal interconnect structures 780 can include various device contact via structures 782 (e.g., source and drain electrodes which contact the respective source and drain nodes of the device or gate electrode contacts), intermediate lower metal line structures 784, lower metal via structures 786, and topmost lower metal line structures 788 that are configured to function as landing pads for through-stack contact via structures to be subsequently formed. In this case, the at least one first dielectric material layer 764 may be a plurality of dielectric material layers that are formed level by level while incorporating components of the lower metal interconnect structures 780 within each respective level. For example, single damascene processes may be used to form the lower metal interconnect structures 780, and each level of the lower metal via structures 786 may be included within a respective via level dielectric material layer and each level of the lower level metal line structures (784, 788) may be included within a respective line level dielectric material layer. Alternatively, a dual damascene process may be used to form integrated line and via structures, each of which includes a lower metal line structure and at least one lower metal via structure.

The topmost lower metal line structures 788 can be formed within a topmost dielectric material layer of the at least one first dielectric material layer 764 (which can be a plurality of dielectric material layers). Each of the lower metal interconnect structures 780 can include a metallic nitride liner 78A and a metal fill portion 78B. Each metallic nitride liner 78A can include a conductive metallic nitride material such as TiN, TaN, and/or WN. Each metal fill portion 78B can include an elemental metal (such as Cu, W, Al, Co, Ru) or an intermetallic alloy of at least two metals. Top surfaces of the topmost lower metal line structures 788 and the topmost surface of the at least one first dielectric material layer 764 may be planarized by a planarization process, such as chemical mechanical planarization. In this case, the top surfaces of the topmost lower metal line structures 788 and the topmost surface of the at least one first dielectric material layer 764 may be within a horizontal plane that is parallel to the top surface of the substrate 8.

The silicon nitride layer 766 can be formed directly on the top surfaces of the topmost lower metal line structures 788 and the topmost surface of the at least one first dielectric material layer 764. Alternatively, a portion of the first dielectric material layer 764 can be located on the top surfaces of the topmost lower metal line structures 788 below the silicon nitride layer 766. In one embodiment, the silicon nitride layer 766 is a substantially stoichiometric silicon nitride layer which has a composition of $Si_3N_4$. A silicon nitride material formed by thermal decomposition of a silicon nitride precursor is preferred for the purpose of blocking hydrogen diffusion. In one embodiment, the silicon nitride layer 766 can be deposited by a low pressure chemical vapor deposition (LPCVD) using dichlorosilane ($SiH_2Cl_2$) and ammonia ($NH_3$) as precursor gases. The temperature of the LPCVD process may be in a range from 750 degrees Celsius to 825 degrees Celsius, although lesser and greater deposition temperatures can also be used. The sum of the partial pressures of dichlorosilane and ammonia may be in a range from 50 mTorr to 500 mTorr, although lesser and greater pressures can also be used. The thickness of the silicon nitride layer 766 is selected such that the silicon nitride layer 766 functions as a sufficiently robust hydrogen diffusion barrier for subsequent thermal processes. For example, the thickness of the silicon nitride layer 766 can be in a range from 6 nm to 100 nm, although lesser and greater thicknesses may also be used.

The at least one second dielectric material layer 768 may include a single dielectric material layer or a plurality of dielectric material layers. Each dielectric material layer of the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional planar conductive material layer 6 and a planar semiconductor material layer 10. The optional planar conductive material layer 6, if present, provides a high conductivity conduction path for electrical current that flows into, or out of, the planar semiconductor material layer 10. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be used. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can include horizontal semiconductor channels and/or source regions for a three-dimensional array of memory devices to be subsequently formed. The optional planar conductive material layer 6 can include a metallic compound material such as a conductive metallic nitride (e.g., TiN) and/or a metal (e.g., W). The thickness of the optional planar conductive material layer 6 may be in a range from 5 nm to 100 nm, although lesser and greater thicknesses can also be used. The planar semiconductor material layer 10 includes a polycrystalline semiconductor material such as polysilicon or a polycrystalline silicon-germanium alloy. The thickness of the planar semiconductor material layer 10 may be in a range from 30 nm to 300 nm, although lesser and greater thicknesses can also be used.

The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

The optional planar conductive material layer 6 and the planar semiconductor material layer 10 may be patterned to provide openings in areas in which through-stack contact via structures and through-dielectric contact via structures are to be subsequently formed. In one embodiment, the openings in the optional planar conductive material layer 6 and the planar semiconductor material layer 10 can be formed within the area of a memory array region 100, in which a three-dimensional memory array including memory stack structures is to be subsequently formed. Further, additional openings in the optional planar conductive material layer 6 and the planar semiconductor material layer 10 can be formed within the area of a contact region 200 in which contact via structures contacting word line electrically conductive layers are to be subsequently formed.

The region of the semiconductor devices 710 and the combination of the lower level dielectric layers 760 and the lower metal interconnect structures 780 is herein referred to an underlying peripheral device region 700, which is located underneath a memory-level assembly to be subsequently formed and includes peripheral devices for the memory-level assembly. The lower metal interconnect structures 780 are included in the lower level dielectric layers 760.

The lower metal interconnect structures 780 can be electrically connected to active nodes (e.g., transistor active regions 742 or gate electrodes 754) of the semiconductor devices 710 (e.g., CMOS devices), and are located at the level of the lower level dielectric layers 760. Only a subset of the active nodes is illustrated in FIG. 1 for clarity. Through-stack contact via structures (not shown in FIG. 1) can be subsequently formed directly on the lower metal interconnect structures 780 to provide electrical connection to memory devices to be subsequently formed. In one embodiment, the pattern of the lower metal interconnect structures 780 can be selected such that the topmost lower metal line structures 788 (which are a subset of the lower metal interconnect structures 780 located at the topmost portion of the lower metal interconnect structures 780) can provide landing pad structures for the through-stack contact via structures to be subsequently formed.

Figure 2:
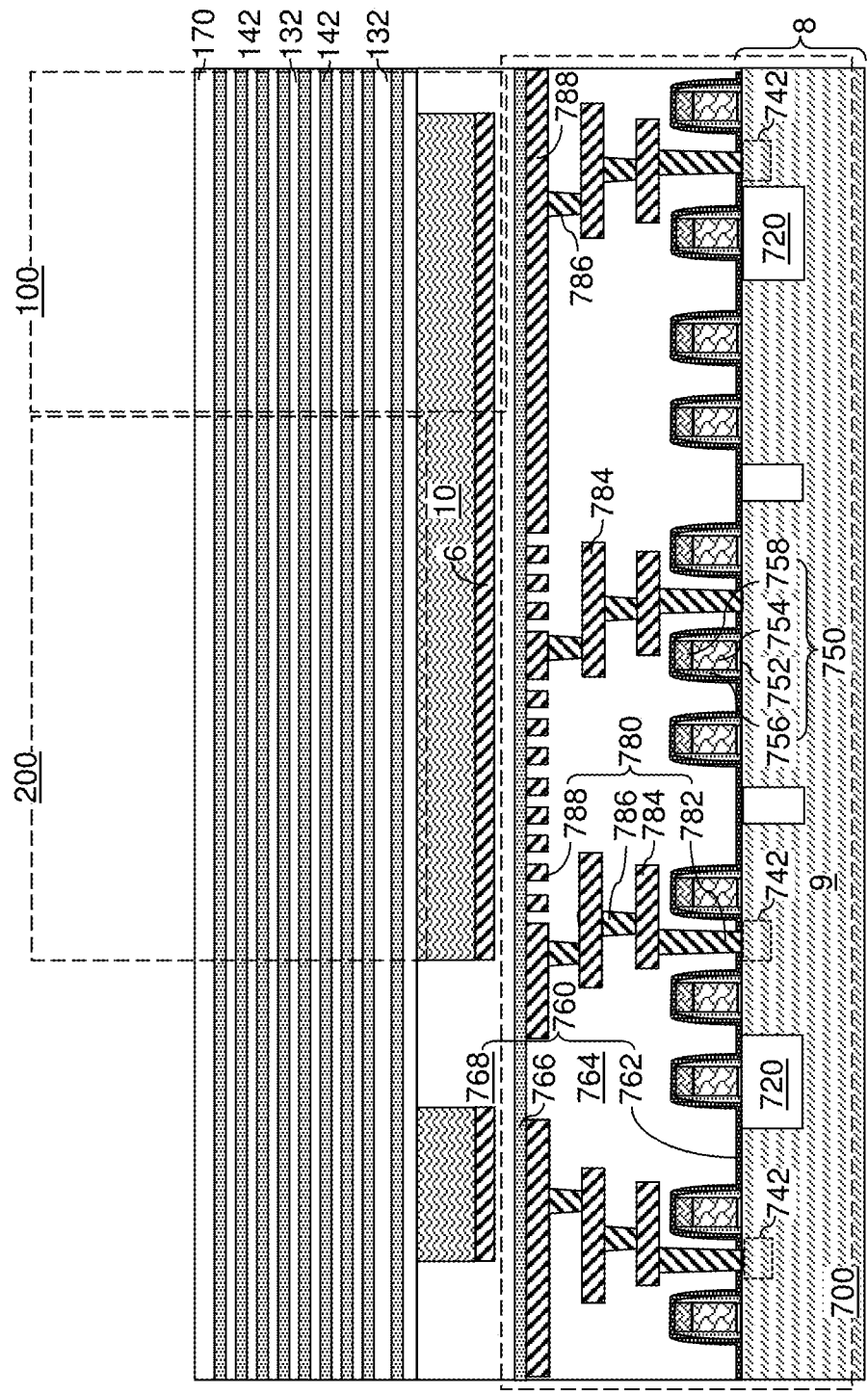
FIG. 2 is a vertical cross-sectional view of the first exemplary structure after formation of a first-tier alternating stack of first insulating layers and first spacer material layers according to an embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described using embodiments in which sacrificial material layers are replaced with electrically conductive layers, in other embodiments the spacer material layers are formed as electrically conductive layers (thereby obviating the need to perform replacement processes).

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step. As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is used for the first insulating layers 132, tetraethylorthosilicate (TEOS) can be used as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be used for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be used. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be used for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be used.

Figure 3:
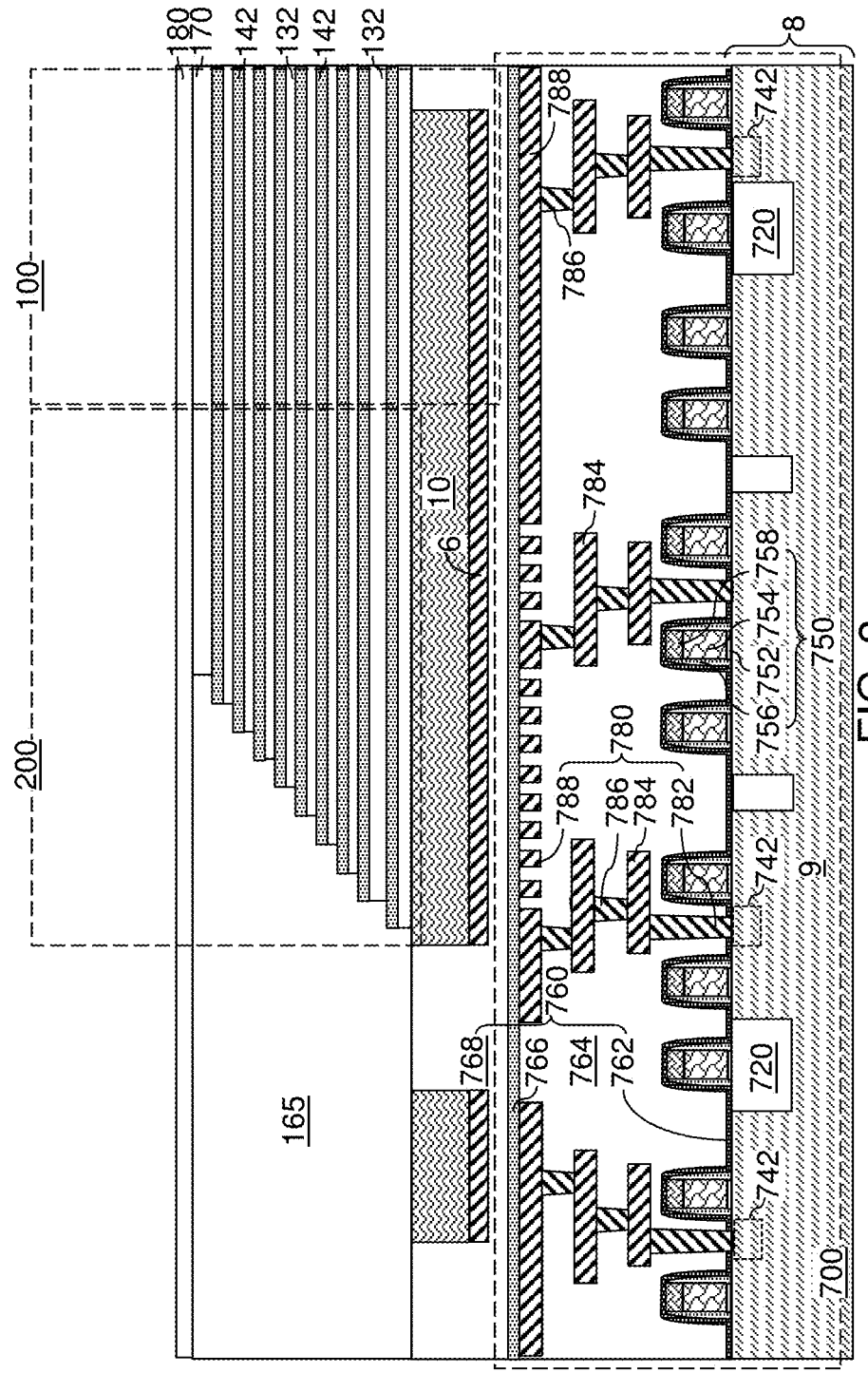
FIG. 3 is a vertical cross-sectional view of the first exemplary structure after patterning first-tier staircase regions on the first-tier alternating stack and forming a first-tier retro-stepped dielectric material portion according to an embodiment of the present disclosure.

Referring to FIG. 3, the first insulating cap layer 170 and the first-tier alternating stack (132, 142) can be patterned to form first stepped surfaces in the word line contact via region 200. The word line contact via region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area.

A dielectric material can be deposited to fill the first stepped cavity to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion 165 collectively constitute a first-tier structure, which is an in-process structure that is subsequently modified.

Figure 4A:
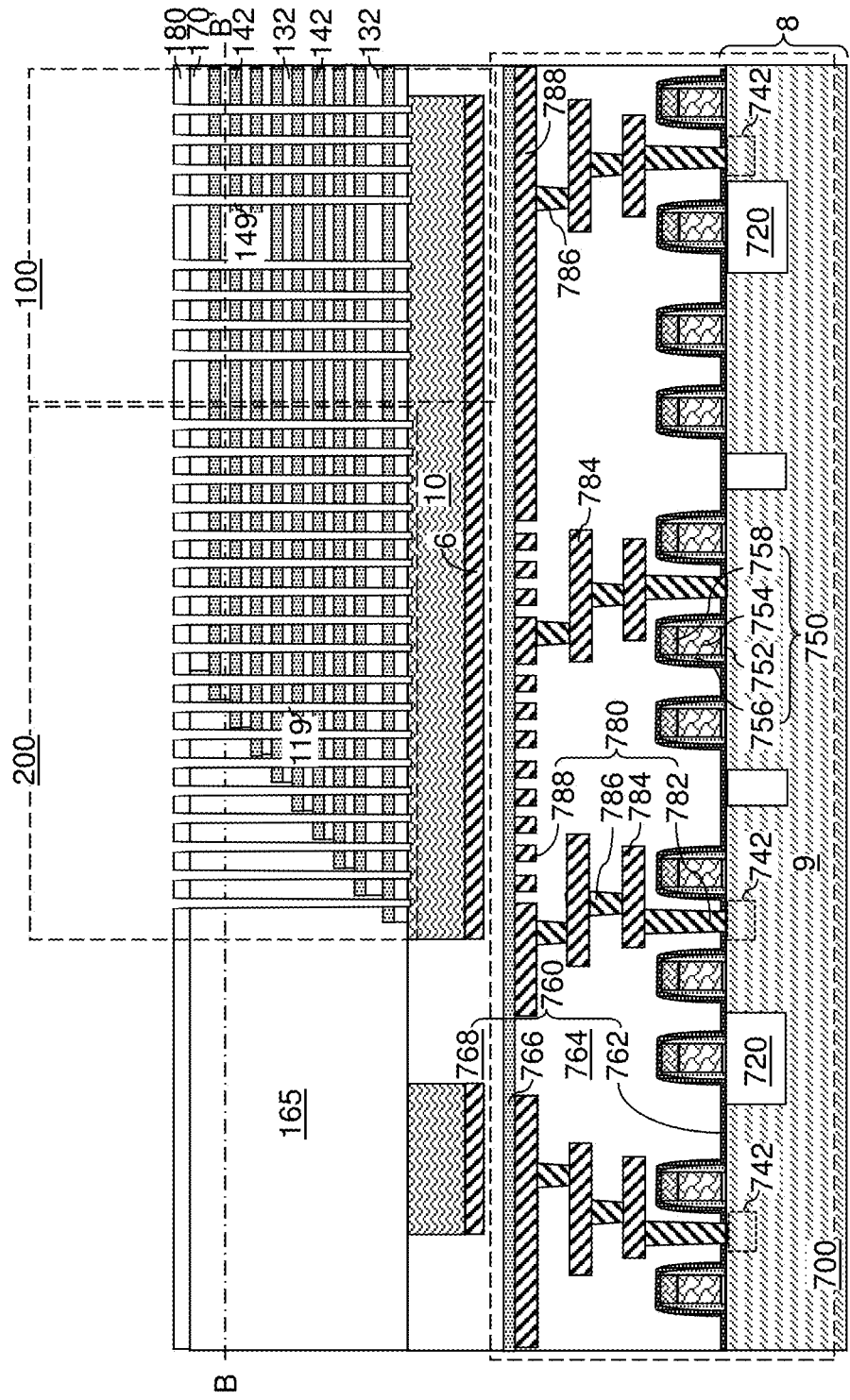
FIG. 4A is a vertical cross-sectional view of the first exemplary structure after formation of first-tier memory openings and first tier support openings according to an embodiment of the present disclosure.

Referring to FIGS. 4A and 4B, an inter-tier dielectric layer 180 may be optionally deposited over the first-tier structure (132, 142, 165, 170). The inter-tier dielectric layer 180 includes a dielectric material such as silicon oxide. The thickness of the inter-tier dielectric layer 180 can be in a range from 30 nm to 300 nm, although lesser and greater thicknesses can also be used. Locations of steps S in the first-tier alternating stack (132, 142) are illustrated as dotted lines.

First-tier memory openings 149 and first tier support openings 119 can be formed. The first-tier memory openings 149 and the first-tier support openings 119 extend through the first-tier alternating stack (132, 142) at least to a top surface of the planar semiconductor material layer 10. The first-tier memory openings 149 can be formed in the memory array region 100 at locations at which memory stack structures including vertical stacks of memory elements are to be subsequently formed. The first-tier support openings 119 can be formed in the word line contact via region 200. For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first-tier alternating stack (132, 142) by at least one anisotropic etch that uses the patterned lithographic material stack as an etch mask. Portions of the first insulating cap layer 170 (and the optional inter-tier dielectric layer 180), and the first-tier alternating stack (132, 142) underlying the openings in the patterned lithographic material stack are etched to form the first-tier memory openings 149 and the first-tier support openings 119. In other words, the transfer of the pattern in the patterned lithographic material stack through the first insulating cap layer 170 and the first-tier alternating stack (132, 142) forms the first-tier memory openings 149 and the first-tier support openings 119.

In one embodiment, the chemistry of the anisotropic etch process used to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4$/$O_2$/Ar etch). The sidewalls of the first-tier memory openings 149 and the support openings 119 can be substantially vertical, or can be tapered. Subsequently, the patterned lithographic material stack can be subsequently removed, for example, by ashing.

Optionally, the portions of the first-tier memory openings 149 and the first-tier support openings 119 at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch using HF) can be used to expand the lateral dimensions of the first-tier memory openings at the level of the inter-tier dielectric layer 180. The portions of the first-tier memory openings 149 (and the first-tier support openings 119) located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
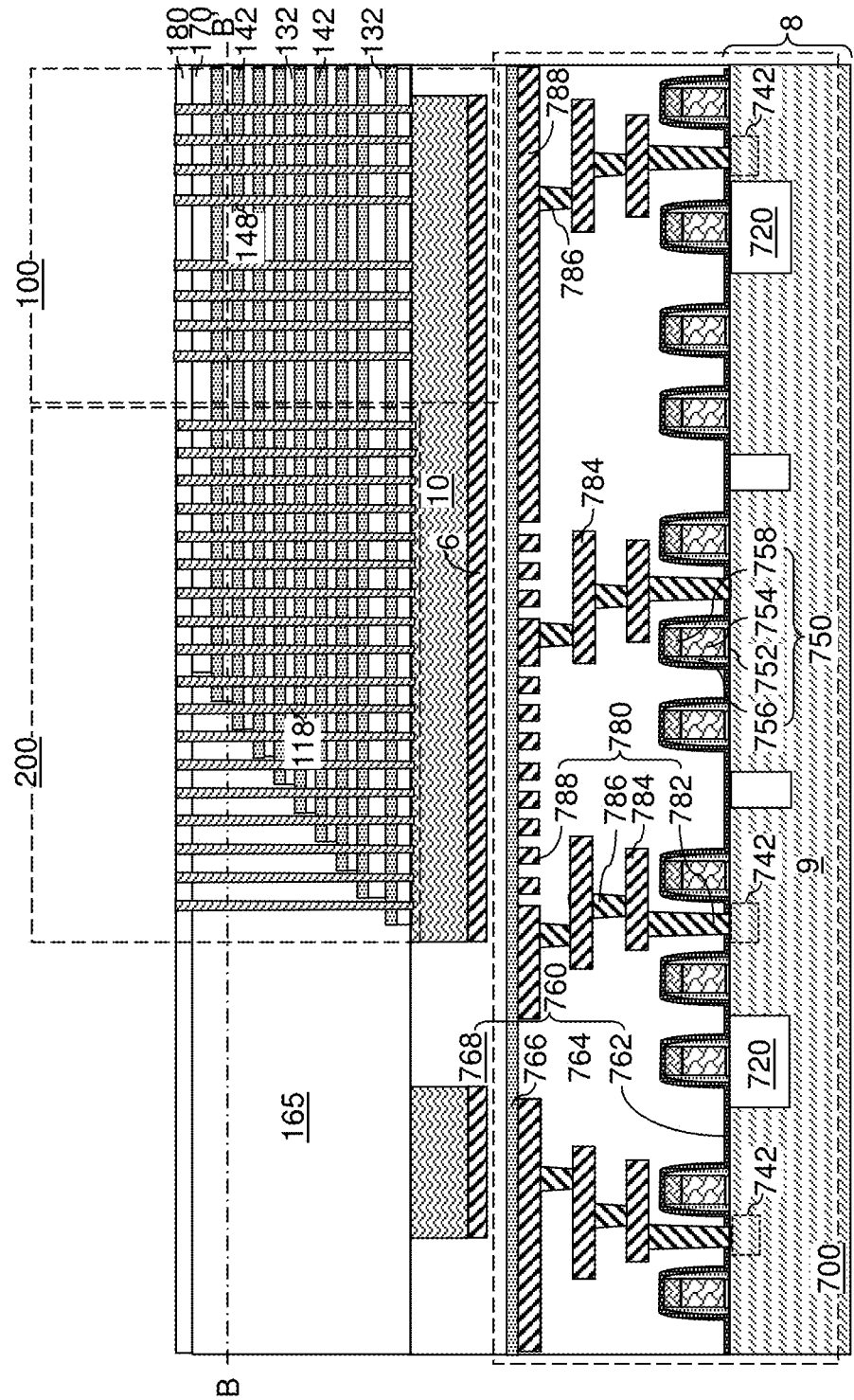
FIG. 5 is a vertical cross-sectional view of the first exemplary structure after formation of sacrificial memory opening fill portions and sacrificial support opening fill portions according to an embodiment of the present disclosure.

Referring to FIG. 5, sacrificial memory opening fill portions 148 can be formed in the first-tier memory openings 149, and sacrificial support opening fill portions 118 can be formed in the first-tier support openings 119. For example, a sacrificial fill material layer is deposited in the first-tier memory openings 149 and the first-tier support openings 119. The sacrificial fill material layer includes a sacrificial material which can be subsequently removed selective to the materials of the first insulator layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be used prior to depositing the sacrificial fill material layer. The sacrificial fill material layer may be formed by a non-conformal deposition or a conformal deposition method. In another embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the first insulating cap layer 170 (and the optional inter-tier dielectric layer 180, if present). For example, the sacrificial fill material layer can be recessed to a top surface of the first insulating cap layer 170 (and the optional inter-tier dielectric layer 180) using a planarization process. The planarization process can include a recess etch, chemical mechanical planarization (CMP), or a combination thereof. The top surface of the first insulating layer 170 (and optionally layer 180 if present) can be used as an etch stop layer or a planarization stop layer. Each remaining portion of the sacrificial material in a first-tier memory opening 149 constitutes a sacrificial memory opening fill portion 148. Each remaining portion of the sacrificial material in a first-tier support opening 119 constitutes a sacrificial support opening fill portion 118. The top surfaces of the sacrificial memory opening fill portions 148 and the sacrificial support opening fill portions 118 can be coplanar with the top surface of the inter-tier dielectric layer 180 (or the first insulating cap layer 170 if the inter-tier dielectric layer 180 is not present). The sacrificial memory opening fill portion 148 and the sacrificial support opening fill portions 118 may, or may not, include cavities therein.

Figure 6:
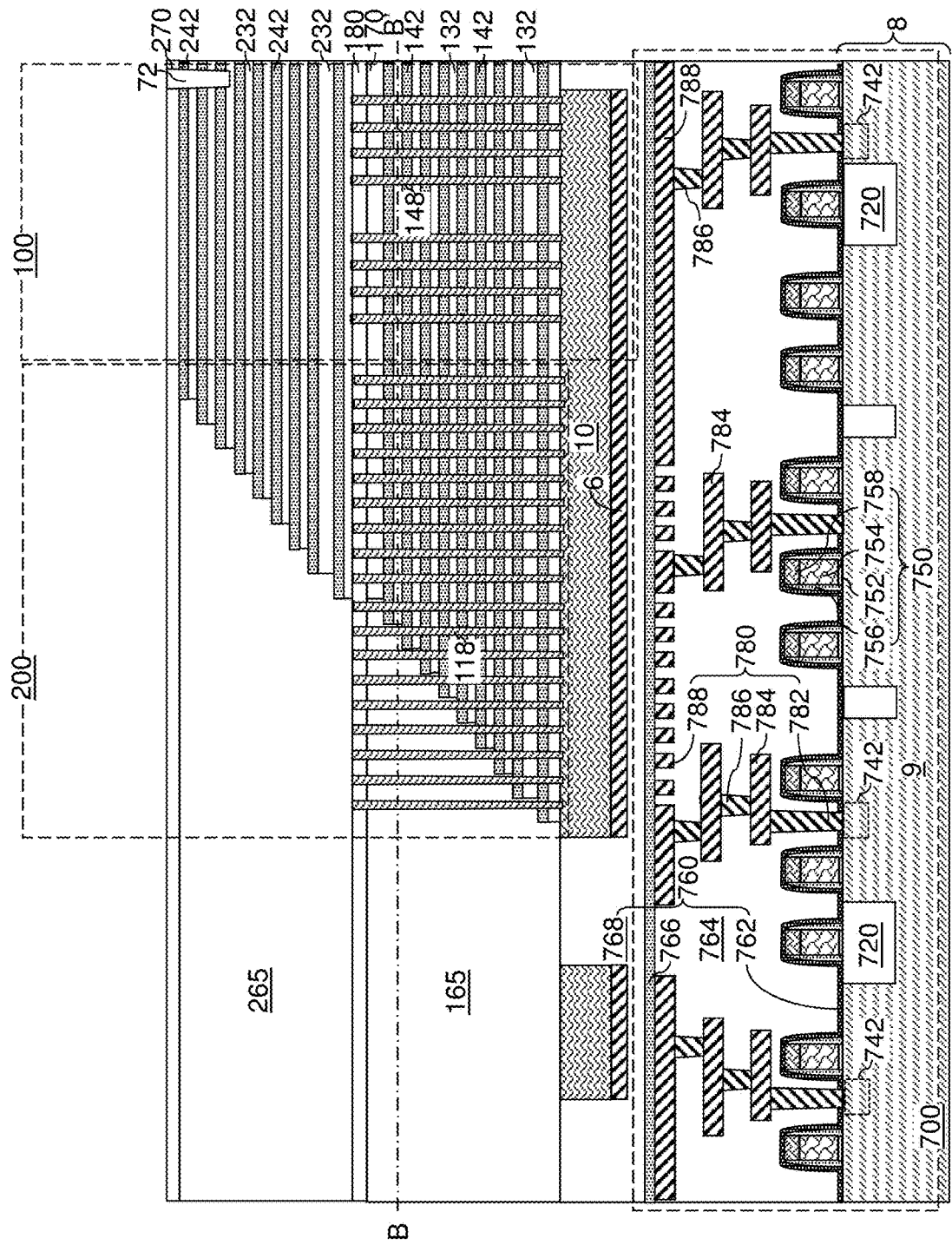
FIG. 6 is a vertical cross-sectional view of the first exemplary structure after formation of a second-tier alternating stack of second insulating layers and second spacer material layers, a second-tier retro-stepped dielectric material portion, and a second insulating cap layer according to an embodiment of the present disclosure.

Referring to FIG. 6, a second-tier structure can be formed over the first-tier structure (132, 142, 170, 148, 118). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be used for the second insulating layers 232 can be any material that can be used for the first insulating layers 132. The fourth material of the second sacrificial material layers 242 is a sacrificial material that can be removed selective to the third material of the second insulating layers 232. Sacrificial materials that can be used for the second sacrificial material layers 242 can be any material that can be used for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be used for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be used. In one embodiment, each second sacrificial material layer 242 in the second stack (232, 242) can have a uniform thickness that is substantially invariant within each respective second sacrificial material layer 242.

Second stepped surfaces in the second stepped area can be formed in the word line contact via region 200 using a same set of processing steps as the processing steps used to form the first stepped surfaces in the first stepped area with suitable adjustment to the pattern of at least one masking layer. A second-tier retro-stepped dielectric material portion 265 can be formed over the second stepped surfaces in the word line contact via region 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Optionally, drain-select-level shallow trench isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 include a dielectric material such as silicon oxide.

Figure 7A:
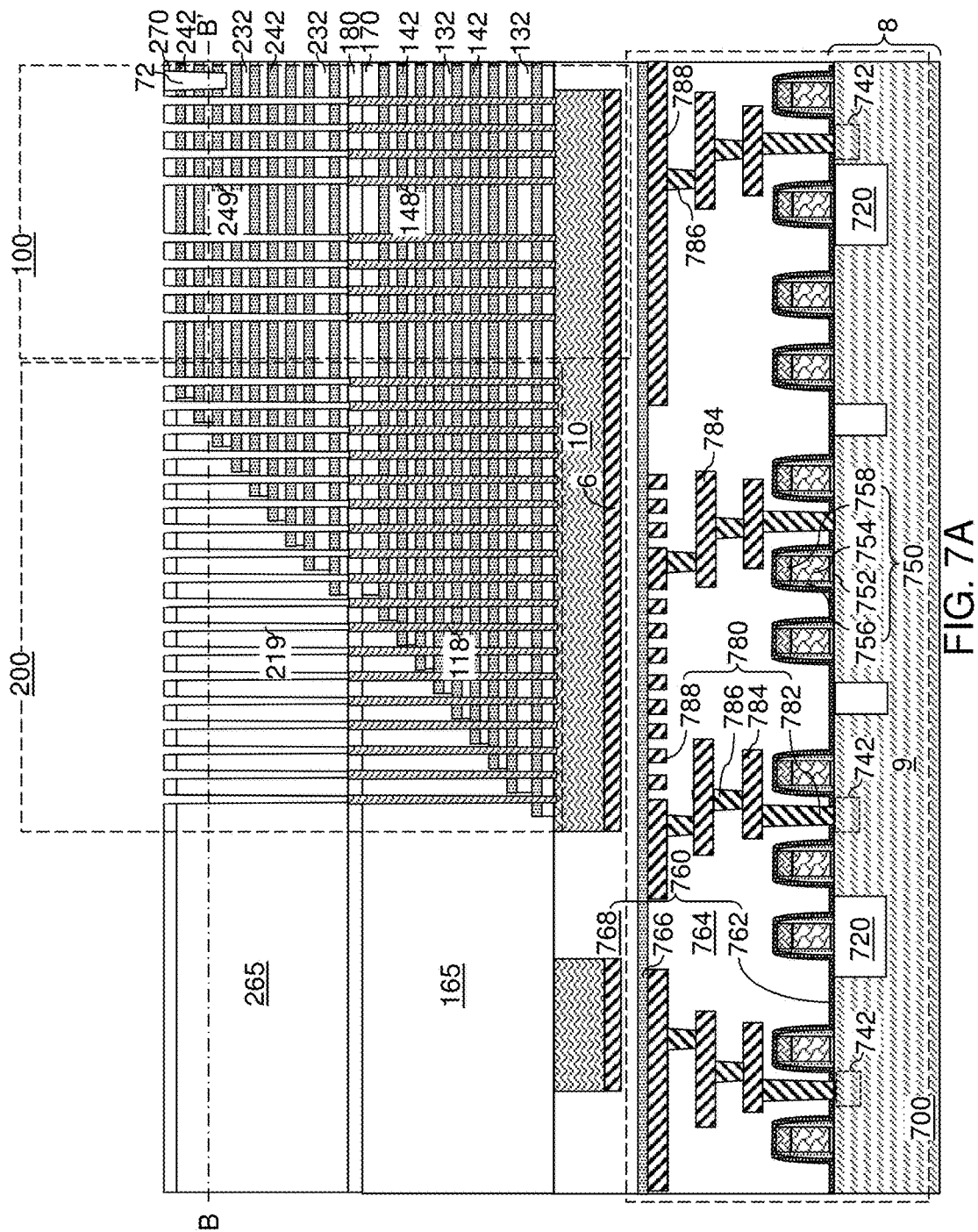
FIG. 7A is a vertical cross-sectional view of the first exemplary structure after formation of inter-tier memory openings and inter-tier support openings according to an embodiment of the present disclosure.
Figure 7B:
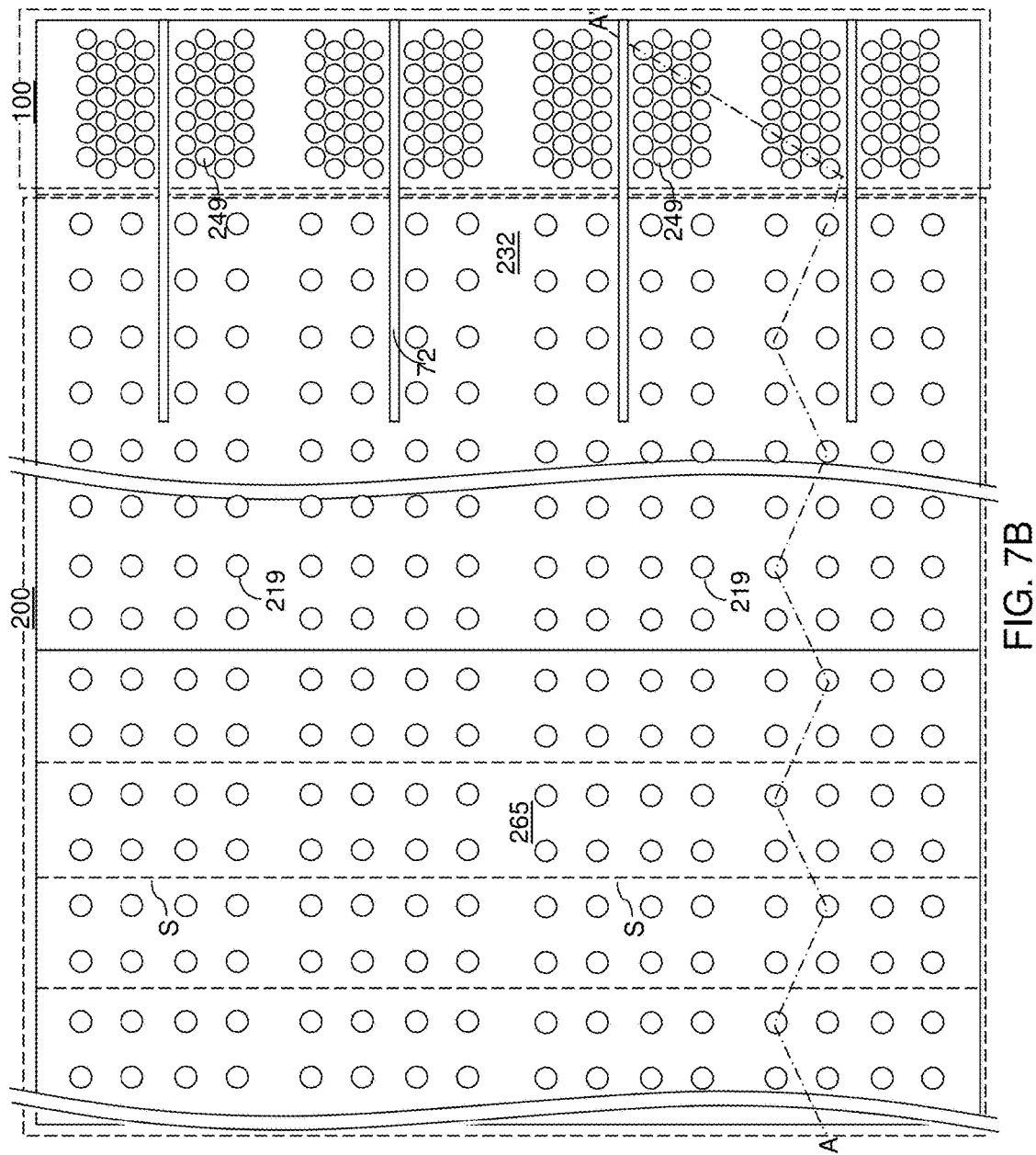
FIG. 7B is a horizontal cross-sectional view of the first exemplary structure along the horizontal plane B-B' in FIG. 7A. The zig-zag vertical plane A-A' corresponds to the plane of the vertical cross-sectional view of FIG. 7A.

Referring to FIGS. 7A and 7B, second-tier memory openings 249 and second tier support openings 219 extending through the second-tier structure (232, 242, 270, 265) are formed in areas overlying the sacrificial memory opening fill portions 148. A photoresist layer can be applied over the second-tier structure (232, 242, 270, 265), and can be lithographically patterned to form a same pattern as the pattern of the sacrificial memory opening fill portions 148 and the sacrificial support opening fill portions 118, i.e., the pattern of the first-tier memory openings 149 and the first-tier support openings 119. Thus, the lithographic mask used to pattern the first-tier memory openings 149 and the first-tier support openings 119 can be used to pattern the second-tier memory openings 249 and the second-tier support openings 219. An anisotropic etch can be performed to transfer the pattern of the lithographically patterned photoresist layer through the second-tier structure (232, 242, 270, 265). In one embodiment, the chemistry of the anisotropic etch process used to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying sacrificial support opening fill portion 118 can be physically exposed at the bottom of each second-tier support opening 219. After the top surfaces of the sacrificial memory opening fill portions 148 and the sacrificial support opening fill portions 118 are physically exposed, an etch process can be performed, which removes the sacrificial material of the sacrificial memory opening fill portions 148 and the sacrificial support opening fill portions 118 selective to the materials of the second-tier alternating stack (232, 242) and the first-tier alternating stack (132, 142) (e.g., $C_4F_8/O_2/Ar$ etch).

Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). Likewise, upon removal of the sacrificial support opening fill portions 118, each vertically adjoining pair of a second-tier support opening 219 and a first-tier support opening 119 forms a continuous cavity that extends through the first-tier alternating stack (132, 142) and the second-tier alternating stack (232, 242). The continuous cavities are herein referred to as memory openings (or inter-tier memory openings) and support openings (or inter-tier support openings), respectively. A top surface of the planar semiconductor material layer 10 can be physically exposed at the bottom of each memory opening and at the bottom of each support openings. Locations of steps S in the first-tier alternating stack (132, 142) and the second-tier alternating stack (232, 242) are illustrated as dotted lines.

Figure 8:
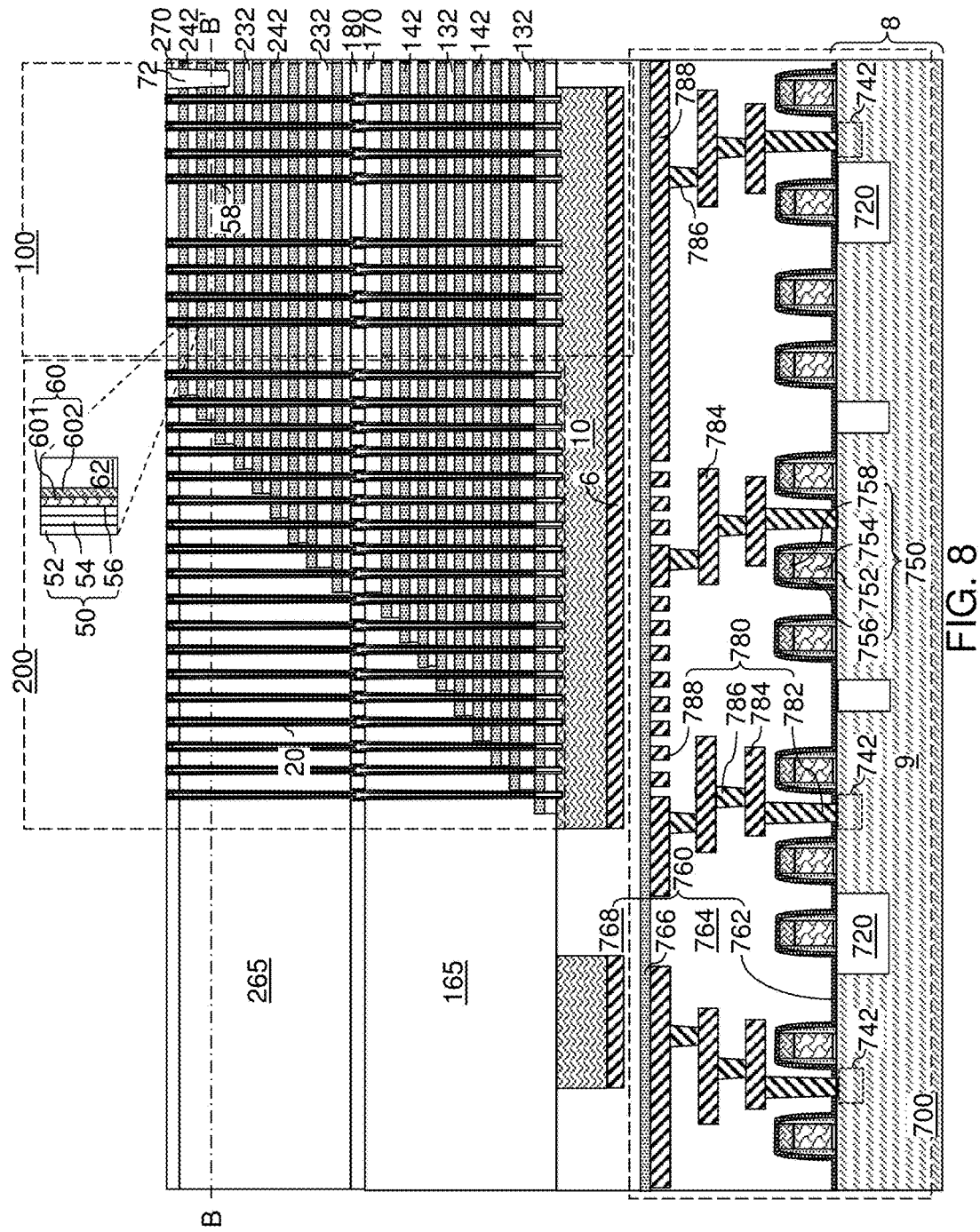
FIG. 8 is a vertical cross-sectional view of the first exemplary structure after formation of memory stack structures according to an embodiment of the present disclosure.

Referring to FIG. 8, memory opening fill structures 58 are formed within each memory opening, and support pillar structures 20 are formed within each support opening. The memory opening fill structures 58 and the support pillar structures 20 can include a same set of components, and can be formed simultaneously.

FIGS. 9A-9H provide sequential cross-sectional views of a memory opening 49 or a support opening (119, 219) during formation of a memory opening fill structure 58 or a support pillar structure 20. While a structural change in a memory opening 49 is illustrated in FIGS. 9A-9H, it is understood that the same structural change occurs in each memory openings 49 and in each of the support openings (119, 219) during the same set of processing steps.

Figure 9B:
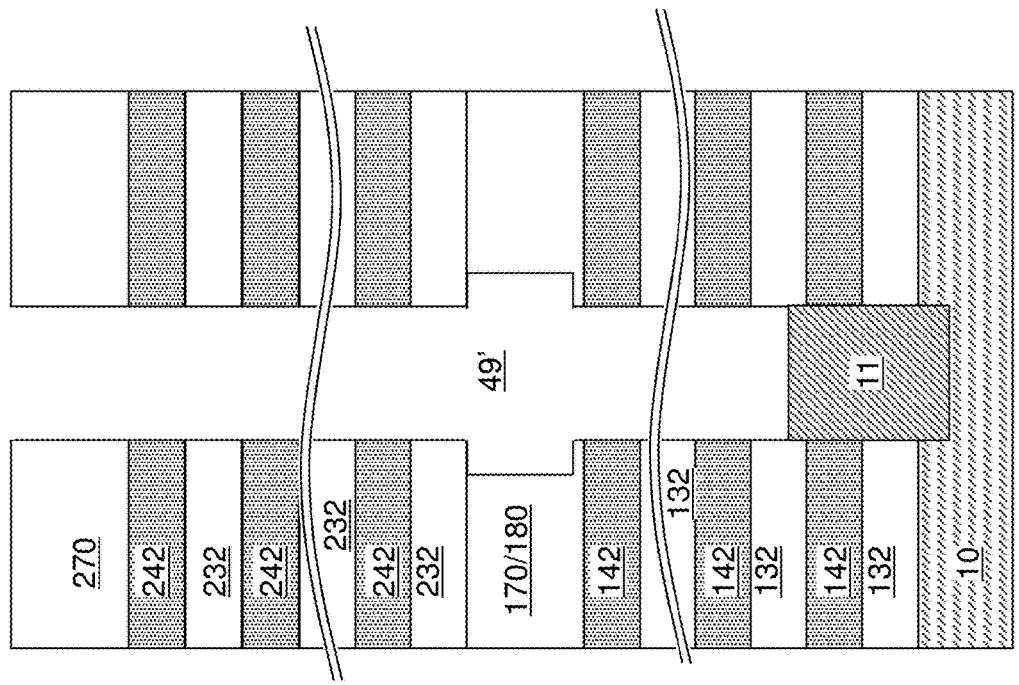
Figure 9A:
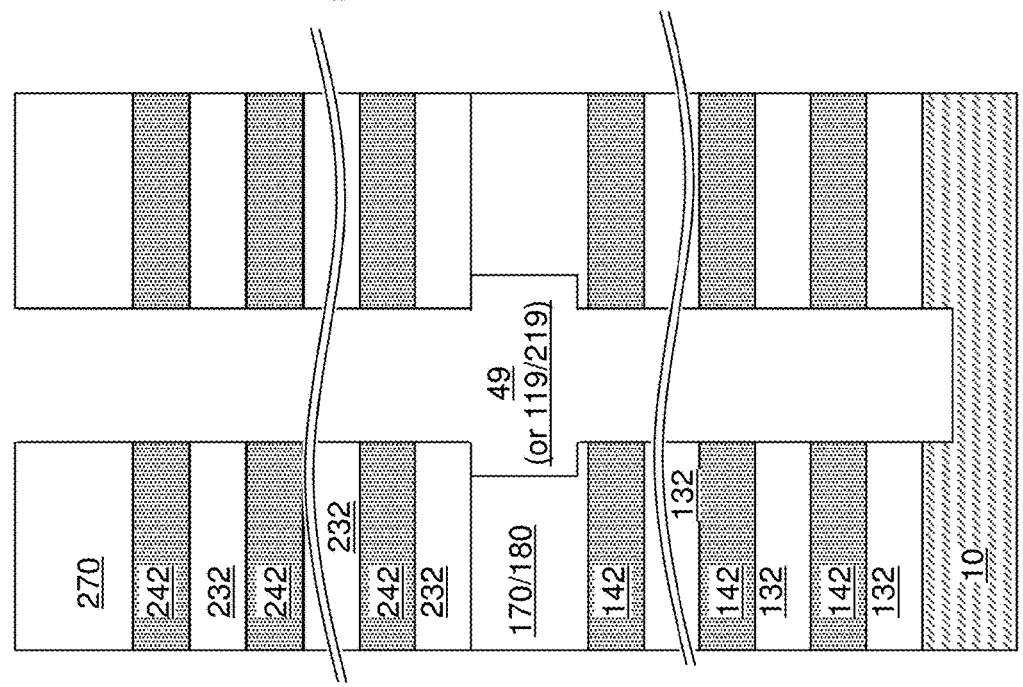

Referring to FIG. 9A, a memory opening 49 in the exemplary device structure of FIG. 14 is illustrated. The memory opening 49 extends through the first-tier structure and the second-tier structure. Likewise, each support opening (119, 219) extends through the first-tier structure and the second-tier structure.

Referring to FIG. 9B, an optional pedestal channel portion (e.g., an epitaxial pedestal) 11 can be formed at the bottom portion of each memory opening 49 and each support openings (119, 219), for example, by a selective semiconductor deposition process. In one embodiment, the pedestal channel portion 11 can be doped with electrical dopants of the same conductivity type as the planar semiconductor material layer 10. In one embodiment, at least one source select gate electrode can be subsequently formed by replacing each sacrificial material layer (142, 242) located below the horizontal plane including the top surfaces of the pedestal channel portions 11 with a respective conductive material layer. A cavity 49' is present in the unfilled portion of the memory opening 49 (or of the support opening) above the pedestal channel portion 11. In one embodiment, the pedestal channel portion 11 can comprise single crystalline silicon. In one embodiment, the pedestal channel portion 11 can have a doping of the same as the conductivity type of the planar semiconductor material layer 10.

Referring to FIG. 9C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be used to form the charge storage layer 54 as a plurality of memory material portions that are vertically spaced apart. While the present disclosure is described using an embodiment in which the charge storage layer 54 is a single continuous layer, in other embodiments the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A cavity 49' is formed in the volume of each memory opening 49 that is not filled with the deposited material layers (52, 54, 56, 601).

Referring to FIG. 9D, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the planar semiconductor material layer 10 in case the pedestal channel portions 11 are not used) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 9F:
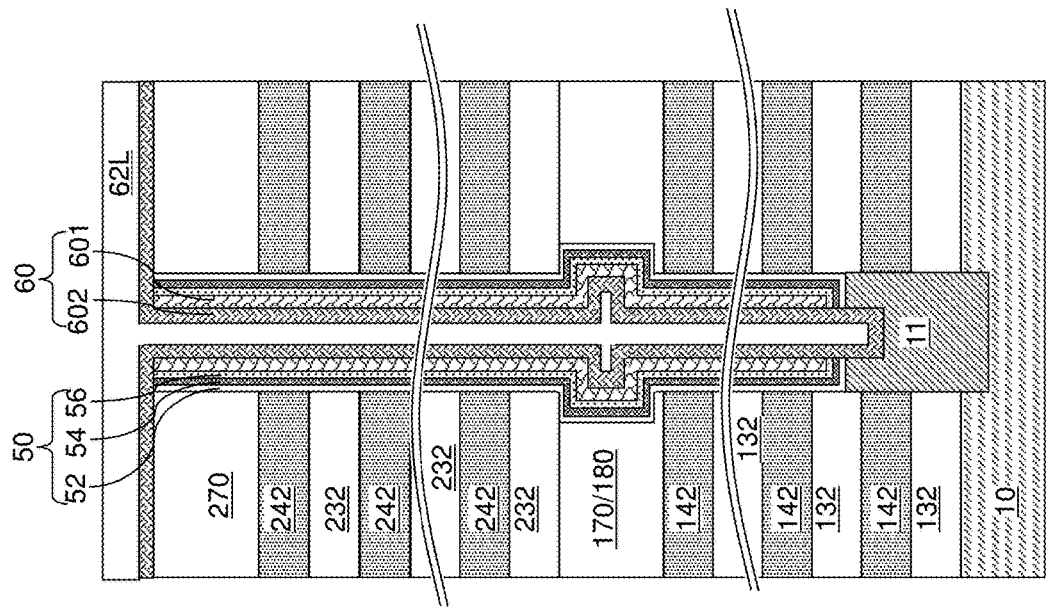
Figure 9E:
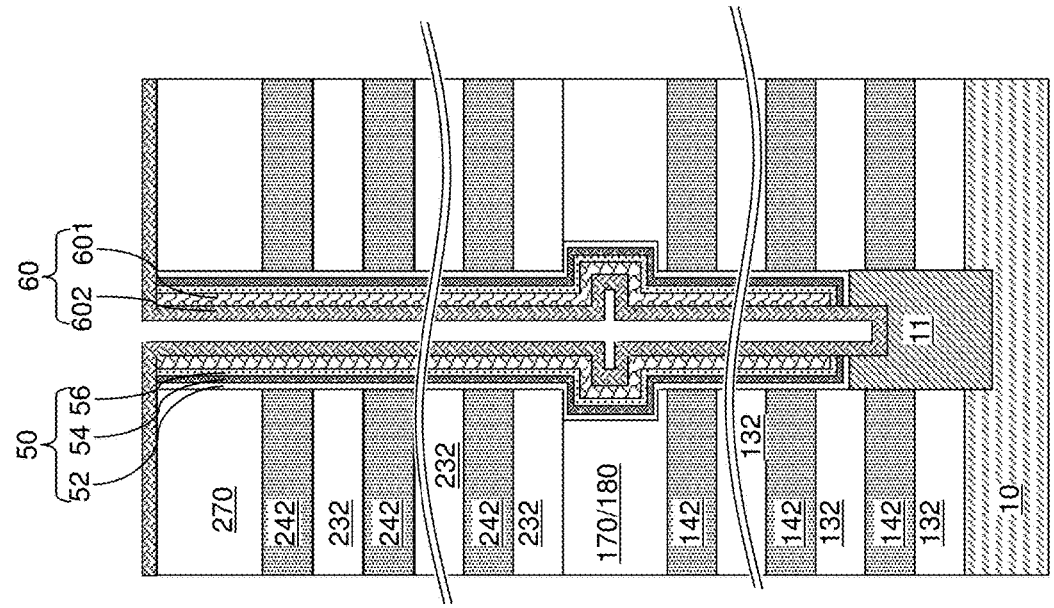

Referring to FIG. 9E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art.

In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 9F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 9G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can use a recess etch or chemical mechanical planarization (CMP). Each remaining portion of the second semiconductor channel layer 602 can be located entirety within a memory opening 49 or entirely within a support opening (119, 219).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 9H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening (119, 219) fills the respective support openings (119, 219), and constitutes a support pillar structure 20.

The first-tier structure (132, 142, 170, 165), the second-tier structure (232, 242, 270, 265), the inter-tier dielectric layer 180, the memory opening fill structures 58, and the support pillar structures 20 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Figure 10A:
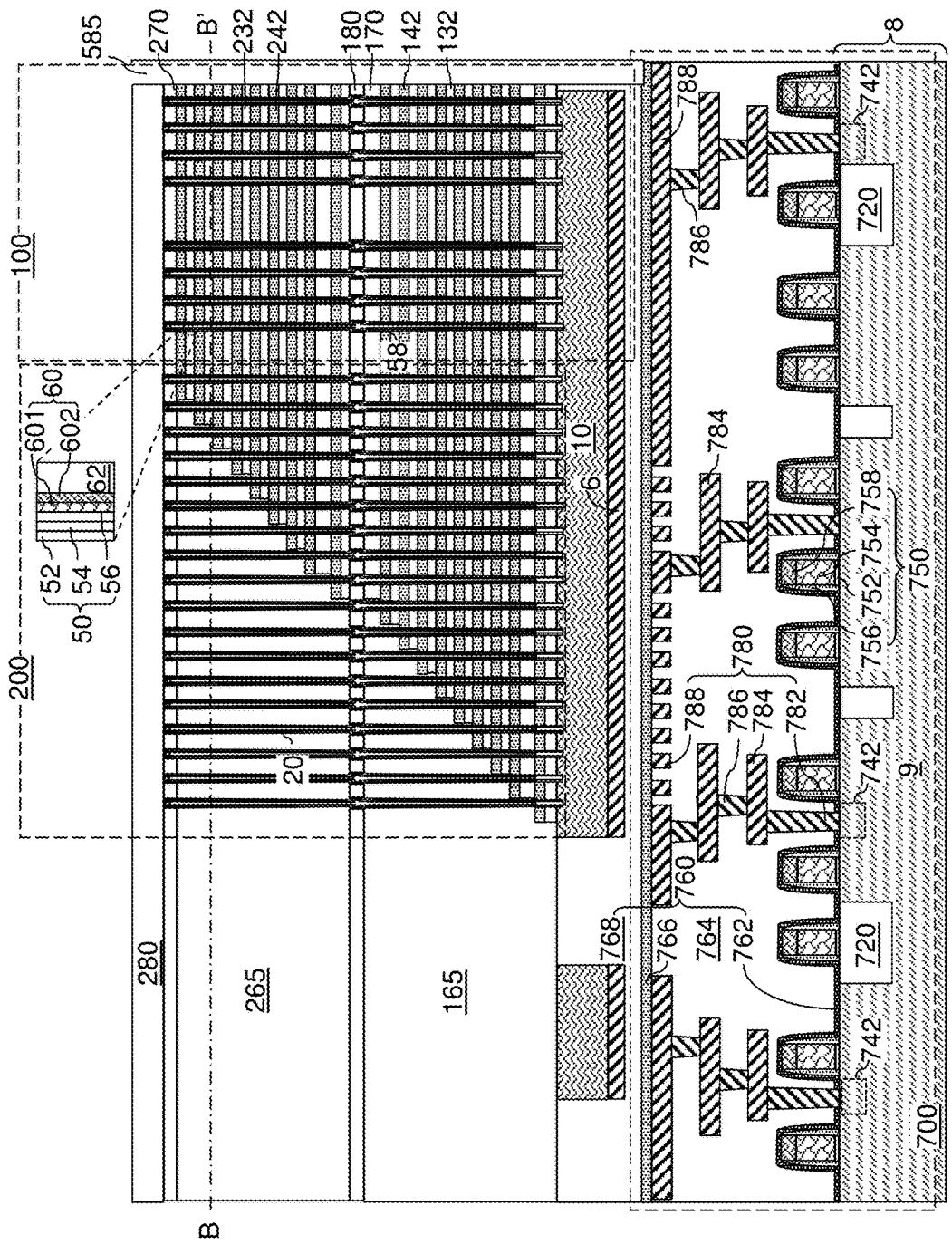
FIG. 10A is a vertical cross-sectional view of the first exemplary structure after formation of first through-stack via cavities according to an embodiment of the present disclosure.
Figure 10B:
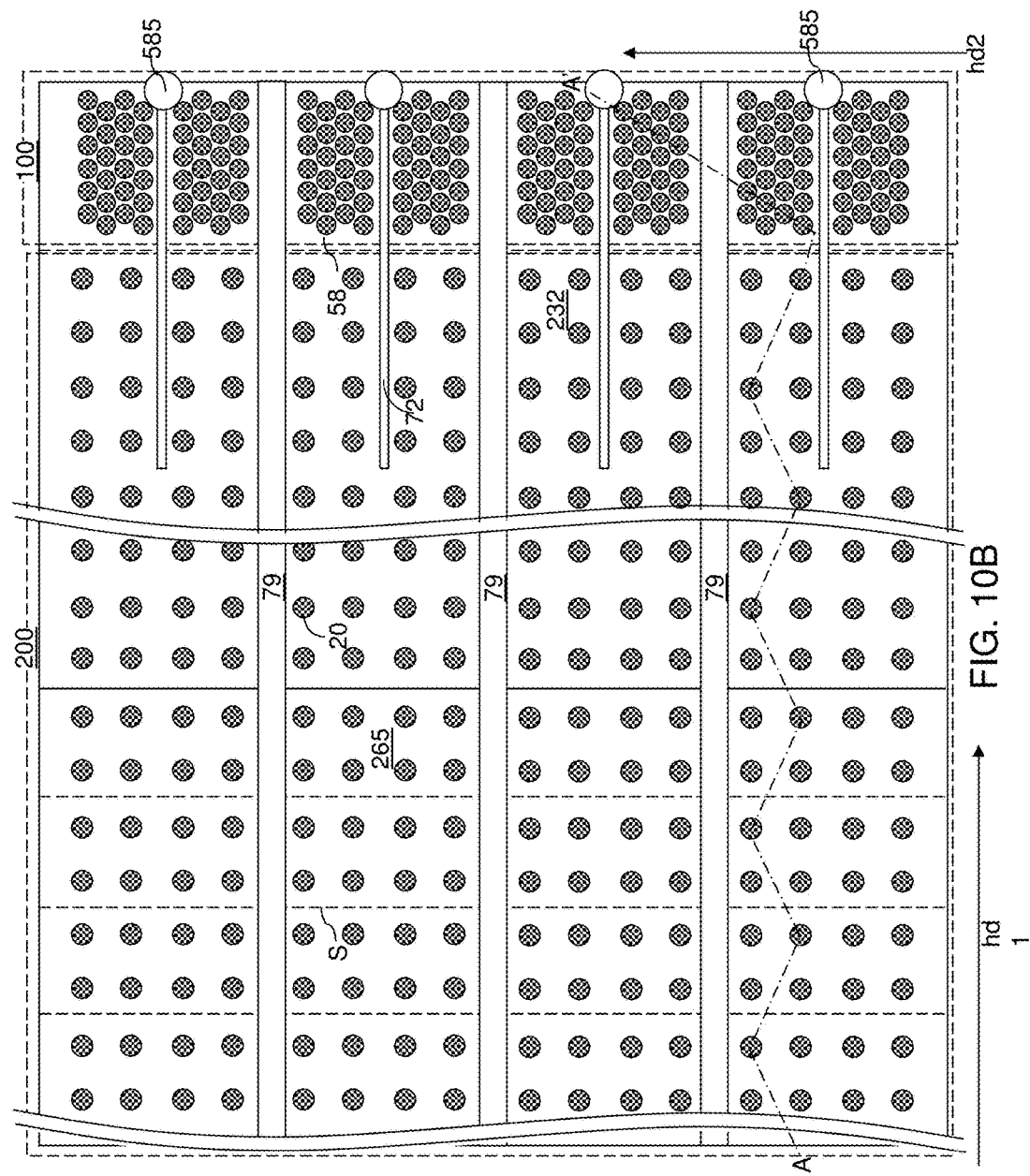
FIG. 10B is a horizontal cross-sectional view of the first exemplary structure along the horizontal plane B-B' in FIG. 10A. The zig-zag vertical plane A-A' corresponds to the plane of the vertical cross-sectional view of FIG. 10A.

Referring to FIGS. 10A and 10B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

First through-stack via cavities 585 can be formed with the memory array region 100, for example, by applying and patterning of a photoresist layer to form openings therein, and by anisotropically etching the portions of the first contact level dielectric layer 280, the alternating stacks (132, 146, 232, 246), and the at least one second dielectric material layer 768 that underlie the openings in the photoresist layer. In one embodiment, each of the first through-stack via cavities 585 can be formed within a respective three-dimensional memory array so that each first through-stack via cavities 585 is laterally surrounded by memory opening fill structures 58. In one embodiment, one or more of the first through-stack via cavities 585 can be formed through the drain-select-level shallow trench isolation structures 72, as shown in FIG. 10B. However, other locations may also be selected. In one embodiment, the first-through-stack via cavities 585 can be formed within areas of openings in the planar semiconductor material layer 10 and the optional planar conductive material layer 6. The bottom surface of each first through-stack via cavity 585 can be formed at, or above, the silicon nitride layer 766. In one embodiment, the silicon nitride layer 766 can be used as an etch stop layer during the anisotropic etch process that forms the first through-stack via cavities. In this case, the bottom surface of each first through-stack via cavity 585 can be formed at the silicon nitride layer 766, and the silicon nitride layer 766 can be physically exposed at the bottom of each first through-stack via cavity 585.

Figure 11:
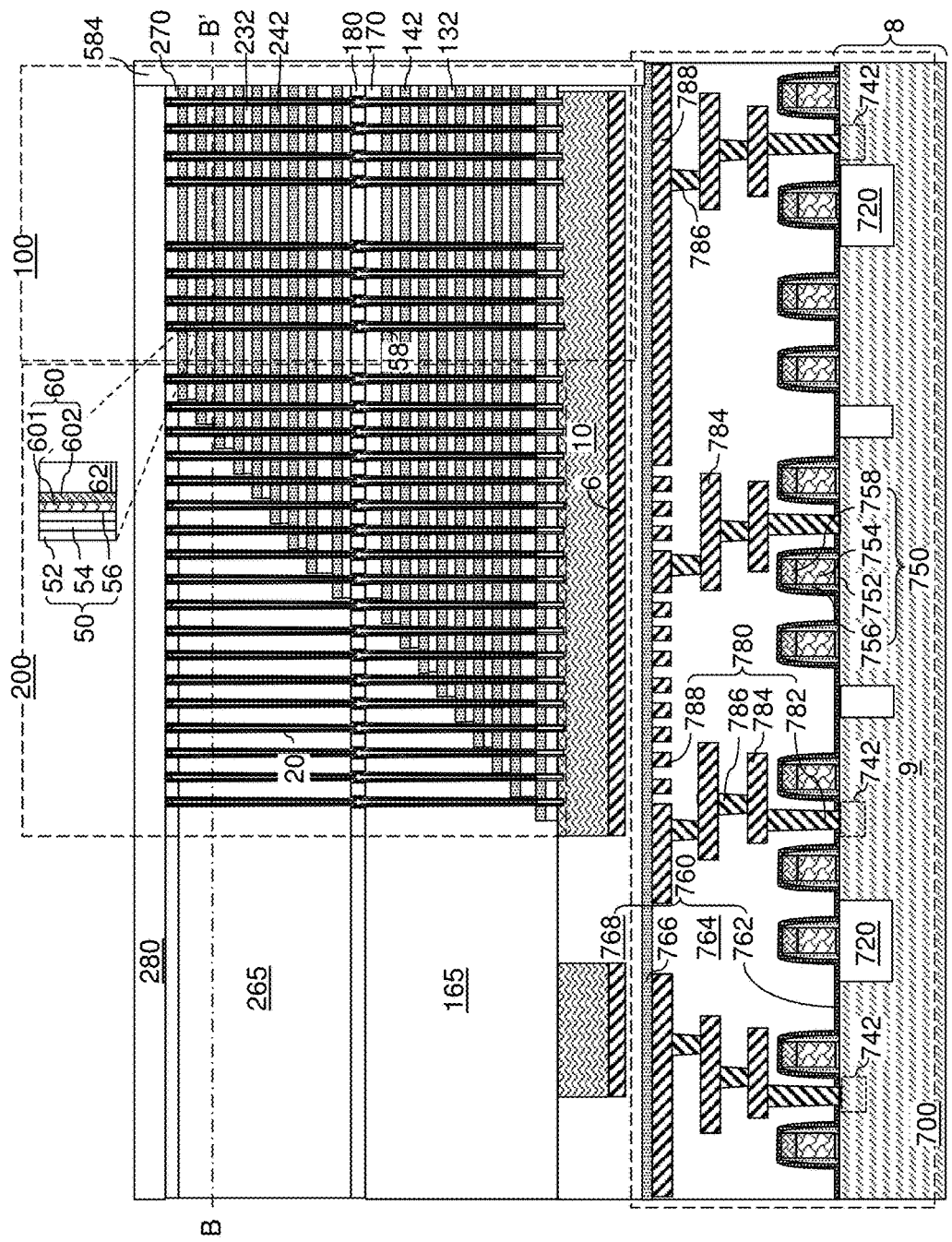
FIG. 11 is a vertical cross-sectional view of the first exemplary structure after formation of through-stack insulating material portion according to an embodiment of the present disclosure.

Referring to FIG. 11, a dielectric material is deposited in the first through-stack via cavities 585. The dielectric material can include a silicon-oxide based material such as undoped silicate glass, doped silicate glass, or a flowable oxide material. The dielectric material can be deposited by a conformal deposition method such as chemical vapor deposition or spin coating. A void may be formed within an unfilled portion of each first through-stack via cavity 585. Excess portion of the deposited dielectric material may be removed from above a horizontal plane including the top surface of the first contact level dielectric layer 280, for example, by chemical mechanical planarization or a recess etch. Each remaining dielectric material portion filling a respective one of the first through-stack via cavity 585 constitutes a through-stack insulating material portion 584. The through-stack insulating material portions 584 contact sidewalls of the alternating stacks (132, 146, 232, 246), and may contact the silicon nitride layer 766.

Figure 12A:
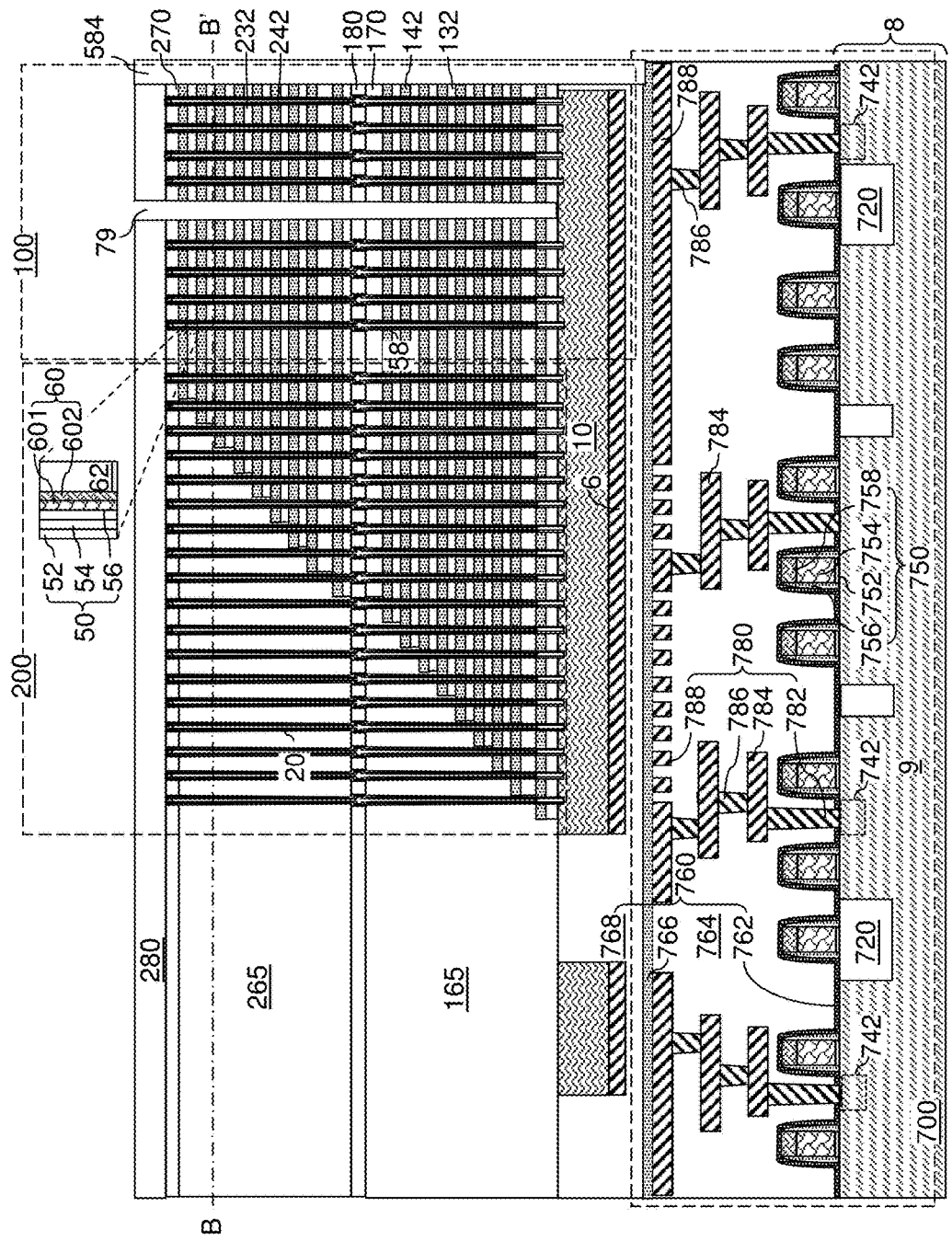
FIG. 12A is a vertical cross-sectional view of the first exemplary structure after formation of backside contact trenches according to an embodiment of the present disclosure.
Figure 12B:
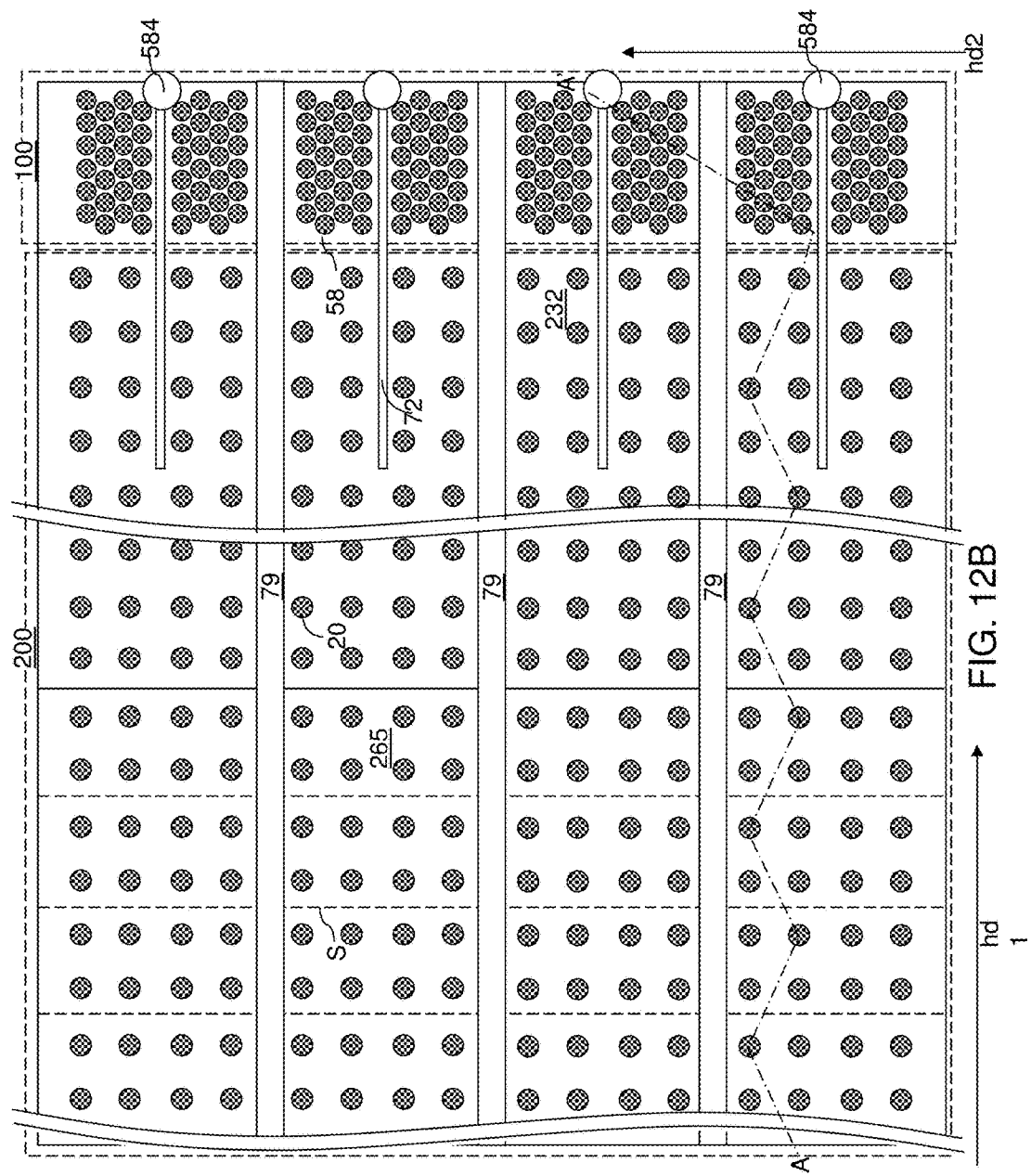
FIG. 12B is a horizontal cross-sectional view of the first exemplary structure along the horizontal plane B-B' in FIG. 12A. The zig-zag vertical plane A-A' corresponds to the plane of the vertical cross-sectional view of FIG. 12A.

Referring to FIGS. 12A and 12B, backside contact trenches 79 are subsequently formed through the first contact level dielectric layer 280 and the memory-level assembly. For example, a photoresist layer can be applied and lithographically patterned over the first contact level dielectric layer 280 to form elongated openings that extend along a first horizontal direction hd1. An anisotropic etch is performed to transfer the pattern in the patterned photoresist layer through the first contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 can be laterally spaced one from another along a second horizontal direction hd2, which can be perpendicular to the first horizontal direction hd1. The backside contact trenches 79 can extend through the memory array region (e.g., a memory plane) 100 and the word line contact via region 200. The first subset of the backside contact trenches 79 laterally divides the memory-level assembly (e.g., into memory blocks).

Figure 13A:
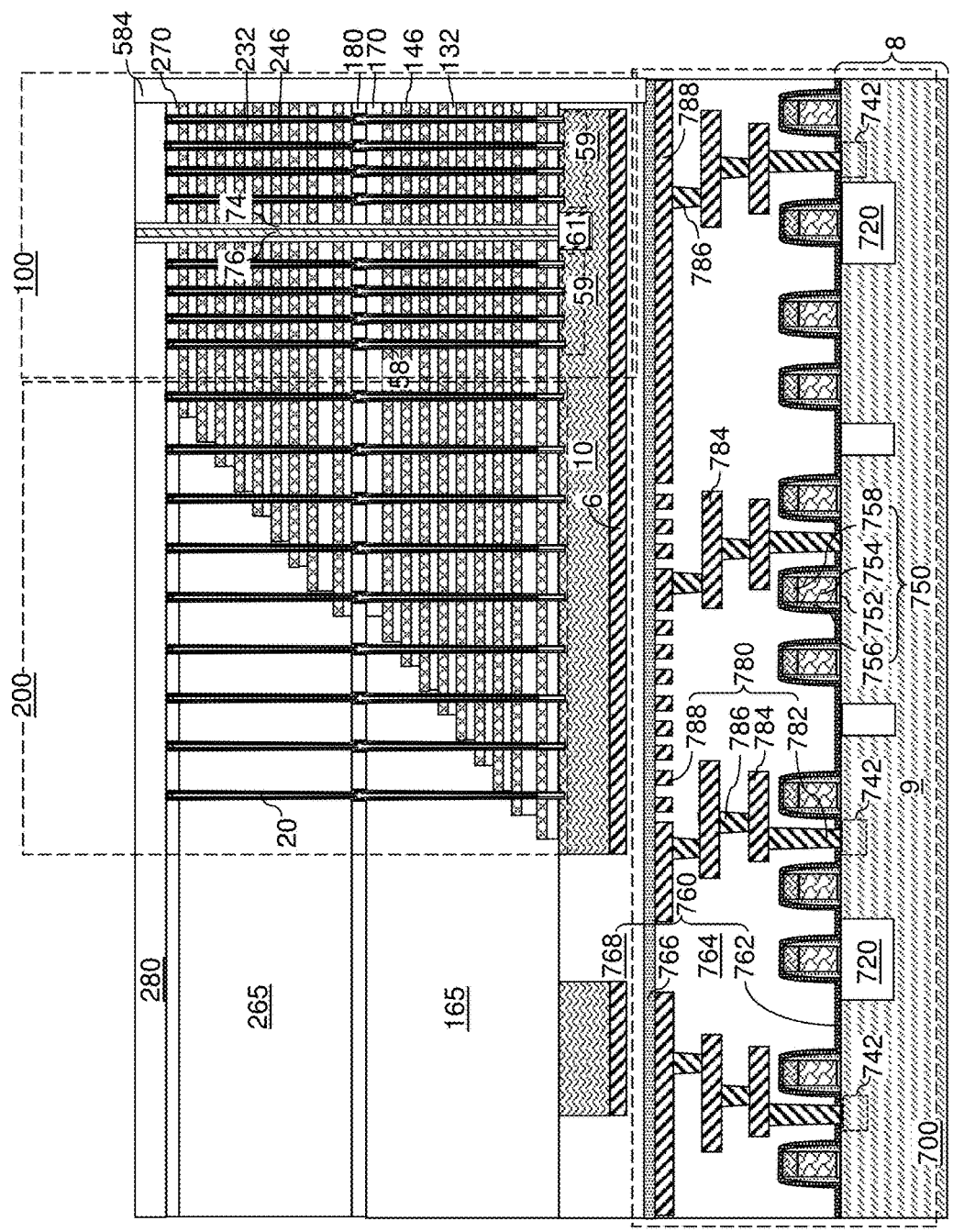
FIG. 13A is a vertical cross-sectional view of the first exemplary structure after replacement of sacrificial material layers with electrically conductive layers and formation of insulating spacers and backside contact via structures according to an embodiment of the present disclosure.

Referring to FIGS. 13A and 13B, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside contact trenches 79, for example, using an isotropic etch process. First backside recesses are formed in volumes from which the first sacrificial material layers 142 are removed. Second backside recesses are formed in volumes from which the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process using a wet etch solution, or can be a gas phase (dry) etch process in which the etchant is introduced in a vapor phase into the backside contact trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials used in the art. In case the sacrificial material layers (142, 242) comprise a semiconductor material, a wet etch process (which may use a wet etchant such as a KOH solution) or a dry etch process (which may include gas phase HCl) may be used.

Each of the first and second backside recesses can be a laterally extending cavity having a lateral dimension that is greater than the vertical extent of the cavity. In other words, the lateral dimension of each of the first and second backside recesses can be greater than the height of the respective backside recess. A plurality of first backside recesses can be formed in the volumes from which the material of the first sacrificial material layers 142 is removed. A plurality of second backside recesses can be formed in the volumes from which the material of the second sacrificial material layers 242 is removed. Each of the first and second backside recesses can extend substantially parallel to the top surface of the substrate 8. A backside recess can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second sacrificial material layers (142, 242). Further, a top surface of the planar semiconductor material layer 10 can be physically exposed at the bottom of each backside contact trench 79. An annular dielectric spacer (not shown) can be formed around each pedestal channel portion 11 by oxidation of a physically exposed peripheral portion of the pedestal channel portions 11. Further, a semiconductor oxide potion (not shown) can be formed from each physically exposed surface portion of the planar semiconductor material layer 10 concurrently with formation of the annular dielectric spacers.

A backside blocking dielectric layer (not shown) can be optionally deposited in the backside recesses and the backside contact trenches 79 and over the first contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If used, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be used.

At least one conductive material can be deposited in the plurality of backside recesses, on the sidewalls of the backside contact trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses, a plurality of second electrically conductive layers 246 can be formed in the plurality of second backside recesses, and a continuous metallic material layer (not shown) can be formed on the sidewalls of each backside contact trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside contact trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside contact trenches 79. Specifically, the deposited metallic material of the continuous metallic material layer can be etched back from the sidewalls of each backside contact trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A subset of the first electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Dopants of a second conductivity type, which is the opposite of the first conductivity type of the planar semiconductor material layer 10, can be implanted into a surface portion of the planar semiconductor material layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. The first contact level dielectric layer 280 may be thinned due to a collateral etch during the anisotropic etch that removes the vertical portions of horizontal portions of the deposited conformal insulating material. A horizontal semiconductor channel 59 can be provided between each source region 61 and a neighboring group of pedestal channel portion 11.

A conformal insulating material layer can be deposited in the backside contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure can be formed in the remaining volume of each backside contact trench 79, for example, by deposition of at least one conductive material and removal of excess portions of the deposited at least one conductive material from above a horizontal plane including the top surface of the first contact level dielectric layer 280 by a planarization process such as chemical mechanical planarization or a recess etch. The backside contact via structures are electrically insulated in all lateral directions, and is laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside contact trenches 79 and removing the deposited doped semiconductor material from upper portions of the backside contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the first contact level dielectric layer 280. The first contact level dielectric layer 280 can be thinned and removed during a latter part of the planarization process, which may use chemical mechanical planarization (CMP), a recess etch, or a combination thereof. Each laterally-elongated contact via structure 76 can be formed through the memory-level assembly and on a respective source region 61. The top surface of each laterally-elongated contact via structure 76 can located above a horizontal plane including the top surfaces of the memory stack structures 55.

Figure 14A:
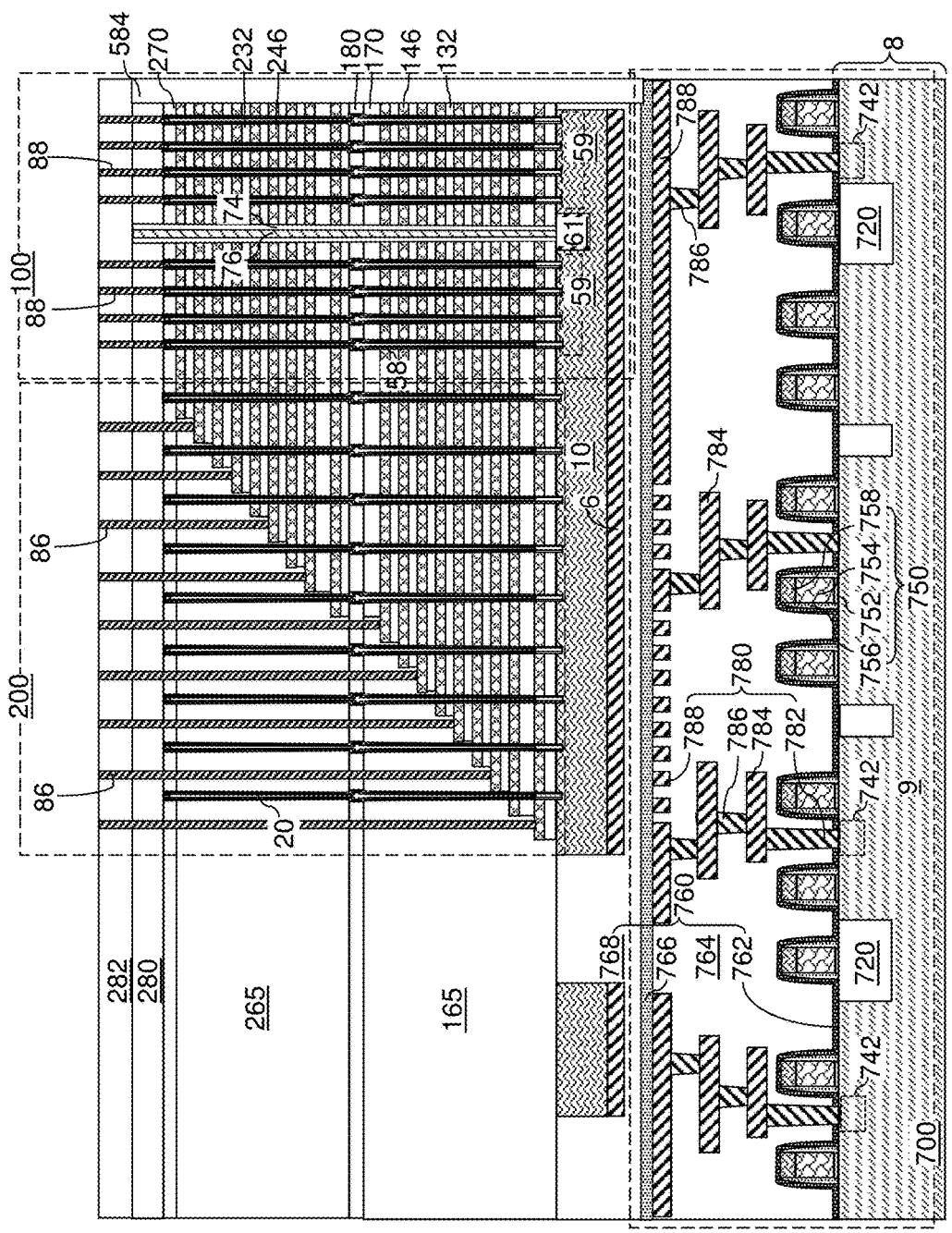
FIG. 14A is a vertical cross-sectional view of the first exemplary structure after formation of drain contact via structures and word line contact via structures according to an embodiment of the present disclosure.
Figure 14B:
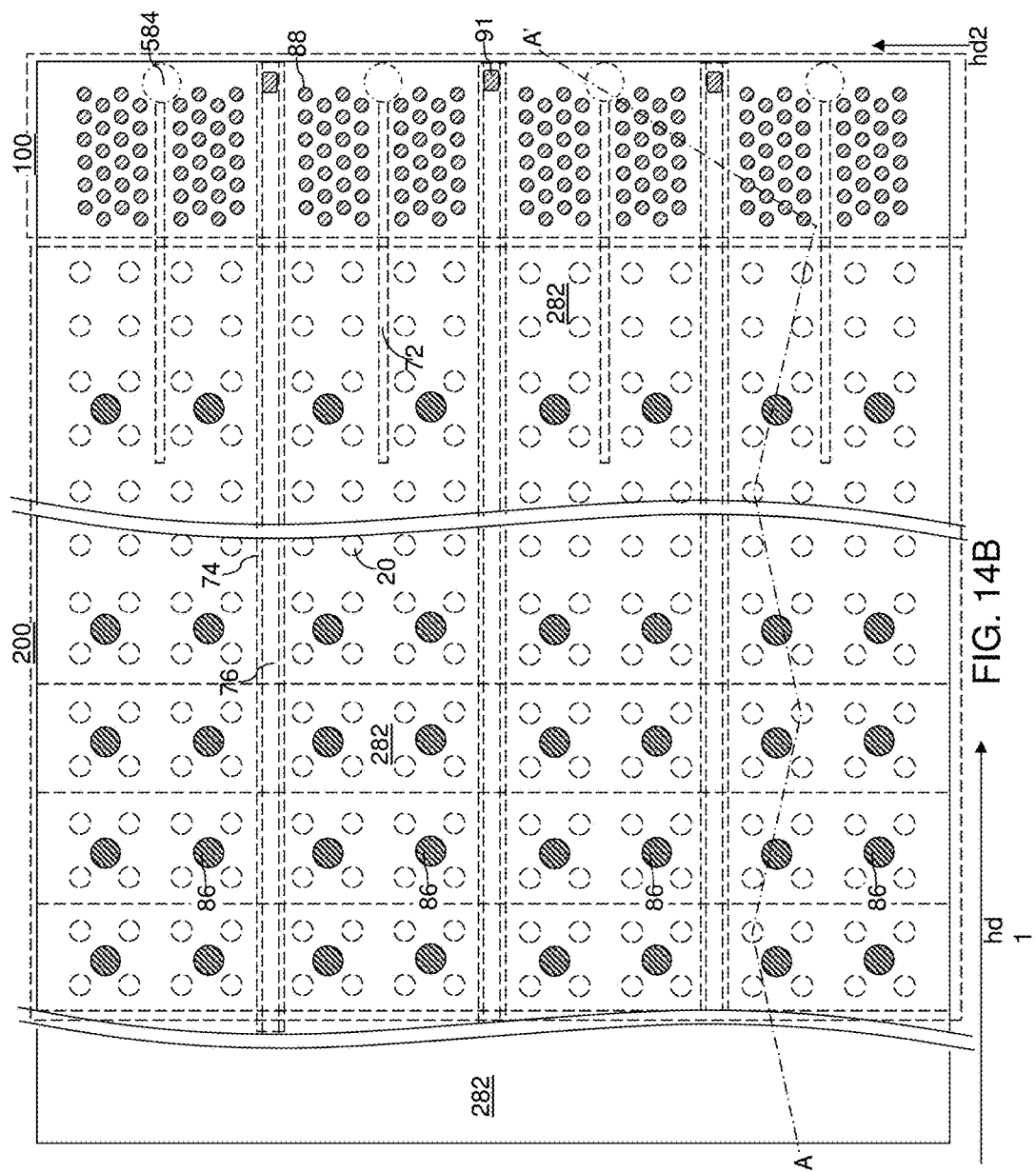
FIG. 14B is a horizontal cross-sectional view of the first exemplary structure along the horizontal plane B-B' in FIG. 14A. The zig-zag vertical plane A-A' corresponds to the plane of the vertical cross-sectional view of FIG. 14A.

Referring to FIGS. 14A and 14B, a second contact level dielectric layer 282 can be optionally formed over the first contact level dielectric layer 280. The second contact level dielectric layer 282 includes a dielectric material such as silicon oxide or silicon nitride. The thickness of the second contact level dielectric layer 282 can be in a range from 30 nm to 300 nm, although lesser and greater thicknesses can also be used.

Drain contact via structures 88 contacting the drain regions 63 can extend through the contact level dielectric layers (280, 282) and the second insulating cap layer 270 in the memory array region 100. A source connection via structure 91 can extend through the contact level dielectric layers (280, 282) to provide electrical connection to the laterally-elongated contact via structures 76.

Various contact via structures can be formed through the contact level dielectric layers (280, 282) and the retro-stepped dielectric material portions (165, 265). For example, word line contact via structures 86 can be formed in the word line contact region 200. A subset of the word line contact via structures 86 contacting the second electrically conductive layers 246 extends through the second-tier retro-stepped dielectric material portion 265 in the word line contact region 200, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165 in the word line contact region 200.

Figure 15:
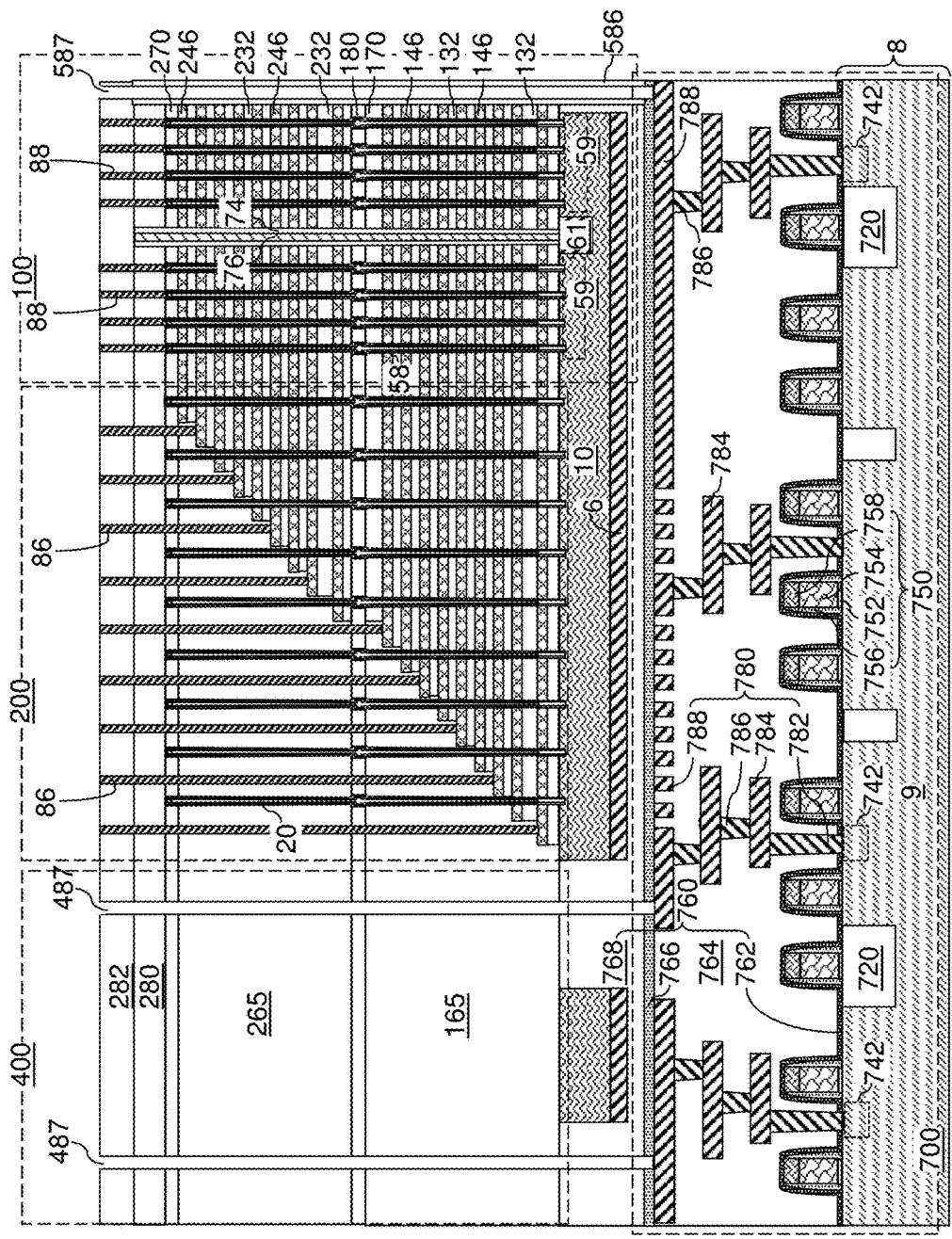
FIG. 15 is a vertical cross-sectional view of the first exemplary structure after formation of second through-track via cavities and through-dielectric via cavities according to an embodiment of the present disclosure.

Referring to FIG. 15, a photoresist layer is applied over the second contact level dielectric layer 282, and is lithographically patterned to form openings that overlie the through-stack insulating material portions 584 in the memory array region 100, and additional memory openings in which layers of the alternating stacks (132, 146, 232, 246) are absent, i.e., in a peripheral region 400 located outside the memory array region 100 and the contact region 200. For example, the peripheral region may surround memory array region 100 and/or the contact region 200 and/or may be located on one or more sides of the memory array region 100 and/or the contact region 200. In one embodiment, the areas of the openings in the memory array region 100 may be entirely within the areas of the through-stack insulating material portions 584. In one embodiment, the areas of the openings outside the areas of the memory array region 100 and the contact region 200 (e.g., the areas of the openings in the peripheral region 400) may be within areas of openings in the planar semiconductor material layer 10 and the optional planar conductive material layer 6.

Via cavities (487, 587) are formed by an anisotropic etch process that transfers the pattern of the openings in the photoresist layer to the top surfaces of the topmost lower metal line structures 788. Specifically, second through-stack via cavities 587 are formed through the through-stack insulating material portions 584 such that a remaining portion of each through-stack insulating material portion 584 after formation of the second through-stack via cavities 587 constitutes a through-stack insulating spacer 586. In one embodiment, the second through-stack via cavities 587 can be formed using an anisotropic etch process that includes a first etch step that etches the dielectric material of the through-stack insulating material portions 584 selective to silicon nitride, and a second etch step that etches a physically exposed portion of the silicon nitride layer 766. The first etch step uses the silicon nitride layer 766 as an etch stop layer. Thus, the via cavities 587 are etched through the insulating material (e.g., silicon oxide) of the through-stack insulating material portions 584, rather than through the electrically conductive layers (e.g., tungsten and/or titanium nitride layers) (146, 246). Etching silicon oxide of portions 584 is easier than etching refractory metal and/or refractory metal nitride layers (146, 246). Furthermore, etching the opening 585 through the alternating stack of insulating layers (132, 232) such as silicon oxide, and sacrificial material layers (142, 242) such as silicon nitride before forming the electrically conductive layers (146, 246) easier than etching the opening through the electrically conductive layers (146, 246). Thus, by forming and filling the openings 585 with an insulating material (e.g., with portions 584) before replacing the sacrificial material layers with the electrically conductive layers makes it easier to subsequently form the second through-stack via cavities 587 through the insulating material after replacing the sacrificial material layers with the electrically conductive layers, instead of etching the cavities 587 through the electrically conductive layers.

Each through-stack insulating spacer 586 can have a substantially cylindrical shape. Depending on the lithographic alignment of the pattern of the openings in the photoresist layer and the through-stack insulating material portions 584, the second through-stack via cavities 587 may, or may not, have a lateral offset from the geometrical center of a respective one of the through-stack insulating material portion 584. Thus, the through-stack insulating spacers 586 may, or may not, have a uniform thickness around the vertical axis passing through the geometrical center thereof as a function of an azimuthal angle. In other words, the through-stack insulating spacers 586 may have the same thickness irrespective of the azimuthal angle in the case of perfect lithographic alignment, or may have an azimuthally-varying thickness that is measured between the inner sidewall and the outer sidewall of a respective through-stack insulating spacer 586. The second through-stack via cavities 587 are formed through the silicon nitride layer 766. A top surface of a lower metal line structure (such as a topmost lower metal liner structure 788) can be physically exposed at the bottom of each second through-stack via cavity 587.

Further, through-dielectric via cavities 487 can be formed in the peripheral region through the contact level dielectric layers (280, 282), the retro-stepped dielectric material portions (165, 265), the at least one second dielectric material layer 768, and the silicon nitride layer 766 to a top surface of a respective one of the topmost lower metal liner structures 788. The through-dielectric via cavities 487 can be formed concurrently with formation of the second through-stack via cavities 587 using a same photolithography and anisotropic etch processes. In one embodiment, the through-dielectric via cavities 487 can pass through openings in the planar semiconductor material layer 10 and the optional planar conductive material layer 6. The photoresist layer can be removed, for example, by ashing.

Figure 16A:
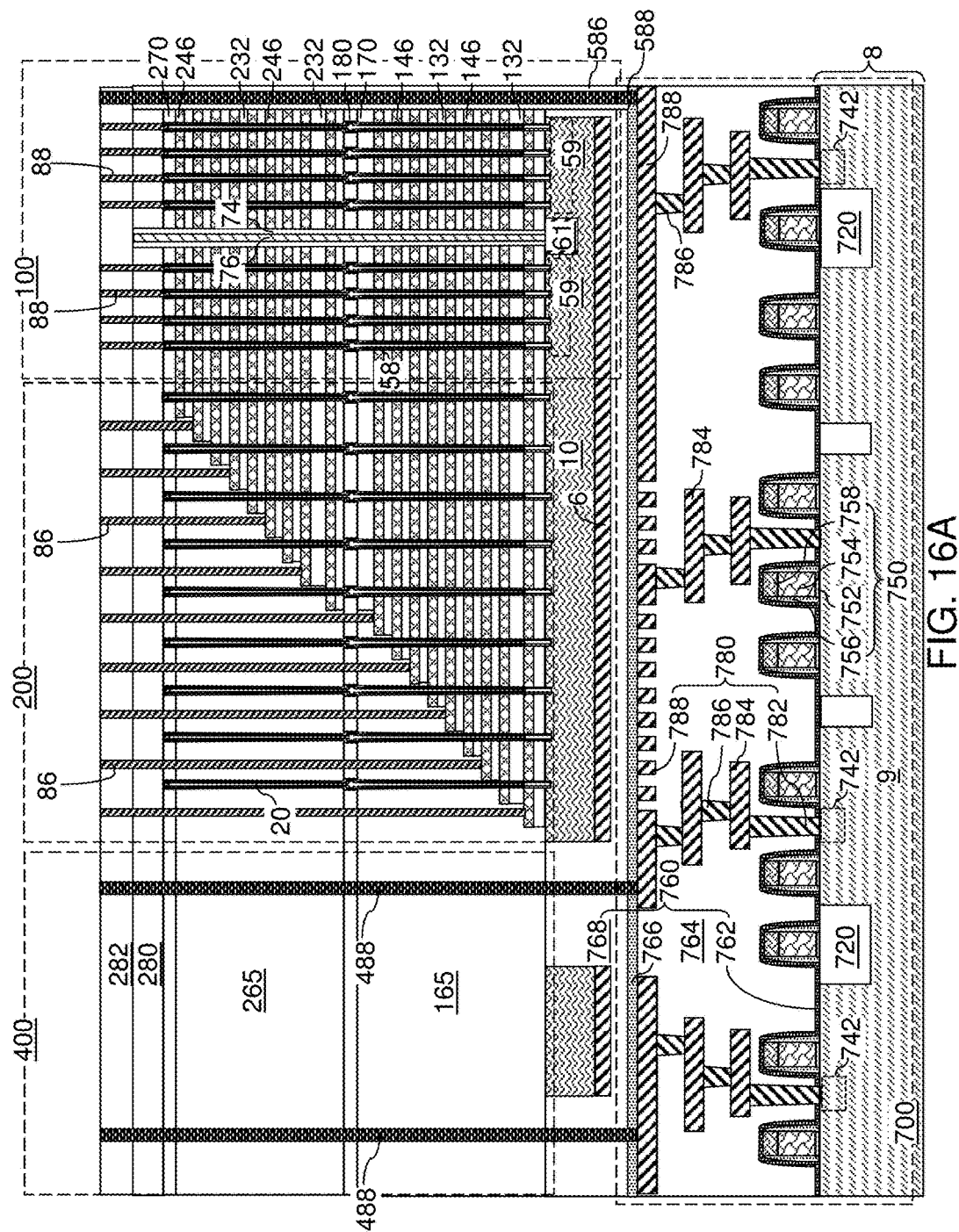
FIG. 16A is a vertical cross-sectional view of the first exemplary structure after formation of through-stack contact via structures and through-dielectric contact via structures according to an embodiment of the present disclosure.
Figure 16B:
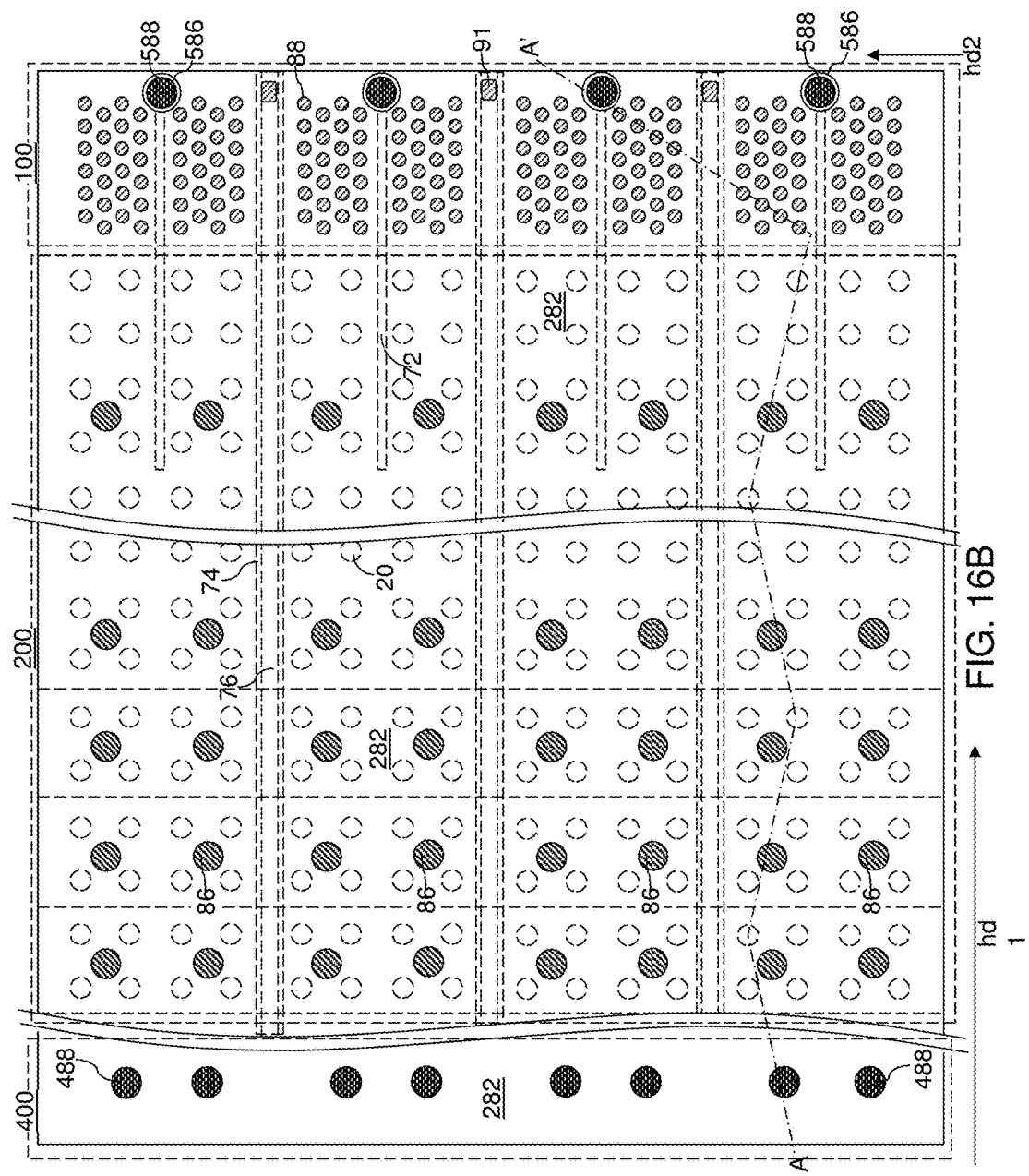
FIG. 16B is a horizontal cross-sectional view of the first exemplary structure along the horizontal plane B-B' in FIG. 16A. The zig-zag vertical plane A-A' corresponds to the plane of the vertical cross-sectional view of FIG. 16A.

Referring to FIGS. 16A and 16B, at least one conductive material can be simultaneously deposited in the second through-stack via cavities 587 and the through-dielectric via cavities 487. The at least one conductive material can include, for example, a metallic nitride liner (such as a TiN liner) and a metal fill material (such as W, Cu, Al, Ru, or Co). Excess portions of the at least one conductive material can be removed from outside the second through-stack via cavities 587 and the through-dielectric via cavities 487. For example, excess portions of the at least one conductive material can be removed from above the top surface of the second contact level dielectric layer 282 by a planarization process such as chemical mechanical planarization and/or a recess etch. Each remaining portion of the at least one conductive material in the second through-stack via cavities 587 constitutes a through-stack contact via structure 588 that contacts a top surface of a respective one of the topmost lower metal line structure 788. Each remaining portion of the at least one conductive material in the through-dielectric via cavities 487 that contacts a top surface of a respective one of the topmost lower metal line structure 788 constitutes a through-dielectric contact via structure 488. Each through-stack contact via structure 588 can be formed within a respective second through-stack via cavity 587 and inside a respective through-stack insulating spacer 586. Thus, through-stack contact via structures 588 are formed through the alternating stacks (132, 146, 232, 246), the at least one second dielectric material layer 768, and the silicon nitride layer 766, and directly on a top surface of a lower metal line structure (such as a topmost lower metal line structure 788). In this embodiment, each through-stack contact via structure 588 extends through the second contact level dielectric layer 282 and the silicon nitride layer (i.e., the hydrogen barrier layer) 766, while the respective through-stack insulating spacer 586 does not extend through the second contact level dielectric layer 282 and the silicon nitride layer (i.e., the hydrogen barrier layer) 766.

Figure 17:
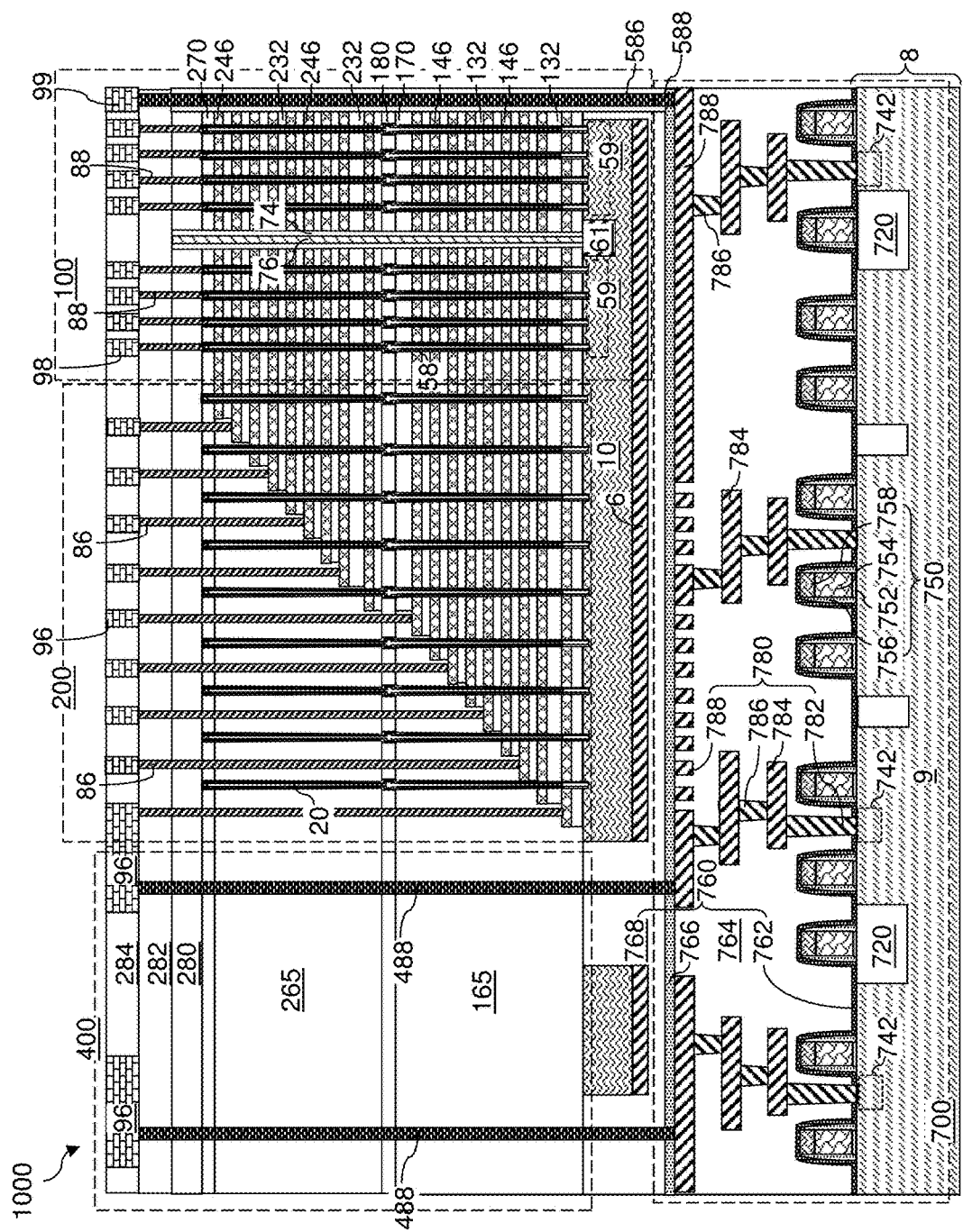
FIG. 17 is a vertical cross-sectional view of the first exemplary structure after formation of upper metal line structures during manufacture of a first die according to an embodiment of the present disclosure.

Referring to FIG. 17, at least one upper interconnect level dielectric layer 284 can be formed over the contact level dielectric layers (280, 282). Various upper interconnect level metal structures can be formed in the at least one upper interconnect level dielectric layer 284. For example, the various upper interconnect level metal structures can include line level metal interconnect structures (96, 98, 99). The line level metal interconnect structures (96, 98, 99) can include first upper metal line structures 99 that contact a top surfaces of a respective one of the through-stack contact via structures 588, second upper metal line structures 96 that contact a top surface of a respective one of the through-dielectric contact via structures 488, and bit lines 98 that contact a respective one of the drain contact via structures 88 and extend along the second horizontal direction (e.g., bit line direction) hd2 and perpendicular to the first horizontal direction (e.g., word line direction) hd1. In one embodiment, a subset of the first upper metal line structures 99 may be used to provide electrical connections through the source connection via structures 91 described above to the laterally-elongated contact via structures 76 and to the source regions 61. In one embodiment, a subset of the second upper metal line structures 96 may contact, or are electrically coupled to, a respective pair of a word line contact via structure 86 and a through-dielectric contact via structure 488.

At least a subset of the upper metal interconnect structures (which include the line level metal interconnect structures (96, 98, 99)) is formed over the three-dimensional memory array. The upper metal interconnect structures comprise an upper metal line structure (such as a first upper metal line structure 99) that is formed directly on a through-stack contact via structure 588. A set of conductive structures including the through-stack contact via structure 588 and a lower metal line structure (such as a topmost lower metal line structure 788) provides an electrically conductive path between the at least one semiconductor device 710 on the substrate semiconductor layer and the upper metal line structure. A through-dielectric contact via structure 488 can be provided through the retro-stepped dielectric material portions (165, 265), the at least one second dielectric material layer 768, and the silicon nitride layer 766 and directly on a top surface of another lower metal line structure (e.g., another topmost lower metal line structure 788) of the lower metal interconnect structures 780.

In one embodiment, the semiconductor structure further comprises: a terrace region including stepped surfaces of layers of the alternating stack (132, 232, 146, 246); a retro-stepped dielectric material portion (165 or 265) overlying the stepped surfaces and located at levels of the alternating stack (132, 232, 146, 246) and above the at least one second dielectric material layer 768; and a through-dielectric contact via structure 488 vertically extending through the retro-stepped dielectric material portion (165 or 265), the at least one second dielectric material layer 768, and the silicon nitride layer 766 and contacting a top surface of another lower metal line structure 788 of the lower metal interconnect structures 780. In one embodiment, a through-stack contact via structure 588 is laterally spaced from each layer within the alternating stack (132, 232, 146, 246) by a through-stack insulating spacer 586. Alternatively, the through-dielectric contact via structure 488 directly contacts the retro-stepped dielectric material portion (165 or 265) and the at least one second dielectric material layer 768 (as illustrated in FIG. 17).

In one embodiment, the memory stack structures 55 can comprise memory elements of a vertical NAND device. The electrically conductive layers (146, 246) can comprise, or can be electrically connected to, a respective word line of the vertical NAND device. The substrate 8 can comprises a silicon substrate. The vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising the word line driver circuit and a bit line driver circuit for the memory device. The array of monolithic three-dimensional NAND strings can comprise a plurality of semiconductor channels, wherein at least one end portion (such as a vertical semiconductor channel 60) of each of the plurality of semiconductor channels (59, 11, 60) extends substantially perpendicular to a top surface of the semiconductor substrate 8, a plurality of charge storage elements (comprising portions of the memory material layer 54 located at each word line level), each charge storage element located adjacent to a respective one of the plurality of semiconductor channels (59, 11, 60), and a plurality of control gate electrodes (comprising a subset of the electrically conductive layers (146, 246) having a strip shape extending substantially parallel to the top surface of the substrate 8 (e.g., along the first horizontal direction hd1), the plurality of control gate electrodes comprise at least a first control gate electrode located in the first device level and a second control gate electrode located in the second device level.

The first exemplary structure of FIG. 17 can be a memory and logic die 1000, which can be subsequently bonded to a logic die using copper-to-copper bonding. Generally speaking, a memory and logic die 1000 can include a three-dimensional memory device and peripheral logic devices 710 located in the peripheral device region 700 used driver circuit devices for the three-dimensional memory device. The peripheral logic devices 710 (i.e., driver circuit devices) can include word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the peripheral logic devices 710 can include word line drivers that drive a respective one of the word lines (146, 246), bit line drivers that drive a respective one of the bit lines 98, and a sense amplifier circuitry electrically connected to the bit lines 98 and configured to read a state of selected memory elements within the three-dimensional array of memory elements.

The three-dimensional memory device includes a three-dimensional array of memory elements (such as portions of charge storage layers 54 in the memory film 50 located at levels of the electrically conductive layers (146, 246) and a vertical semiconductor channel 60). The three-dimensional memory device can include word lines comprising the electrically conductive layers (146, 246) and bit lines 98 for individually accessing the memory elements within the three-dimensional array of memory elements. The line level metal interconnect structures (96, 98, 99) may include interconnection bonding pads attached to, or integrated into, one or more of the first upper metal line structures 99, the second upper metal line structures 96, and the bit lines 98. As used herein, an "interconnection bonding pad" refers to a bonding pad that can be used to form an electrical signal interconnection path when bonded to a mating bonding pad. An interconnection bonding pad may be a memory-side bonding pad when the interconnection bonding pad is located on the side of a memory device and is configured to mate another interconnection bonding pad connected to a peripheral logic device, or may be a logic-side bonding pad when the interconnection pad is located on the side of a peripheral logic device and is configured to mate another interconnection bonding pad connected to a memory device. Such interconnection bonding pads can be used to bond the memory and logic die 1000 to a logic die including a matching set of interconnection bonding pads. Alternatively, additional dielectric layers can be formed above the line level interconnect structures (96, 98, 99), and interconnection bonding pads can be included in such additional dielectric layers and electrically connected to the line level interconnect structures (96, 98, 99) by additional electrically conductive line and/or via structures.

Figure 18:
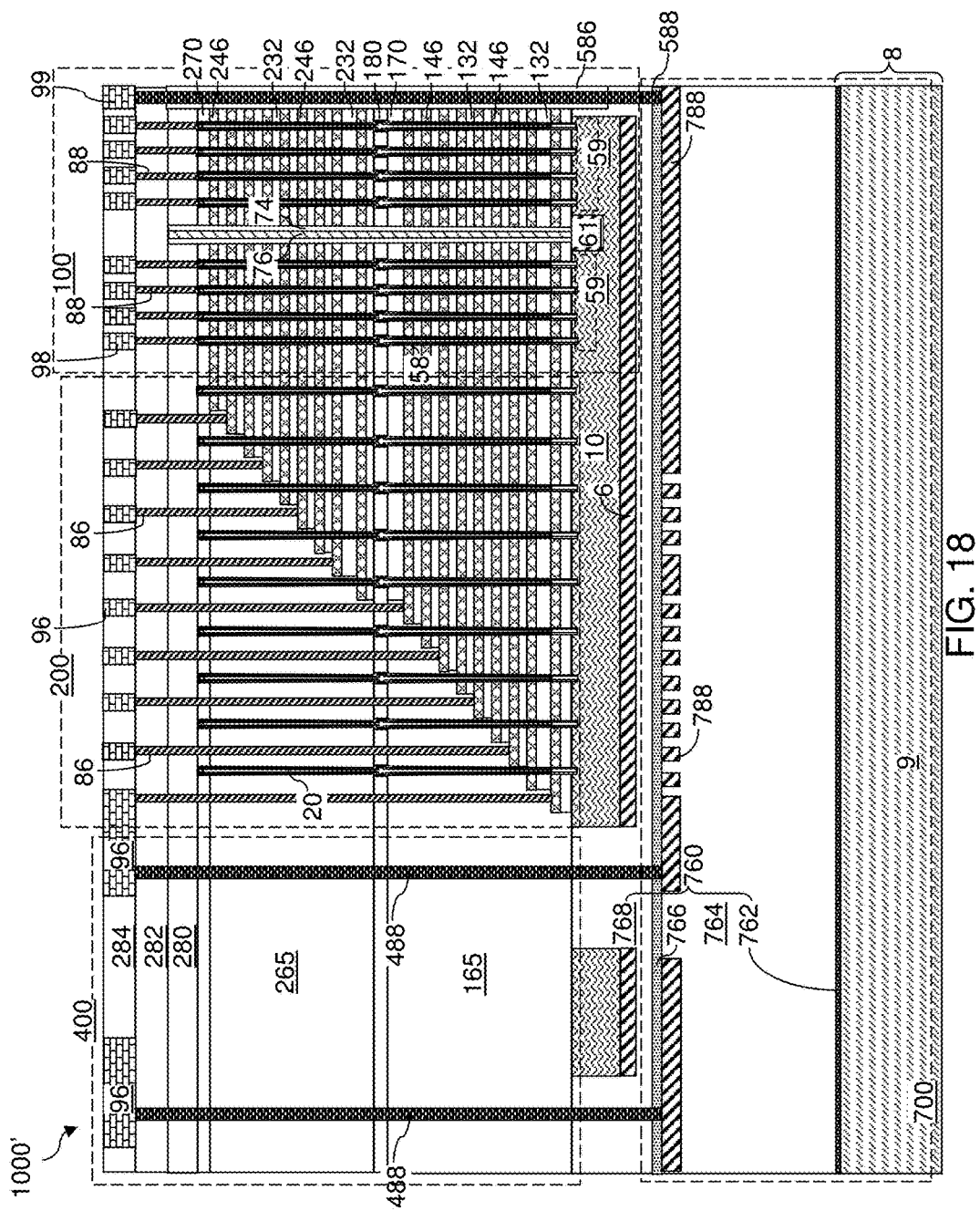
FIG. 18 is a vertical cross-sectional view of an alternative embodiment of the first exemplary structure during manufacture of a first die according to an embodiment of the present disclosure.

The various semiconductor devices formed on the substrate 8 may be omitted in some embodiments. FIG. 18 illustrates an alternative embodiment of the first exemplary structure during manufacture of a memory-only die 1000', which does not include peripheral logic devices on the top surface of the substrate 8, and includes a three-dimensional memory device including a three-dimensional array of memory elements. As in the case of the first exemplary structure of FIG. 17, the line level metal interconnect structures (96, 98, 99) may include interconnection bonding pads attached to, or integrated into, one or more of the first upper metal line structures 99, the second upper metal line structures 96, and the bit lines 98. Alternatively, additional dielectric layers can be formed above the line level interconnect structures (96, 98, 99), and interconnection bonding pads can be included in such additional dielectric layers and electrically connected to the line level interconnect structures (96, 98, 99) by additional electrically conductive line and/or via structures. Such interconnection bonding pads can be used to bond the memory-only die 1000' to a logic die including a matching set of interconnection bonding pads. In one embodiment, the interconnection bonding pads can include memory-side bonding pads. The set of dielectric material layers embedding memory-side bonding pads is collectively referred to as a memory dielectric material layer. Generally speaking, the memory dielectric material layer can be formed over, or under, the three-dimensional array of memory elements. The memory-side bonding pads are included in the memory dielectric material layer, and are electrically connected to a respective node within the three-dimensional memory device.

Referring to FIG. 19, a second exemplary structure is illustrated, which includes a logic die 2000. The logic die 2000 includes a peripheral logic circuitry that includes complementary metal oxide semiconductor (CMOS) devices 2710 containing PMOS and NMOS field effect transistors located on a semiconductor substrate 2009. In one embodiment, the semiconductor substrate 2009 can be a silicon wafer. The CMOS devices can include active regions 2730, which include source regions and drain regions separated by respective channel regions 2746 included within the semiconductor substrate 2009. The CMOS devices can include gate structures 2750, each of which includes a vertical stack of a gate dielectric and a gate electrode. At least one dielectric material layer, which can be a plurality of dielectric material layers, is formed over the CMOS devices, which is herein referred to as a logic dielectric material layer 2760. Metal interconnect structures 2780 (which are herein referred to as second metal interconnect structures) can be formed in the logic dielectric material layer 2760. The metal interconnect structures 2780 can include metal via structures 2784 and metal line structures 2786, each of which can be included in the logic dielectric material layer 2760 and in electrical contact with the active regions 2730 or gate structures 2750 of the CMOS devices 2710. The logic dielectric material layer 2760 overlies the CMOS devices 2710 in an upright position, and underlies the CMOS devices 2710 in an upside-down position.

Bonding pads (2792, 2794) can be formed in a surface portion of the logic dielectric material layer 2760 such that the top surface of each bonding pad (2792, 2794) is physically exposed at the top surface of the logic dielectric material layer 2760. The bonding pads (2792, 2794) can include logic-side bonding pads 2792 and through-substrate via contact pads 2794. Each of the bonding pads (2792, 2794) is included in the logic dielectric material layer 2760, and can be electrically connected to a respective node (e.g., active regions 2730 or gate structures 2750) within the CMOS devices 2710 through the metal interconnect structures 2780.

A three-dimensional memory device including a three-dimensional array of memory elements can be provided in a memory and logic die 1000 or in a memory-only die 1000'. The memory and logic dies 1000 and the memory-only dies 1000' are collectively referred to as memory-containing dies (1000, 1000'). In one embodiment, the CMOS devices can include word line drivers that drive a respective one of the word lines comprising the electrically conductive layers (146, 246) within a memory-containing die (1000, 1000'), bit line drivers that can drive a respective one of the bit lines 98 located in the memory-containing die (1000, 1000') upon subsequent bonding of the logic die 2000 with the memory-containing die (1000, 1000'), and a sense amplifier circuitry electrically connected to the bit lines 98 and configured to read a state of selected memory elements within the three-dimensional array of memory elements upon subsequent bonding of the logic die 2000 with the memory-containing die (1000, 1000').

Referring to FIG. 20, the backside of the logic die 2000 can be optionally thinned. The thinning of the backside of the logic die 2000 can be effected by grinding, etching, and/or polishing the backside of the semiconductor substrate 2009. The thickness of the semiconductor substrate 2009 after thinning can be in a range from 30 microns to 200 microns, although lesser and greater thicknesses can also be used. In one embodiment, a sacrificial protective material layer may be applied over the top surface of the logic dielectric material layer 2760 during thinning and subsequently removed.

Figure 21:
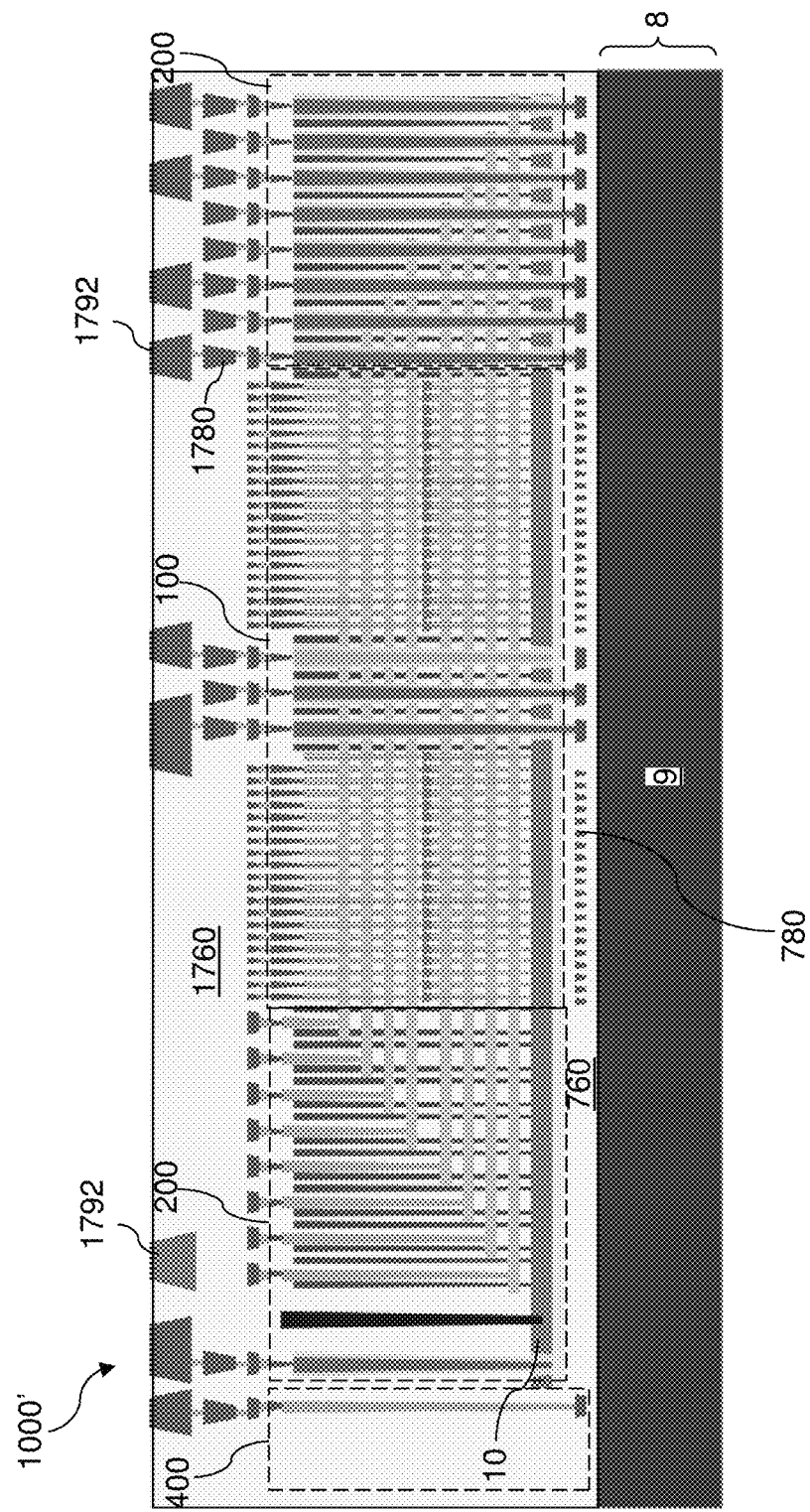
FIG. 21 is a vertical cross-section view of the alternate embodiment of the first exemplary structure after formation of first bonding pads according to an embodiment of the present disclosure.

Referring to FIG. 21, memory-side bonding pads 1792 can be provided on any of the memory-containing dies (1000, 1000') described above. As discussed above, the memory-side bonding pads 1792 can be integrated into the line level metal interconnect structures (96, 98, 99), or may be formed above the line level metal interconnect structures (96, 98, 99) at a different level and electrically connected to the line level metal interconnect structures (96, 98, 99). Generally, a memory dielectric material layer 1760 is formed above a three-dimensional array of memory elements. The memory dielectric material layer 1760 can include contact level dielectric layers (280, 282) and at least one upper interconnect level dielectric layer 284 as shown in FIGS. 17 and 18, and any additional dielectric material layer formed thereabove.

Memory-side metal interconnect structures 1780 (which are herein referred to first metal interconnect structures) formed in the memory dielectric material layer 1760 can include line level metal interconnect structures (96, 98, 99) and various contact via structures (86, 88, 586, 488), and may include additional line level structures and/or additional via level structures. The memory-side bonding pads 1792 can be formed on the uppermost elements of the memory interconnect structures 1780. Top surfaces of the memory-side bonding pads 1792 can be coplanar with the top surface of the memory dielectric material layer 1760.

Generally, the pattern of the memory-side bonding pads 1792 and the pattern of the logic-side bonding pads 2792 can be selected such that the pattern of the memory-side bonding pads 1792 and the mirror image of the pattern of the logic-side bonding pads 2792 have an areal overlap at each location at which electrical connection is to be made between a memory-side bonding pad 1792 and a logic-side bonding pad 2792 upon bonding. In some embodiments, the pattern of the memory-side bonding pads 1792 in the memory-containing die (1000, 1000') may be the mirror image of the pattern of the logic-side bonding pads 2792 in the logic die 2000.

The thickness of each memory-side bonding pad 1792 can be in a range from 50 nm to 1,000 nm, such as from 100 nm to 500 nm, although lesser and greater thicknesses can also be used. The thickness of each logic-side bonding pad 2792 can be in a range from 50 nm to 1,000 nm, such as from 100 nm to 500 nm, although lesser and greater thicknesses can also be used. The memory-side bonding pads 1792 and the logic-side bonding pads 2792 may have a circular horizontal cross-sectional shape, a rectangular horizontal cross-sectional shape, an elliptical horizontal cross-sectional shape, or any horizontal cross-sectional shape of a closed generally curvilinear two-dimensional geometrical shape. The maximum lateral dimensions of the first and second bonding pads (1792, 2792) can be in a range from 2 microns to 60 microns, such as from 5 microns to 20 microns, although lesser and greater maximum lateral dimensions can also be used.

Figure 22:
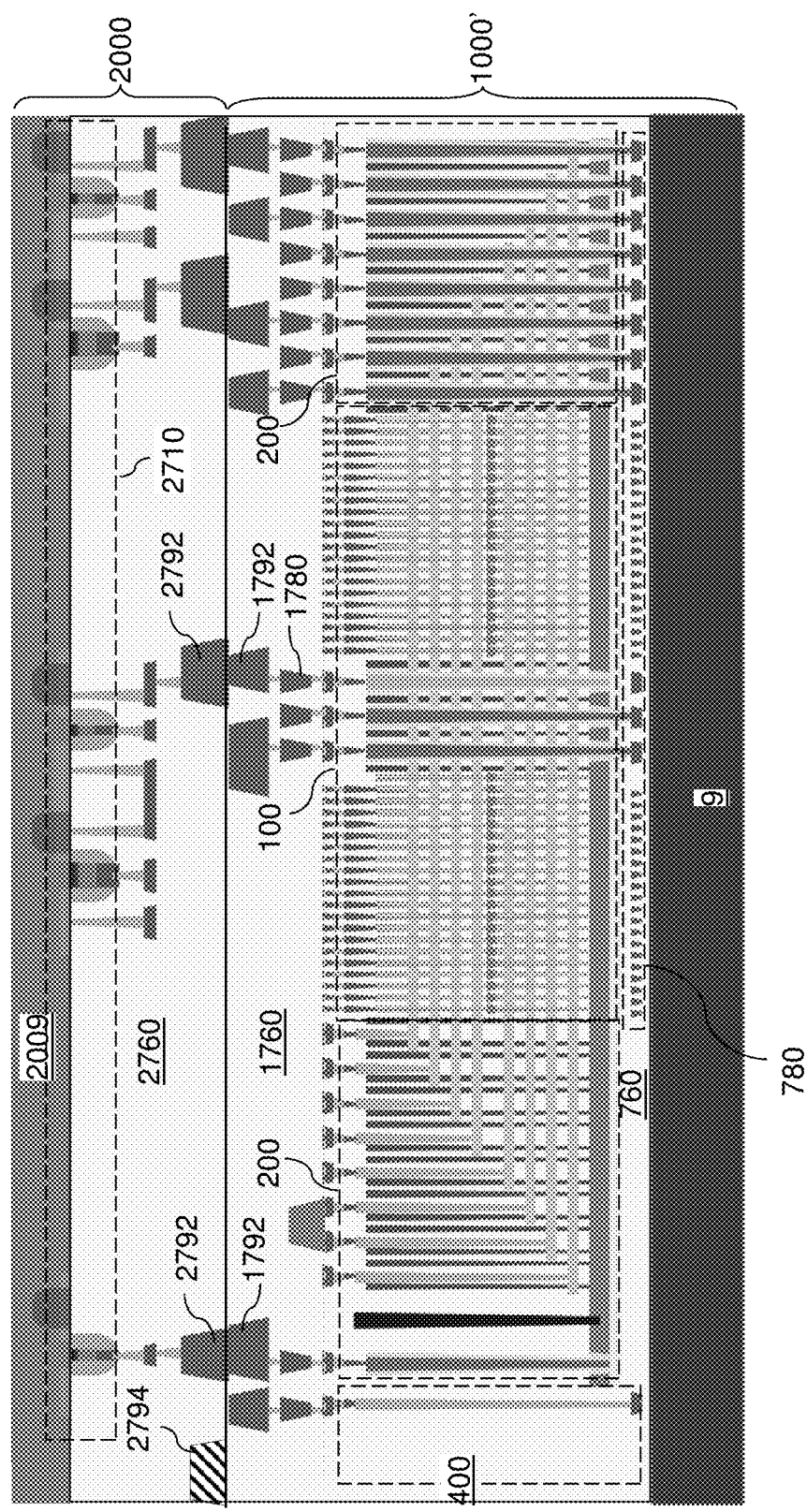
FIG. 22 is a vertical cross-sectional view of a first exemplary bonded assembly formed by bonding the alternative embodiment of the first exemplary structure of FIG. 21 and the second exemplary structure of FIG. 20 according to an embodiment of the present disclosure.

Referring to FIG. 22, the memory-only die 1000' of FIG. 21 and the logic die 2000 of FIG. 20 can be bonded using copper-to-copper bonding to provide a first exemplary bonded assembly (1000', 2000). The memory-only die 1000' and the logic die 2000 can be positioned such that memory-side bonding pads 1792 face the logic-side bonding pads 2792. Optionally, argon plasma treatment can be performed on the surfaces of the memory-side bonding pads 1792 and the logic-side bonding pads 2792 to clean the surfaces prior to bonding. The memory-side bonding pads 1792 in the memory-only die 1000' can be disposed directly on the logic-side bonding pads 2792 in the logic die 2000. Copper interdiffusion can be induced by annealing the memory-only die 1000' and the logic die 2000 while matching pairs of memory-side bonding pads 1792 and logic-side bonding pads 2792 remain in physical contact. Multiple bonded pairs (1792, 2792) of a respective memory-side bonding pad 1792 and a respective logic-side bonding pad 2792 can be formed at an interface between the memory-only die 1000' and the logic die 2000.

Optionally, the backside of the substrate 8 can be thinned after the bonding step. The thickness of the substrate 8 after thinning may be in a range from 30 microns to 100 microns, although lesser and greater thicknesses can also be used.

The first exemplary bonded assembly includes a functional three-dimensional memory device located in the memory-only die 1000' that is electrically connected to a peripheral logic device in the logic die 2000. As such, the first exemplary bonded assembly (1000', 2000) is configured to provide control signals from the logic die 2000 to the memory-only die 1000' through the multiple bonded pairs of pads (1792, 2792), and to provide sense signals from the memory-only die 1000' to the logic die 2000 through the multiple bonded pairs of pads (1792, 2792). The multiple bonded pairs (1792, 2792) of a respective memory-side bonding pad 1792 and a respective logic-side bonding pad 2792 can function as bidirectional signal flow channels for control signals and sense signals.

In one embodiment, the three-dimensional array of memory elements can be located within a two-dimensional array of vertical NAND strings, and each vertical NAND string in the array of vertical NAND strings can include charge storage elements controlled by word lines comprising the electrically conductive layers (146, 246) and a vertical semiconductor channel 60 of which an end portion is electrically connected to a respective bit line 98 through a drain region 63. A first subset of the memory-side bonding pads 1792 can be electrically connected to a respective bit line 98, and a second subset of the memory-side bonding pads 1792 can be electrically connected to a respective word line.

In one embodiment shown in FIG. 21, the memory-only die 1000' can include a semiconductor material layer 10 contacting an end of each vertical semiconductor channel 60 of the vertical NAND strings, and metal interconnect structures 780 that are vertically spaced from the semiconductor material layer 10, and are more proximal to the semiconductor material layer 10 than to the vertical semiconductor channels 60. In this case, the metal interconnect structures 780 can be included in an interconnect level dielectric material layer 760 located on an opposite side of the semiconductor material layer 10 with respect to the memory dielectric material layer 1760. In other words, the interconnect level dielectric material layer 760 can be located underneath the semiconductor material layer 10 and the memory dielectric material layer 1760 can be located above the semiconductor material layer 10, or vice versa. Thus, the semiconductor material layer 10 is located between the interconnect level dielectric material layer 760 and the memory dielectric material layer 1760.

In case field effect transistors are not formed on the substrate semiconductor layer 9, the substrate semiconductor layer 9 may be replaced with any carrier substrate that may include a semiconductor material, a conductive material, or an insulating material. Such a carrier substrate merely needs to provide mechanical strength for supporting the three-dimensional memory devices thereupon. In one embodiment, the memory-only die 1000' can include a carrier substrate in lieu of the substrate semiconductor layer 9, which can be located on the interconnect level dielectric material layer 760. In one embodiment, the carrier substrate does not include any field effect transistor therein or directly thereupon. The vertical field effect transistors in the three-dimensional memory device within the memory-only die 1000' can be vertically spaced from the carrier substrate by the interconnect level dielectric material layer 760.

Figure 23:
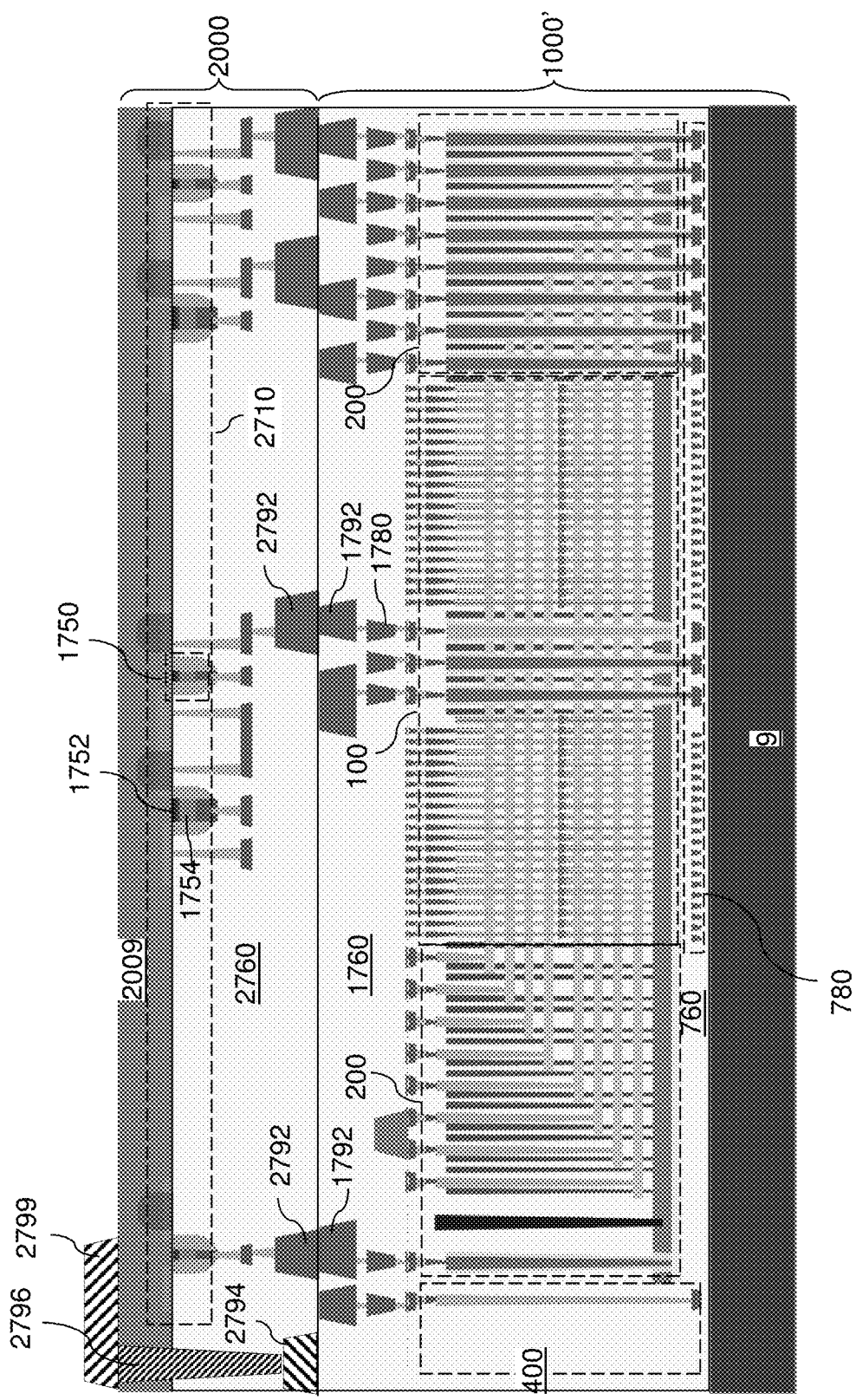
FIG. 23 is a vertical cross-sectional view of the first exemplary bonded assembly after formation of a through-substrate via structure and a bonding pad according to an embodiment of the present disclosure.

Referring to FIG. 23, at least one through-substrate via structure 2796 can be formed through the semiconductor substrate 2009 and the logic dielectric material layer 2760, and directly on a backside surface of a respective one of the through-substrate via contact pads 2794. A backside insulating layer (not shown) may be optionally formed on the backside of the semiconductor substrate 8 as needed. At least one through-substrate via cavity can be formed through the optional backside insulating layer, the semiconductor substrate 2009, and the logic dielectric material layer 2760 by an anisotropic etch process using a patterned etch mask layer with suitable openings therein. An insulating liner can be formed within each through-substrate via cavity by conformal deposition of an insulating liner layer and by an anisotropic etch that removes horizontal portions of the insulating liner layer. At least one conductive material can be deposited in each remaining volume of the at least one through-substrate via cavity. Excess portions of the at least one conductive material can be removed from above the backside surface of the semiconductor substrate 2009 to provide a through-substrate via structure 2796 within a respective insulating liner. A bonding pad 2799 can be formed on the backside of the semiconductor substrate 2009.

Generally, a through-substrate via contact pad 2794 can be formed in the logic dielectric material layer 2760. The front surface of the through-substrate via contact pad 2794 can contact the memory-only die 1000' (for example, the top surface of the memory dielectric material layer 1760) upon bonding the first and the logic dies (1000', 2000). A through-substrate via structure 2796 extending through the semiconductor substrate 2009 and the logic dielectric material layer 2760 of the logic die 2000 can be formed directly on a backside surface of the through-substrate via contact pad 2796. A bonding pad 2799 can be formed on the backside of the semiconductor substrate 2009 and on the through-substrate via structure 2796.

In the structure illustrated in FIG. 23, the memory-only die 1000' is a first die comprising a three-dimensional memory device including a three-dimensional array of memory elements, a first dielectric material layer (i.e., the memory dielectric material layer 1760) overlying (in an upright position), or underlying (in an upside-down position), the three-dimensional array of memory elements, and first bonding pads (i.e., the memory-side bonding pads 1792) included in the first dielectric material layer 1760 and electrically connected to a respective node within the three-dimensional memory device. The logic die 2000 is a second die comprising a semiconductor substrate 2009, a peripheral logic circuitry that includes complementary metal oxide semiconductor (CMOS) devices located on the semiconductor substrate 2009, a second dielectric material layer (i.e., a logic dielectric material layer 2760) overlying (in the upright position), or underlying (in the upside-down position), the CMOS devices, and second bonding pads (i.e., the logic-side bonding pads 2792) included in the second dielectric material layer 2760 and electrically connected to a respective node within the CMOS devices. The first bonding pads 1792 are bonded with the second bonding pads 2792 through copper interdiffusion to provide multiple bonded pairs (1792, 2792) of a respective first bonding pad 1792 and a respective second bonding pad 2792 at an interface between the first die 1000' and the second die 2000. Control signals flow from the second die 2000 to the first die 1000 through the multiple bonded pairs (1792, 2792), and sense signals flow from the first die 1000' to the second die 2000 through the multiple bonded pairs (1792, 2792).

The gate structures 1750 of the CMOS devices 2710 are located between the memory array region 100 of the memory-containing die (1000, 1000') and the semiconductor substrate 2009 containing the active regions 2730 separated by a channel 2746 of the logic die 2000. In other words, the gate electrodes 1754 of the CMOS devices 2710 of the logic die 2000 are located upside-down below the source, drain and channel regions (2730, 2746) of the same CMOS devices 2710 with respect to the top of the substrate 8 of the memory-containing die (1000, 1000').

Figure 24:
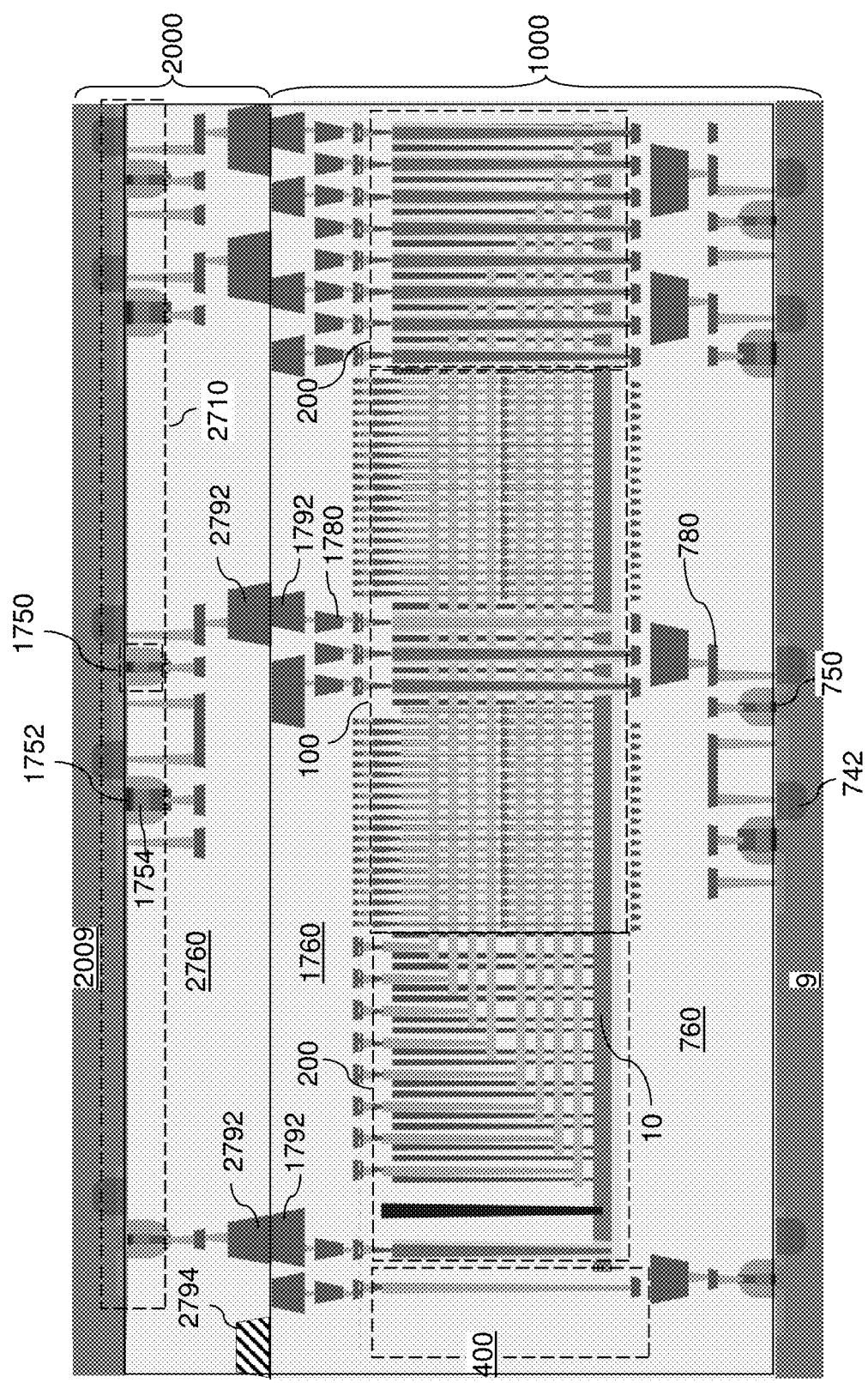
FIG. 24 is a vertical cross-sectional view of an alternative embodiment of the first exemplary bonded assembly formed by bonding the first exemplary structure of FIG. 17 as modified by formation of first bonding pads and the second exemplary structure of FIG. 20 according to an embodiment of the present disclosure.

Referring to FIG. 24, an alternative embodiment of the first exemplary bonded assembly is illustrated, which can be formed by bonding a memory and logic die 1000 including first exemplary structure of FIG. 17 as modified by formation of memory-side bonding pads 1792 (formed, for example, using the processing steps of FIG. 21) and the logic die 2000 including the second exemplary structure of FIG. 20. In this case, metal interconnect structures 780 can be included in an interconnect level dielectric material layer 760 located on an opposite side of the semiconductor material layer 10 with respect to the memory dielectric material layer 1760. Thus, the semiconductor material layer 10 is located between the interconnect level dielectric material layer 760 and the memory dielectric material layer 1760. The logic die 2000 includes a semiconductor substrate 2009. The memory and logic die 1000 can include an additional semiconductor substrate (which can include a substrate semiconductor layer 9) located on the interconnect level dielectric material layer 760. An additional peripheral logic circuitry that includes additional CMOS devices can be located on the additional semiconductor substrate 8, and can be electrically coupled to at least one node of the three-dimensional memory device located in the memory and logic die 1000.

In this embodiment, the peripheral logic circuitry of the logic die 2000 can include very low voltage (VLV) CMOS devices 2710, while the peripheral logic circuitry of the logic and memory-containing die 1000 can include low voltage (LV) and high voltage (HV) CMOS devices 710 located in the peripheral device region 700. The VLV CMOS devices 2710 are configured to be operated at a lower voltage than the LV and HV CMOS devices 710. In one embodiment, the gate dielectric 1752 of the VLV CMOS devices 2710 can be thinner than the gate dielectric 752 of the LV and/or HV CMOS devices 710. The gate structures 750 of the LV and/or HV CMOS devices 710 are located between the memory array region 100 and the semiconductor substrate 8 containing the active regions 742 separated by a channel 746. The gate structures 1750 of the VLV devices 2710 are located between the memory array region 100 and the semiconductor substrate 2009 containing the active regions 2730 separated by a channel 2746 of the logic die 2000.

In the structure illustrated in FIG. 24, the memory and logic die 1000 is a first die comprising a three-dimensional memory device including a three-dimensional array of memory elements, a first dielectric material layer (i.e., the memory dielectric material layer 1760) overlying (in an upright position), or underlying (in an upside-down position), the three-dimensional array of memory elements, and first bonding pads (i.e., the memory-side bonding pads 1792) included in the first dielectric material layer 1760 and electrically connected to a respective node within the three-dimensional memory device. The logic die 2000 is a second die comprising a semiconductor substrate 2009, a peripheral logic circuitry that includes complementary metal oxide semiconductor (CMOS) devices located on the semiconductor substrate 2009, a second dielectric material layer (i.e., a logic dielectric material layer 2760) overlying (in the upright position), or underlying (in the upside-down position), the CMOS devices, and second bonding pads (i.e., the logic-side bonding pads 2792) included in the second dielectric material layer 2760 and electrically connected to a respective node within the CMOS devices. The first bonding pads 1792 are bonded with the second bonding pads 2792 through copper interdiffusion to provide multiple bonded pairs (1792, 2792) of a respective first bonding pad 1792 and a respective second bonding pad 2792 at an interface between the first die 1000 and the second die 2000. Control signals flow from the second die 2000 to the first die 1000 through the multiple bonded pairs (1792, 2792), and sense signals flow from the first die 1000 to the second die 2000 through the multiple bonded pairs (1792, 2792).

Figure 25:
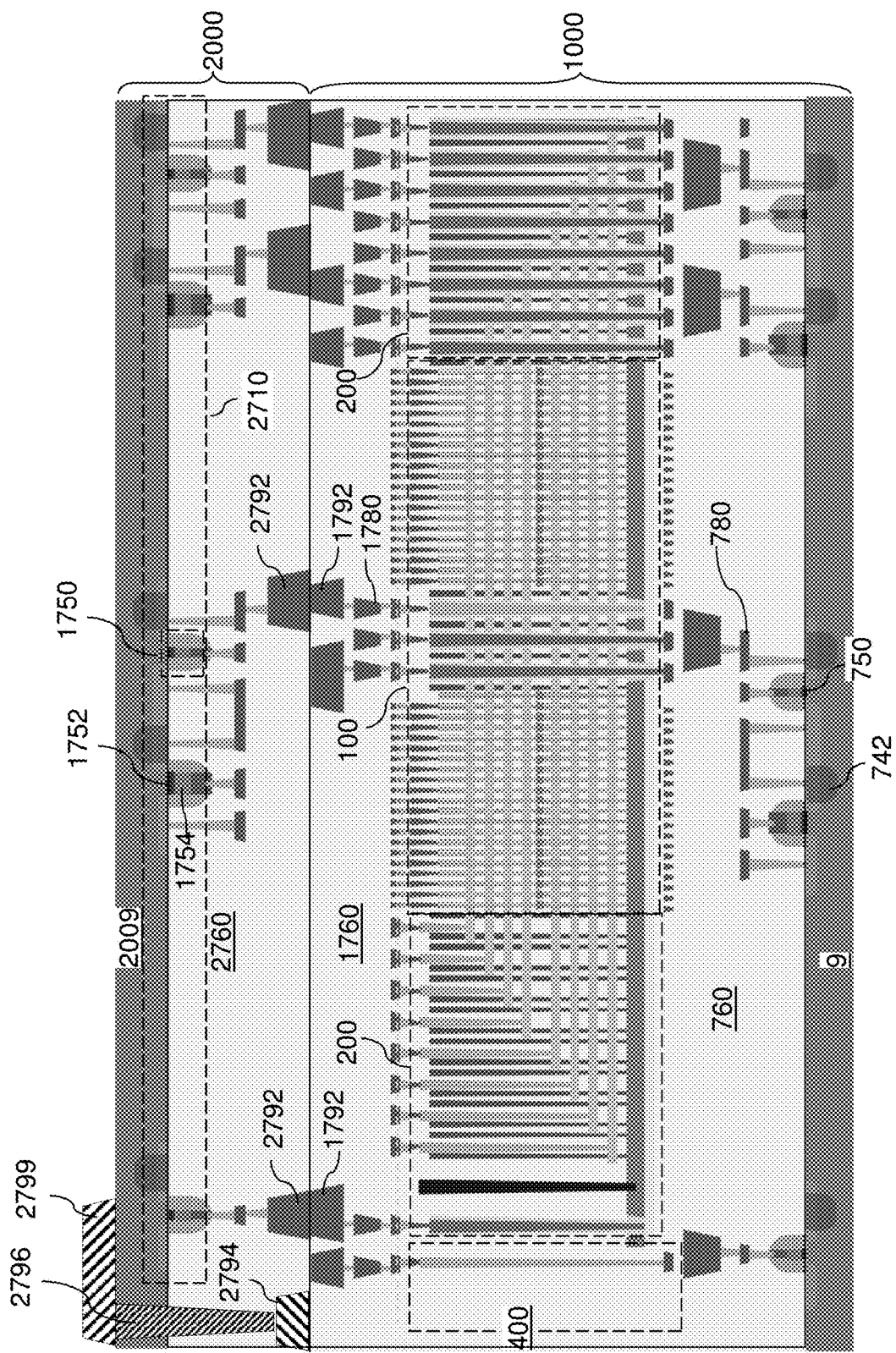
FIG. 25 is a vertical cross-sectional view of the alternative embodiment of the first exemplary bonded assembly after formation of a through-substrate via structure and a bonding pad according to an embodiment of the present disclosure.

Referring to FIG. 25, at least one through-substrate via structure 2796 can be formed through the semiconductor substrate 2009 and the logic dielectric material layer 2760, and directly on a backside surface of a respective one of the through-substrate via contact pads 2794. A backside insulating layer (not shown) may be optionally formed on the backside of the semiconductor substrate 8 as needed. At least one through-substrate via cavity can be formed through the optional backside insulating layer, the semiconductor substrate 2009, and the logic dielectric material layer 2760 by an anisotropic etch process using a patterned etch mask layer with suitable openings therein. An insulating liner can be formed within each through-substrate via cavity by conformal deposition of an insulating liner layer and by an anisotropic etch that removes horizontal portions of the insulating liner layer. At least one conductive material can be deposited in each remaining volume of the at least one through-substrate via cavity. Excess portions of the at least one conductive material can be removed from above the backside surface of the semiconductor substrate 2009 to provide a through-substrate via structure 2796 within a respective insulating liner. A bonding pad 2799 can be formed on the backside of the semiconductor substrate 2009. The bonding pads 2799 can be used to form packaging bond structures, which may include C4 bonding structures or wire bonding structures for placement of the first exemplary structure into a package such as a ceramic package or a laminated package.

Figure 26:
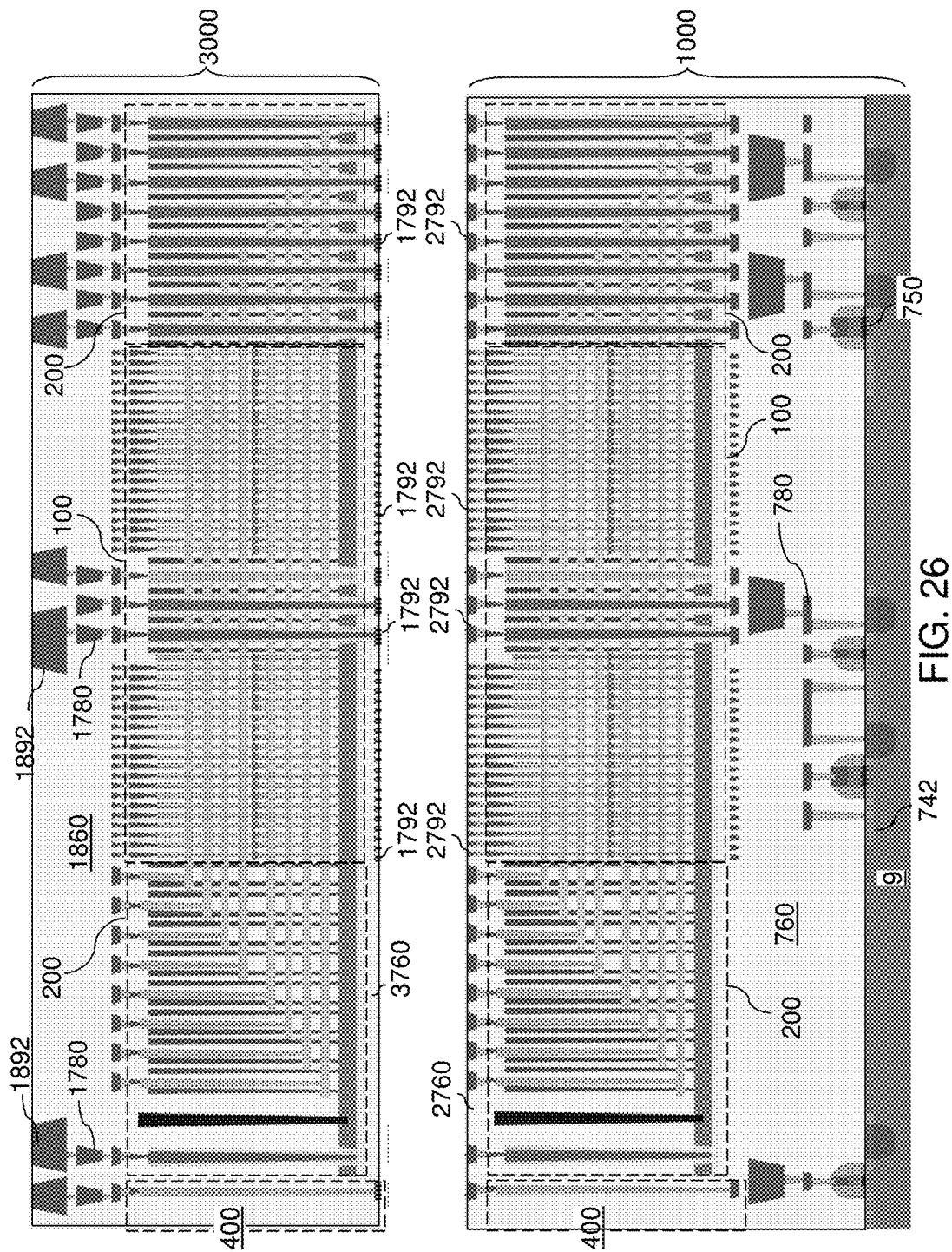
FIG. 26 is a vertical cross-sectional view of a first die and a second die prior to bonding according to an embodiment of the present disclosure.

Referring to FIG. 26, a memory-only die 3000 and a memory and logic die 1000 are illustrated prior to bonding. The memory-only die 3000 may be derived from the memory-only die 1000' illustrated in FIG. 18 by including memory-side bonding pads 1792 at the level of the lower metal interconnect structures 780. In this case, any carrier substrate may be used in lieu of the substrate semiconductor layer 9 of FIG. 18. The carrier substrate may be subsequently removed from below the lower level dielectric layers 760. For example, a silicon substrate using a thin hydrogen-implanted layer or sacrificial bonding layer near a top surface may be used as the carrier substrate, and bottom portion of the silicon substrate may be cleaved off during an anneal process after formation of the memory-only die 1000'. A remaining thin layer of silicon and bottom portions of the lower level dielectric layers 760 can be subsequently removed by a planarization process, which can use a wet etch process and/or chemical mechanical planarization. For example, the thin layer of silicon can be etched by a wet etch process using a KOH solution, and the bottom portions of the lower level dielectric layers 760 can be removed by a wet etch using hot phosphoric acid and/or hydrofluoric acid. A touch-up chemical mechanical planarization process can be used to physically expose the bottom surfaces of the memory-side bonding pads 1792 that are present at the level of the lower metal interconnect structures 780. The remaining portions of the lower level dielectric layer 760 constitutes a memory dielectric material layer 3760, in which the memory-side bonding pads 1792 are included. An upper portion of the memory-only die 3000 can include an interconnect dielectric material layer 1860 embedding memory-side metal interconnect structures 1780 and bonding pads 1892. The bonding pads 1892 may be subsequently used to bond another die (not illustrated) to the memory-only die 3000. Alternatively, the bonding pads 1892 can be used to form packaging bond structures, which may include C4 bonding structures or wire bonding structures for placement of the second exemplary structure into a package such as a ceramic package or a laminated package.

The memory and logic die 1000 of FIG. 26 may include the same elements as the memory and logic die 1000 of FIG. 24 except that the dielectric material at a top portion of the memory and logic die 1000 are used as a logic dielectric material layer 2760 and the bonding pads included therein are used as logic-side bonding pads 2792 (since the logic and memory-containing die 1000 contains the peripheral logic devices 710 in region 700). The logic-side bonding pads 2792 can be arranged to match the mirror image of the memory-side bonding pads 1792 in the memory-only die 3000.

Figure 27:
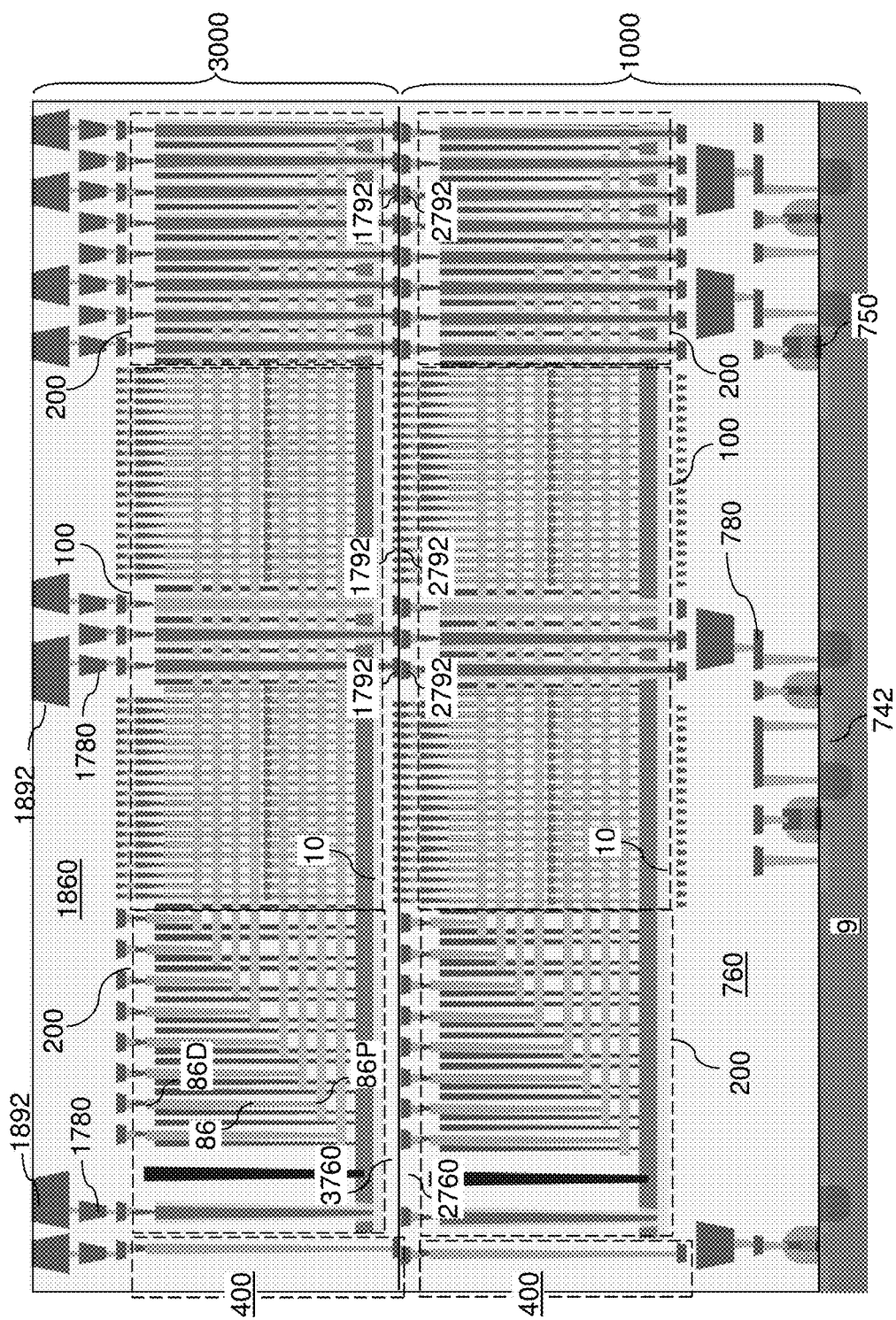
FIG. 27 is a vertical cross-sectional view of a second exemplary bonded assembly according to an embodiment of the present disclosure.

Referring to FIG. 27, the memory-only die 3000 and the memory and logic die 1000 can be bonded using copper-to-copper bonding to provide a second exemplary bonded assembly (3000, 1000). The memory-only die 3000 and the memory and logic die 1000 can be positioned such that memory-side bonding pads 1792 face the logic-side bonding pads 2792. Optionally, argon plasma treatment can be performed on the surfaces of the memory-side bonding pads 1792 and the logic-side bonding pads 2792 to clean the surfaces prior to bonding. The memory-side bonding pads 1792 in the memory-only die 3000 can be disposed directly on the logic-side bonding pads 2792 in the memory and logic die 1000. Copper interdiffusion can be induced by annealing the memory-only die 3000 and the memory and logic die 1000 while matching pairs of memory-side bonding pads 1792 and logic-side bonding pads 2792 remain in physical contact. Multiple bonded pairs (1792, 2792) of a respective memory-side bonding pad 1792 and a respective logic-side bonding pad 2792 can be formed at an interface between the memory-only die 3000 and the memory and logic die 1000.

The second exemplary bonded assembly includes a functional three-dimensional memory device located in the memory-only die 3000 that is electrically connected to a peripheral logic device in the logic and logic die 1000. As such, the second exemplary bonded assembly (3000, 1000) is configured to provide control signals from the memory and logic die 1000 to the memory-only die 3000 through the multiple bonded pairs (1792, 2792), and to provide sense signals from the memory-only die 3000 to the memory and logic die 1000 through the multiple bonded pairs (1792, 2792). The multiple bonded pairs (1792, 2792) of a respective memory-side bonding pad 1792 and a respective logic-side bonding pad 2792 can function as bidirectional signal flow channels for control signals and sense signals.

In one embodiment, the three-dimensional array of memory elements can be located within a two-dimensional array of vertical NAND strings, and each vertical NAND string in the array of vertical NAND strings can include charge storage elements controlled by word lines comprising the electrically conductive layers (146, 246) and a vertical semiconductor channel 60 of which an end portion is connected to a respective bit line 98. A first subset of the memory-side bonding pads 1792 can be electrically connected to a respective bit line 98, and a second subset of the memory-side bonding pads 1792 can be electrically connected to a respective word line.

In the second exemplary bonded assembly, the memory-only die 3000 is a first die comprising a three-dimensional memory device including a three-dimensional array of memory elements, a first dielectric material layer (i.e., the memory dielectric material layer 3760) overlying (in an upside-down position), or underlying (in an upright position), the three-dimensional array of memory elements, and first bonding pads (i.e., the memory-side bonding pads 1792) included in the first dielectric material layer 3760 and electrically connected to a respective node within the three-dimensional memory device. The memory and logic die 1000 is a second die comprising a semiconductor substrate 8, a peripheral logic circuitry that includes complementary metal oxide semiconductor (CMOS) devices 710 located on the semiconductor substrate 8, a second dielectric material layer (i.e., a logic dielectric material layer 2760) overlying (in the upright position), or underlying (in the upside-down position), the CMOS devices, and second bonding pads (i.e., the logic-side bonding pads 2792) included in the second dielectric material layer 2760 and electrically connected to a respective node within the CMOS devices. The first bonding pads 1792 are bonded with the second bonding pads 2792 through copper interdiffusion to provide multiple bonded pairs (1792, 2792) of a respective first bonding pad 1792 and a respective second bonding pad 2792 at an interface between the first die 3000 and the second die 2000. Control signals flow from the second die 2000 to the first die 3000 through the multiple bonded pairs (1792, 2792), and sense signals flow from the first die 3000 to the second die 2000 through the multiple bonded pairs (1792, 2792).

In one embodiment, the second die (i.e., the memory and logic chip 1000) further includes an additional three-dimensional memory device including a three-dimensional array of additional memory elements. The three-dimensional array of additional memory elements is located within a two-dimensional array of additional vertical NAND strings. The additional vertical NAND strings comprise charge storage elements (such as portions of the charge storage layers 54 located at levels of the electrically conductive layers (146, 246)) controlled by additional word lines and additional bit lines. The CMOS devices located on the semiconductor substrate 8 include a driver circuit for the additional word lines and a driver circuit for the additional bit lines in the memory and logic chip 1000, as well as the driver circuit for the word lines and the driver circuit for the bit lines in the memory-only chip 3000.

In some embodiment, the multiple bonded pairs (1792, 2792) of the respective first bonding pad 1792 and the respective second bonding pad 2792 can include a first subset of the multiple bonded pairs (1792, 2792) that provides electrical connection between a respective word line in the first die 3000 and a respective word line in the second die 1000, and a second subset of multiple bonded pairs (1792, 2792) that provides electrical connection between a respective bit line 98 in the first die 3000 and a respective bit line 98 in the second die 1000.

In one embodiment, the semiconductor material layer 10 in the first die 3000 is more proximal to the interface between the first die 3000 and the second die 1000 than the two-dimensional array of vertical NAND strings in the first die 3000 is to the interface between the first die 3000 and the second die 1000. The three-dimensional memory device in the first die comprises word line contact via structures 86 including proximal end surfaces 86P that are proximal to the interface between the first die 3000 and the second die 1000 and distal end surfaces 86D that are distal from the interface between the first die 3000 and the second die 1000. The distal end surfaces 86D of the word line contact via structures 86 can be located within a same horizontal plane, and can be equidistant from the interface between the first die 3000 and the second die 1000.

Figure 28:
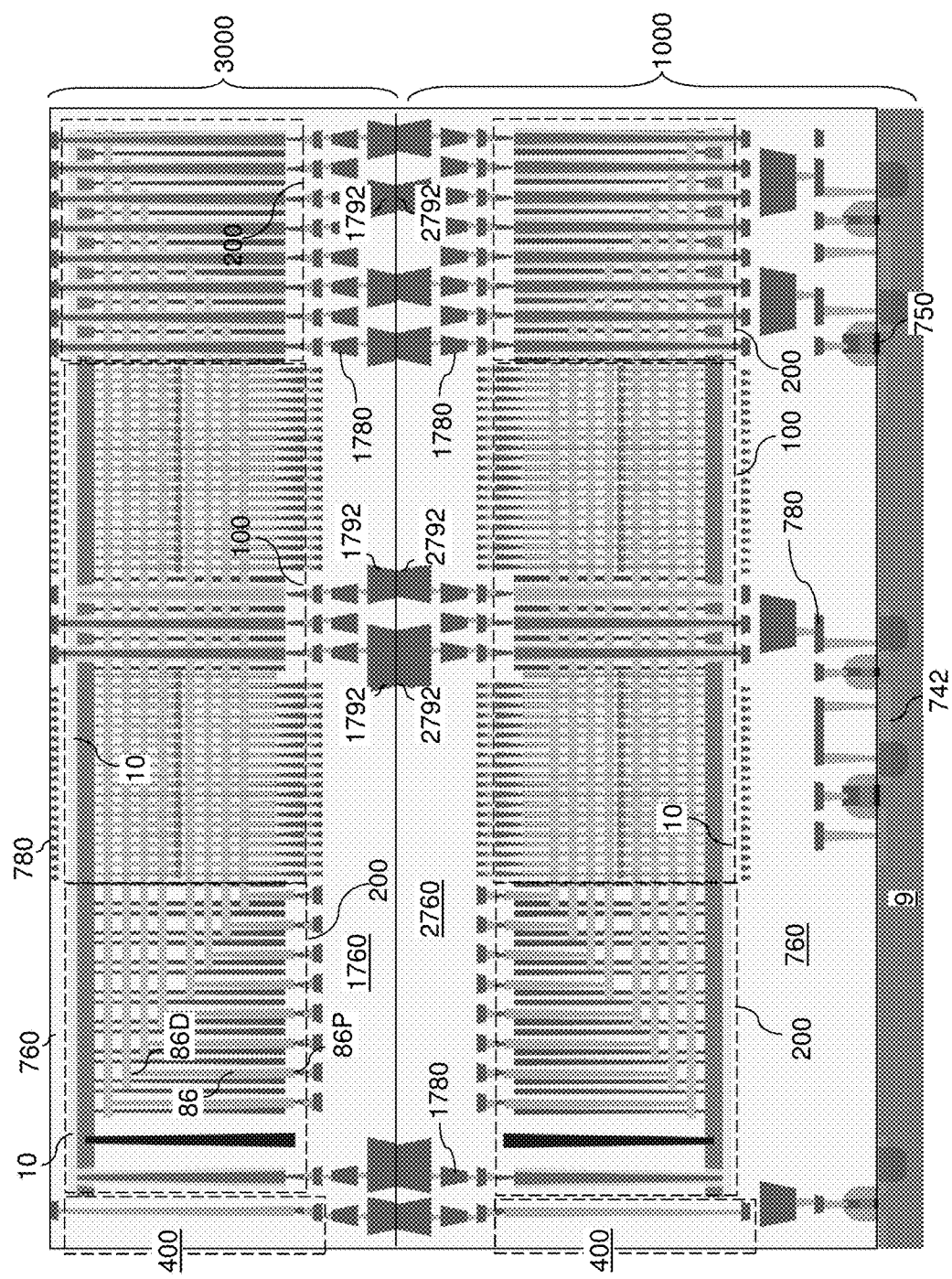
FIG. 28 is a vertical cross-sectional view of an alternative embodiment of the second exemplary bonded assembly according to an embodiment of the present disclosure.

Referring to FIG. 28, an alternative embodiment of the second exemplary bonded assembly can be formed by modifying the memory-only die 3000 illustrated in FIG. 27 to provide memory-side bonding pads 1792 and a memory dielectric material layer 1760 in lieu of the combination of the interconnect dielectric material layer 1860 and the bonding pads 1892 at an upper portion of the memory-only die 3000. The bonding pads 1892 may be subsequently used to bond another die (not illustrated) to the memory-only die 3000. A bottom portion of the memory-only die 3000 can include lower metal interconnect structures 780 included in a lower level dielectric layer 760 as illustrated in FIG. 18. As in the case of the memory-only die 3000, a carrier substrate and a bottom portion of the lower level dielectric layer 760 can be removed to physically expose surfaces of the lower metal interconnect structures 780, which may include bonding pads that can be used to form packaging bond structures such as C4 bonding structures or wire bonding structures for placement of the alternate embodiment of the second exemplary structure into a package such as a ceramic package or a laminated package.

The memory-only die 3000 can be flipped upside down to face the memory and logic die 1000. The memory-only die 3000 and the memory and logic die 1000 can be bonded using copper-to-copper bonding to provide a second exemplary bonded assembly (3000, 1000). The memory-only die 3000 and the memory and logic die 1000 can be positioned such that memory-side bonding pads 1792 face the logic-side bonding pads 2792. Optionally, argon plasma treatment can be performed on the surfaces of the memory-side bonding pads 1792 and the logic-side bonding pads 2792 to clean the surfaces prior to bonding. The memory-side bonding pads 1792 in the memory-only die 3000 can be disposed directly on the logic-side bonding pads 2792 in the memory and logic die 1000. Copper interdiffusion can be induced by annealing the memory-only die 3000 and the memory and logic die 1000 while matching pairs of memory-side bonding pads 1792 and logic-side bonding pads 2792 remain in physical contact. Multiple bonded pairs (1792, 2792) of a respective memory-side bonding pad 1792 and a respective logic-side bonding pad 2792 can be formed at an interface between the memory-only die 3000 and the memory and logic die 1000.

The second exemplary bonded assembly includes a functional three-dimensional memory device located in the memory-only die 3000 that is electrically connected to a peripheral logic device in the logic and logic die 1000. As such, the second exemplary bonded assembly (3000, 1000) is configured to provide control signals from the memory and logic die 1000 to the memory-only die 3000 through the multiple bonded pairs (1792, 2792), and to provide sense signals from the memory-only die 3000 to the memory and logic die 1000 through the multiple bonded pairs (1792, 2792). The multiple bonded pairs (1792, 2792) of a respective memory-side bonding pad 1792 and a respective logic-side bonding pad 2792 can function as bidirectional signal flow channels for control signals and sense signals.

In the configuration illustrated in FIG. 28, the semiconductor material layer 10 in the first die (i.e., the memory-only die 3000) is more distal from the interface between the first die 3000 and the second die (i.e., the memory and logic die 1000) than the two-dimensional array of vertical NAND strings in the first die 3000 is from the interface between the first die 3000 and the second die 1000. The three-dimensional memory device in the first die 3000 comprises word line contact via structures 86 including proximal end surfaces 86P that are proximal to the interface between the first die 3000 and the second die 1000 and distal end surfaces 86D that are distal from the interface between the first die 3000 and the second die 1000. The proximal end surfaces 86P of the word line contact via structures 86 can be located within a same horizontal plane, and can be equidistant from the interface between the first die 3000 and the second die 1000.

Figure 29:
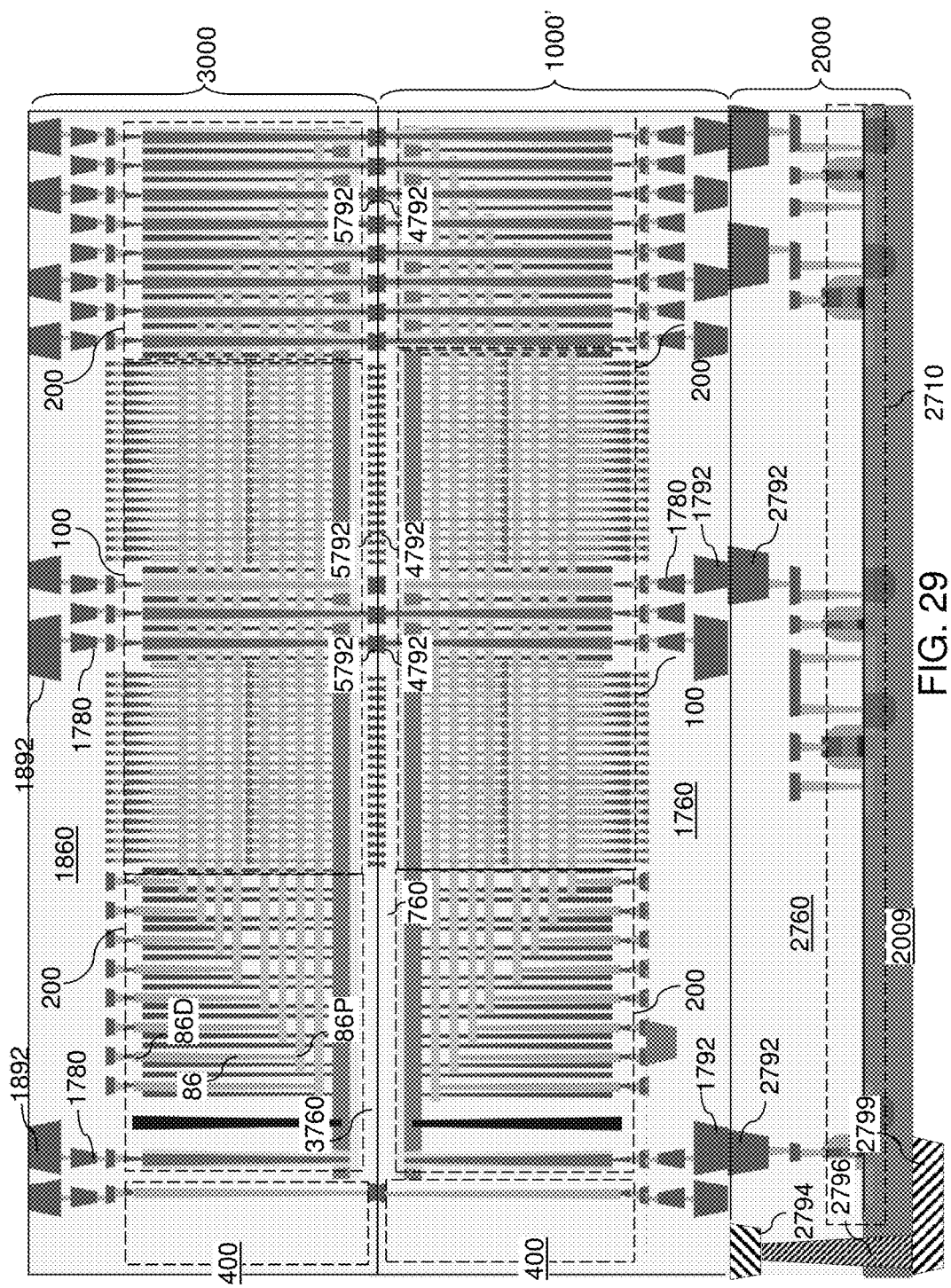
FIG. 29 is a vertical cross-sectional view of a third exemplary bonded assembly of a first die, a second die, and a third die according to an embodiment of the present disclosure.

Referring to FIG. 29, a third exemplary bonded assembly (2000, 1000', 3000) is illustrated. In this case, the lower level dielectric layers 760 in the memory-only die 1000' of FIG. 21 can be modified to embed additional logic-side bonding pads 4792 in lieu of, or in addition to, lower metal interconnect structures 780. The modified memory-only die 1000' is bonded with the logic die 2000 illustrated in FIG. 20 to provide a first exemplary bonded assembly (2000, 1000') illustrated in FIG. 23 with the modification of presence of logic-side bonding pads 4792 in lieu of, or in addition to, lower metal interconnect structures 780.

Specifically, the substrate semiconductor layer 9 in the first exemplary bonded assembly (2000, 1000') of FIG. 23 can be removed to physically expose a bottom surface of the lower level dielectric layers 760. For example, a silicon substrate using a thin hydrogen-implanted layer or sacrificial bonding layer near a top surface may be used as the substrate semiconductor layer 9, and bottom portion of the silicon substrate may be cleaved off during an anneal process before, or after, bonding the memory-only die 1000' and the logic die 2000. A remaining thin layer of silicon and bottom portions of the lower level dielectric layers 760 can be subsequently removed by a planarization process, which can use a wet etch process and/or chemical mechanical planarization. For example, the thin layer of silicon can be etched by a wet etch process using a KOH solution, and the bottom portions of the lower level dielectric layers 760 can be removed by a wet etch using hot phosphoric acid and/or hydrofluoric acid. A touch-up chemical mechanical planarization process can be used to physically expose the bottom surfaces of the logic-side bonding pads 4792 that are present at the level of the lower metal interconnect structures 780. The remaining portions of the lower level dielectric layer 760 functions as a logic dielectric material layer embedding the logic-side bonding pads 4792.

A memory-only die 3000, which is a third die, is provided. The memory-only die 3000 can be the same as the memory-only die 3000 of FIG. 26 within the modification that the memory dielectric material layer 3760 embeds memory-side bonding pads 5792 that are configured to mate with the logic-side bonding pads 4792 located in the memory-only die 1000'.

The first exemplary bonded assembly (2000, 1000') and the memory-only die 3000 can be bonded using copper-to-copper bonding to provide the third exemplary bonded assembly (2000, 1000', 3000). The first exemplary bonded assembly (2000, 1000') and the memory-only die 3000 can be positioned such that memory-side bonding pads 5792 face the logic-side bonding pads 4792. Optionally, argon plasma treatment can be performed on the surfaces of the memory-side bonding pads 5792 and the logic-side bonding pads 4792 to clean the surfaces prior to bonding. The memory-side bonding pads 5792 in the first exemplary bonded assembly (2000, 1000') can be disposed directly on the logic-side bonding pads 4792 in the memory-only die 3000. Copper interdiffusion can be induced by annealing the first exemplary bonded assembly (2000, 1000') and the memory-only die 3000 while matching pairs of memory-side bonding pads 5792 and logic-side bonding pads 4792 remain in physical contact. Multiple bonded pairs (5792, 4792) of a respective memory-side bonding pad 5792 and a respective logic-side bonding pad 4792 can be formed at an interface between the first exemplary bonded assembly (2000, 1000') and the memory-only die 3000. The third exemplary bonded assembly (2000, 1000', 3000) of a first die 1000', a second die 2000, and a third die 3000 includes vertical interconnections provided by a first set of bonded pairs (1792, 2792) of a respective memory-side bonding pad 1792 and a respective logic-side bonding pad 2792 and a second set of bonded pairs (5792, 4792) of a respective memory-side bonding pad 5792 and a respective logic-side bonding pad 4792.

In the structure illustrated in FIG. 29, the memory-only die 1000' is a first die comprising a three-dimensional memory device including a three-dimensional array of memory elements, a first dielectric material layer (i.e., the memory dielectric material layer 1760) overlying (in an upright position), or underlying (in an upside-down position), the three-dimensional array of memory elements, and first bonding pads (i.e., the memory-side bonding pads 1792) included in the first dielectric material layer 1760 and electrically connected to a respective node within the three-dimensional memory device. The logic die 2000 is a second die comprising a semiconductor substrate 2009, a peripheral logic circuitry that includes complementary metal oxide semiconductor (CMOS) devices located on the semiconductor substrate 2009, a second dielectric material layer (i.e., a logic dielectric material layer 2760) overlying (in the upright position), or underlying (in the upside-down position), the CMOS devices, and second bonding pads (i.e., the logic-side bonding pads 2792) included in the second dielectric material layer 2760 and electrically connected to a respective node within the CMOS devices. The first bonding pads 1792 are bonded with the second bonding pads 2792 through copper interdiffusion to provide multiple bonded pairs (1792, 2792) of a respective first bonding pad 1792 and a respective second bonding pad 2792 at an interface between the first die 1000' and the second die 2000. Control signals flow from the second die 2000 to the first die 1000 through the multiple bonded pairs (1792, 2792), and sense signals flow from the first die 1000' to the second die 2000 through the multiple bonded pairs (1792, 2792).

The first die, i.e., the memory-only die 1000', includes third bonding pads, i.e., the logic-side bonding pads 4792, located on an opposite side of the first bonding pads, i.e., the memory-side bonding pads 1792, with respect to the semiconductor material layer 10 in the first die 1000'. The third die, i.e., the memory-only die 3000, includes an additional three-dimensional memory device including a three-dimensional array of additional memory elements and fourth bonding pads, i.e., the memory-side bonding pads 5792, connected to a respective node of the additional three-dimensional memory device. The third bonding pads 4792 are bonded with the fourth bonding pads 5792 through copper interdiffusion to provide additional multiple bonded pairs (4792, 5792) of a respective third bonding pad 4792 and a respective fourth bonding pad 5792 at an interface between the first die 1000' and the third die 3000.

In one embodiment, the three-dimensional array of additional memory elements is located within a two-dimensional array of additional vertical NAND strings in the third die 3000, and each additional vertical NAND string in the array of vertical NAND strings comprises respective charge storage elements controlled by additional word lines and a respective vertical semiconductor channel 60 of which an end portion is connected to one of additional bit lines 98 in the third die 3000. The peripheral logic circuitry containing CMOS devices 710 located on the semiconductor substrate 2009 of the second die 2000 includes a driver circuit for the additional word lines and a driver circuit for the additional bit lines 98 in the third die 3000.

FIGS. 30A-30F are sequential vertical cross-sectional views of an exemplary structure during bonding of two dies according to an embodiment of the present disclosure.

Figures 30A, 30B:
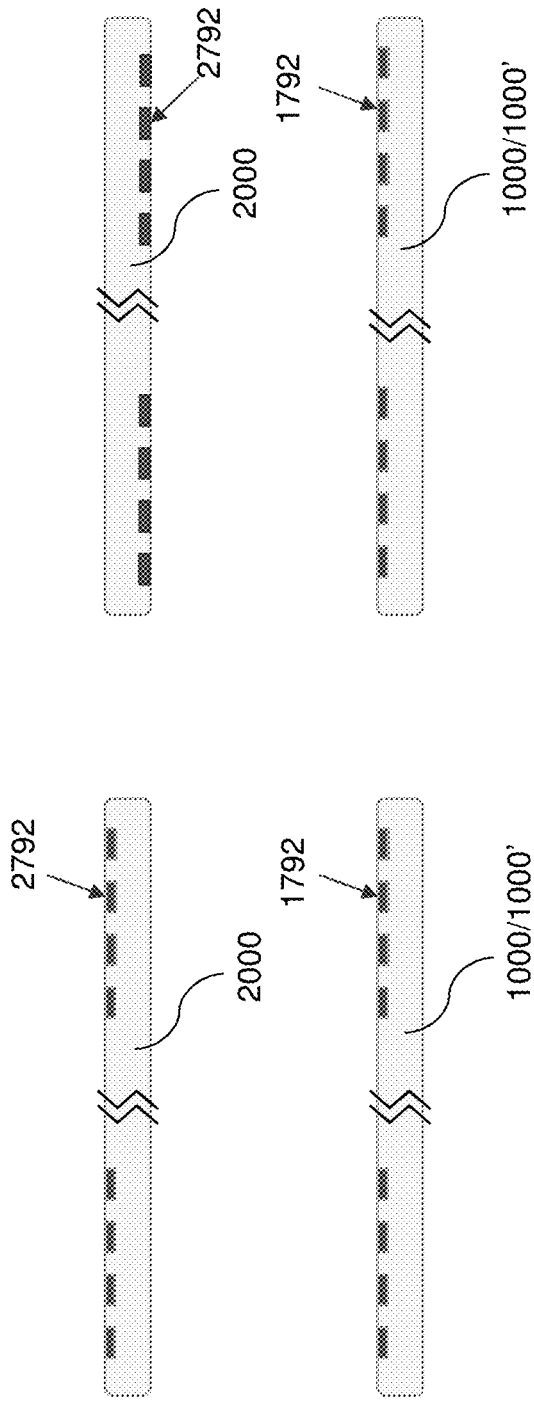

Referring to FIG. 30A, a first die or a first bonded assembly {1000, 1000', 3000, or (2000, 1000')} including first bonding pads 1792, which may be memory-side bonding pads 1792, is provided. A second die or a second bonded assembly (1000, 2000) including second bonding pads 2792, which may be logic-side bonding pads 2792, is provided.

Referring to FIG. 30B, the first die or the first bonded assembly {1000, 1000', 3000, or (2000, 1000')} and the second die or the second bonded assembly (1000, 2000) can be positioned such that memory-side bonding pads 1792 face the logic-side bonding pads 2792.

Figure 30D:
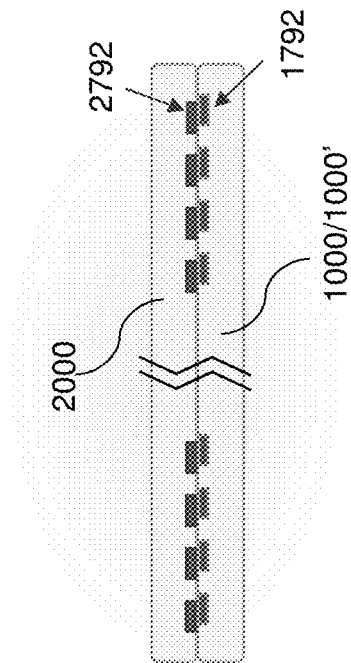
Figure 30C:
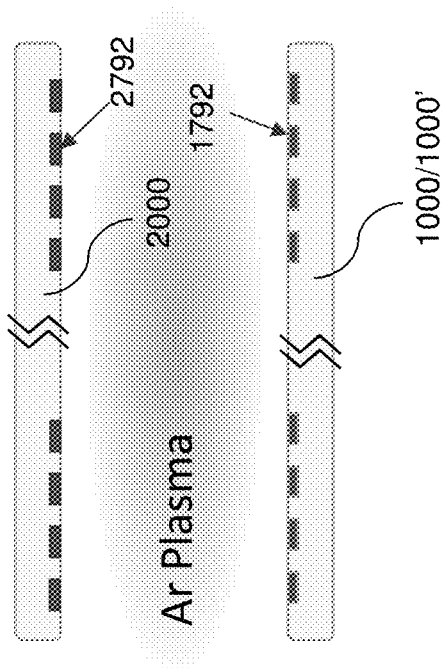

Referring to FIG. 30C, after, or prior to, positioning the first die or the first bonded assembly {1000, 1000', 3000, or (2000, 1000')} and the second die or the second bonded assembly (1000, 2000) to face each other, argon plasma treatment can be performed on the surfaces of the memory-side bonding pads 1792 and the logic-side bonding pads 2792 to clean the physically exposed surfaces of the memory-side bonding pads 1792 and the logic-side bonding pads 2792.

Referring to FIG. 30D, the memory-side bonding pads 1792 in the first die or the first bonded assembly {1000, 1000', 3000, or (2000, 1000')) can be disposed directly on the logic-side bonding pads 2792 in the second die or the second bonded assembly (2000, 3000). Copper interdiffusion can be induced by annealing the memory-only die 1000' or the memory and logic die 1000 in contact with the logic die 2000 while matching pairs of memory-side bonding pads 1792 and logic-side bonding pads 2792 remain in physical contact. The temperature of the thermal anneal can be in a range from 250 degrees Celsius to 400 degrees Celsius, although lower and higher temperatures can also be used. Multiple bonded pairs (1792, 2792) of a respective memory-side bonding pad 1792 and a respective logic-side bonding pad 2792 can be formed at an interface between the first die or the first bonded assembly {1000, 1000', 3000, or (2000, 1000')) and the second die or the second bonded assembly (2000, 3000).

Referring to FIG. 30E, one or both of the first die or the first bonded assembly {1000, 1000', 3000, or (2000, 1000')) and the second die or the second bonded assembly (1000, 2000) can be thinned as needed.

Referring to FIG. 30F, the processing steps of FIG. 23 or FIG. 25 can be performed to form through-substrate via structures 2796 and bonding pads 2799, which may include C4 bonding structures or wire bonding structures for placement of the second exemplary structure into a package such as a ceramic package or a laminated package. Thus, the bonded assembly formed by the processing steps of FIGS. 30A-30F can be packaged within a single semiconductor package including a single set of lead frames using C4 bonding methods or wire bonding methods.

FIGS. 31A-31D illustrate various configurations of areal overlap in a bonded assembly of a first die or a first bonded assembly {1000, 1000', 3000, or (2000, 1000')) and a second die or a second bonded assembly (1000, 2000) according to various embodiments of the present disclosure. The first die or the first bonded assembly {1000, 1000', 3000, or (2000, 1000')) and the second die or the second bonded assembly (1000, 2000) may have substantially the same areas as illustrated in FIG. 31A, or may have different areas as illustrated in FIG. 31B. A single first die or a single first bonded assembly {1000, 1000', 3000, or (2000, 1000')) can be bonded to a single second die or a single second bonded assembly (1000, 2000) as illustrated in FIG. 31A or FIG. 31B. Alternatively, a single first die or a single first bonded assembly {1000, 1000', 3000, or (2000, 1000')) can be bonded to multiple second dies or multiple second bonded assemblies (2000, 3000) as illustrated in FIG. 31C. Yet alternatively, multiple first dies or multiple first bonded assemblies {1000, 1000', 3000, or (2000, 1000')) can be bonded to a single second die or a single second bonded assembly (1000, 2000) as illustrated in FIG. 31D.

In an alternative embodiment, a separate bonding layer or direct die to die contact can be used instead of the bonding pad bonding to bond the dies into die assembly. Thus, the embodiment of the present disclosure are not limited to bonding pad to bonding pad diffusion bonding.

According to various embodiments of the present disclosure and referring to all drawings of the present disclosure, a semiconductor structure is provided, which comprises: a first die (1000, 1000', 3000) comprising a three-dimensional memory device including a three-dimensional array of memory elements, a first dielectric material layer (1760, 3760) overlying, or underlying, the three-dimensional array of memory elements, and first bonding pads 1792 included in the first dielectric material layer and electrically connected to a respective node within the three-dimensional memory device; and a second die 2000 comprising a semiconductor substrate 2009, a peripheral logic circuitry that includes complementary metal oxide semiconductor (CMOS) devices located on the semiconductor substrate 2009, a second dielectric material layer 2760 overlying, or underlying, the CMOS devices 2710, and second bonding pads 2792 included in the second dielectric material layer 2760 and electrically connected to a respective node within the CMOS devices.

The first bonding pads 1792 are bonded with the second bonding pads 2792 through copper interdiffusion to provide multiple bonded pairs (1792, 2792) of a respective first bonding pad 1792 and a respective second bonding pad 2792 at an interface between the first die (1000, 1000', 3000) and the second die 2000. Control signals flow from the second die 2000 to the first die (1000, 1000', 3000) through the multiple bonded pairs (1792, 2792). Sense signals flow from the first die (1000, 1000', 3000) to the second die 2000 through the multiple bonded pairs (1792, 2792).

In one embodiment, the three-dimensional memory device comprises word lines comprising the electrically conductive layers (146, 246) and bit lines 98 for individually accessing the memory elements within the three-dimensional array of memory elements. The CMOS devices 710 comprise word line drivers that drive a respective one of the word lines, bit line drivers that drive a respective one of the bit lines 98, and a sense amplifier circuitry electrically connected to the bit lines 98 and configured to read a state of selected memory elements within the three-dimensional array of memory elements.

The semiconductor structure can further include: a through-substrate via structure 2796 extending through the semiconductor substrate 2009 and the second dielectric material layer 2009 of the second die 2000; a through-substrate via contact pad 2794 included in the second dielectric material layer 2760, contacting the through-substrate via structure 2796, and having a horizontal surface within a plane of the interface between the first die (1000, 1000', 3000) and the second die 2000; and a bonding pad 2799 located on the semiconductor substrate 2009 and contacting the through-substrate via structure 2796.

According to an aspect of the present disclosure, a method of forming a bonded assembly of a three-dimensional memory device is provided. A memory-containing die (1000 or 1000') including a three-dimensional array of memory elements is provided as described above. A memory dielectric material layer 1760 is formed on a first side of the three-dimensional array of memory elements, which may comprise portions of charge storage layers 54 located at the levels of the electrically conductive layers (146, 246). Memory-side bonding pads 1792 are included in the memory dielectric material layer 1760, and are electrically connected to a respective node within the three-dimensional memory device.

A logic die 2000 is provided, which includes a peripheral circuitry (comprising a subset of the CMOS devices 2710) configured to control operation of the three-dimensional array of memory elements, logic dielectric material layers 2760 located on a first side of the peripheral circuitry, and logic-side bonding pads 2792 included in the logic dielectric material layers 2760 and electrically connected to a respective node of the peripheral circuitry.

Figure 32:
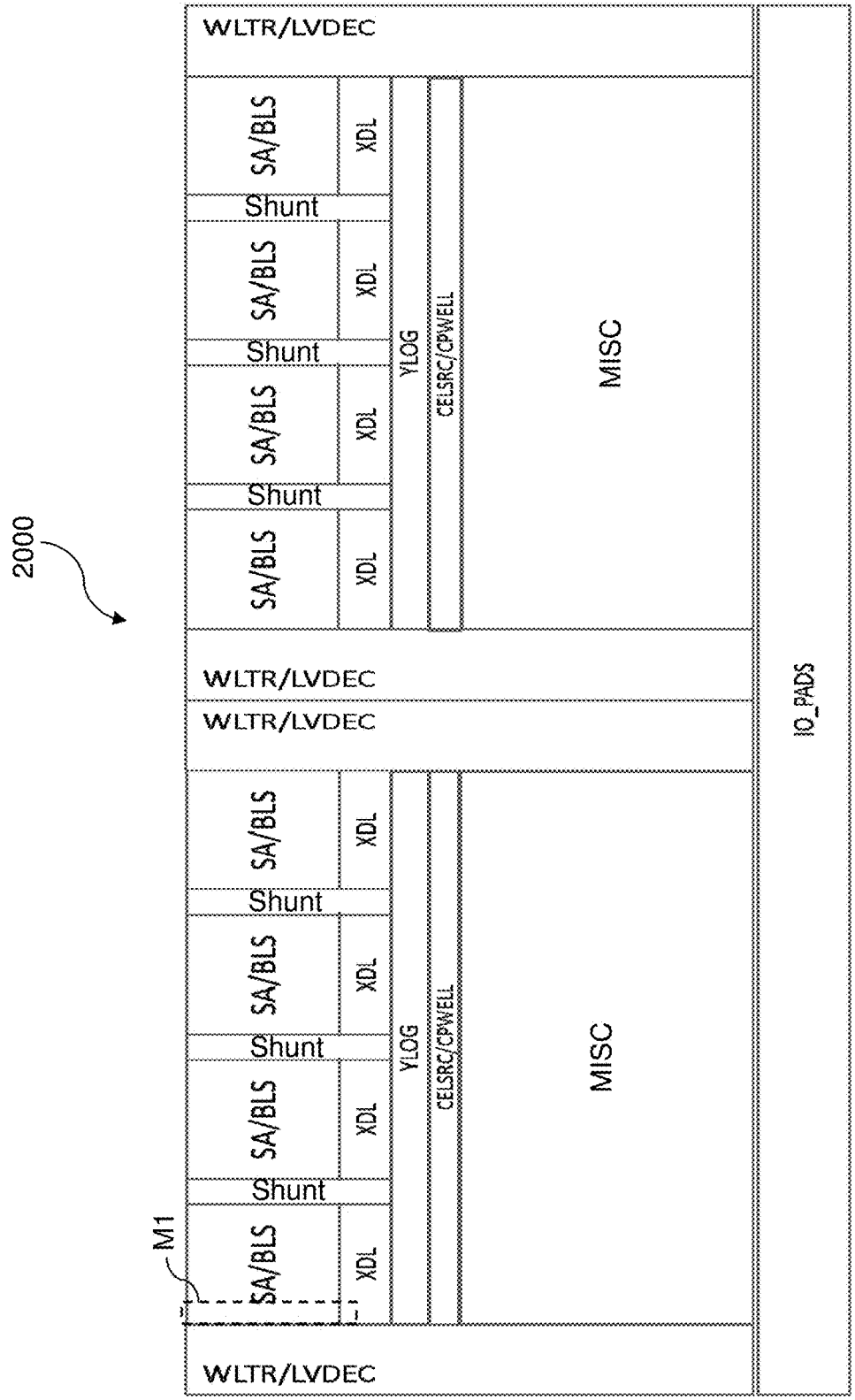
FIG. 32 is a layout of a logic die that can be used as one of bonded dies in a bonded assembly according to an embodiment of the present disclosure.
Figure 33:
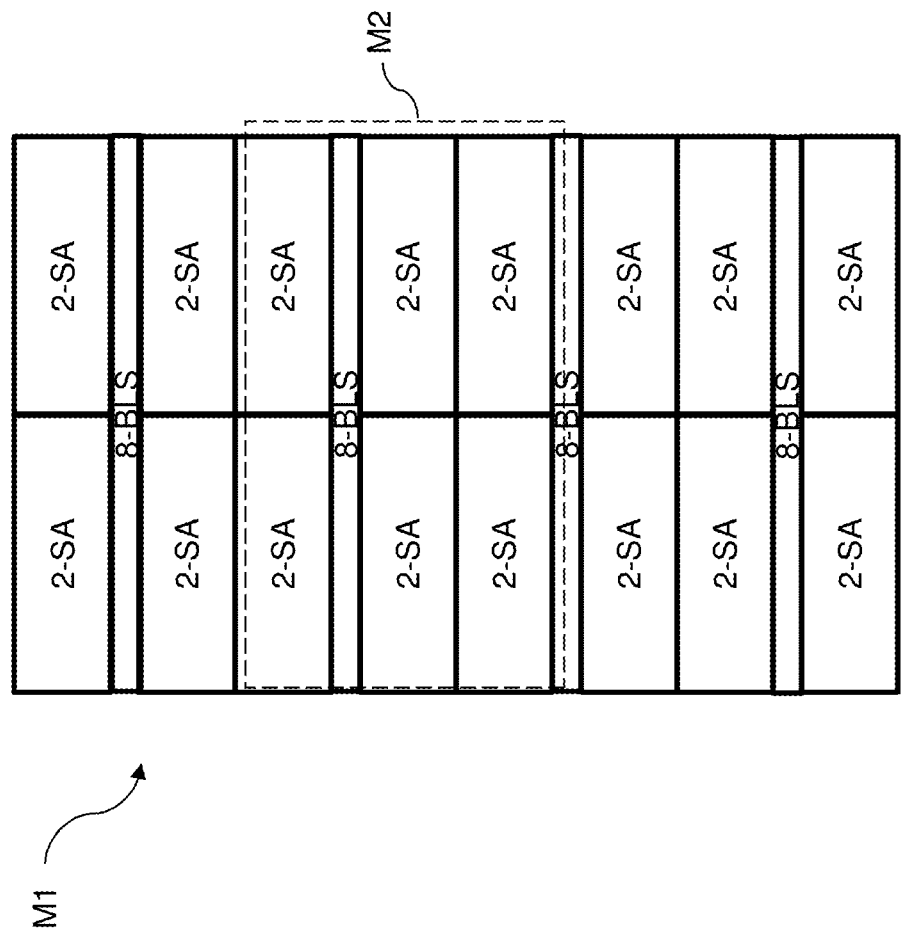
FIG. 33 is a layout of a first magnified region M1 within the logic die of FIG. 32.

Referring to FIGS. 32 and 33, an exemplary layout of a logic die 2000 is illustrated. The logic die 2000 can be used as one of bonded dies in a bonded assembly {(1000', 2000) or (1000, 2000)} of various embodiments of the present disclosure.

Referring to FIG. 32, the peripheral circuitry of the logic die 2000 can include sense amplifier and bit line driver circuits located in areas labeled with "SA/BLS," word line driver circuits located in areas labeled with "XDL," column direction logic control circuits located in areas labeled with "YLOG," source power supply circuits (e.g., source line bias voltage supply circuits) and well (e.g., p-well in which the source, drain and channel regions of peripheral circuitry transistors are located) bias voltage supply circuits located in areas labeled with "CELSRC/CPWELL," electrical connections from the source power supply circuits located between SA/BLS in areas labeled with 'Shunt," word line decoder circuits (e.g., word line control transistors and low voltage decoders) located in areas labeled with "WLTR/LVDEC," input/output control circuits located in areas labeled with "IO_PADS," and other miscellaneous circuits located in areas labeled with "MISC." Bonding pads 2799 can be located within the areas of the input/output control circuits on the backside of the semiconductor substrate 2009 as illustrated in FIG. 29.

FIG. 33 is a layout of a first magnified region M1 within the logic die 2000 of FIG. 32. Each sense amplifier and bit line driver circuit includes sense amplifiers and bit line drivers located in different areas. In one embodiment, the sense amplifiers can be interlaced with bit line drivers along a horizontal direction within the logic die 2000. In an illustrative layout, a pair of sense amplifiers configured be connected to a pair of bit lines 98 in a memory-containing die (1000 or 1000') can be located within each area labeled with "2-SA," and a set of 8 bit line drivers can be located within each area labeled with "8-BLS." A unit cell including a set of four pairs of sense amplifiers and a set of eight bit line drivers can be repeated along a horizontal direction within each sense amplifier and bit line driver circuit.

According to an aspect of the present disclosure, the laterally-elongated contact via structures 76 (illustrated, for example, in FIG. 18) in the memory-containing die (1000 or 1000') can be used as components of a source line that distributes a source power supply voltage across the memory-containing die (1000 or 1000'). A subset of the memory-side metal interconnect structures 1780 located in the memory dielectric material layer 1760 and a subset of the memory-side bonding pads 1792 can be used to provide electrical connections within the memory-containing die (1000 or 1000') that distributes the source power supply voltage across the memory-containing die (1000 or 1000').

Figure 34:
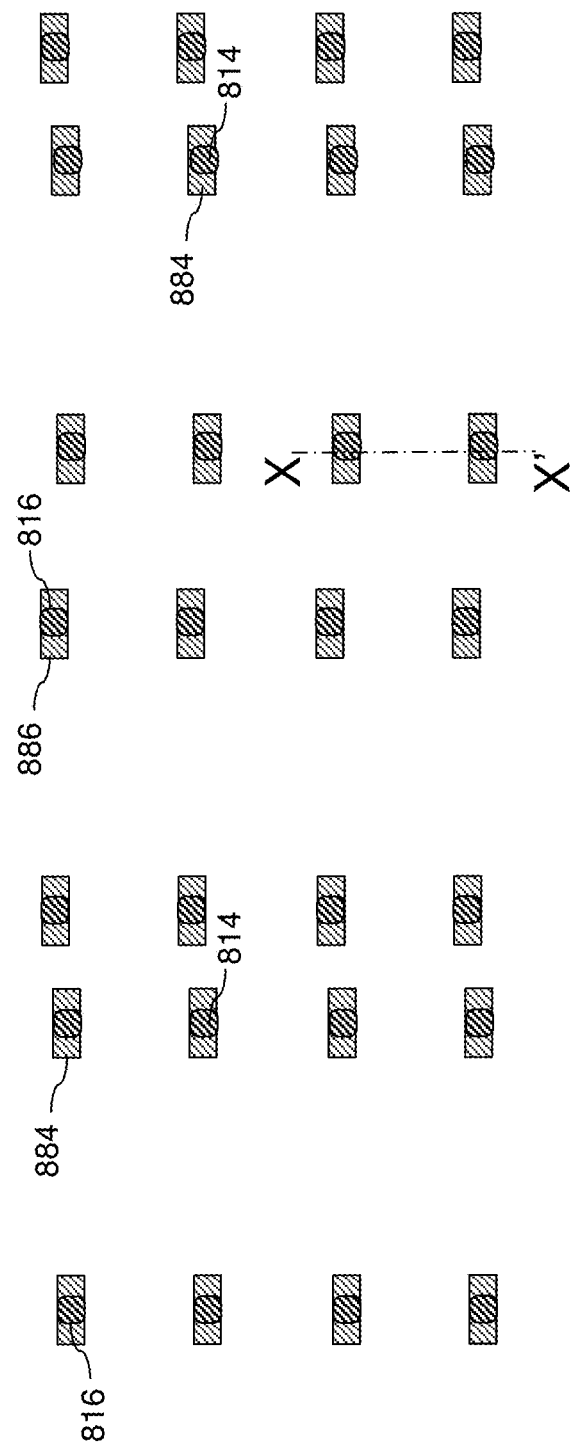
FIG. 34 is a first exemplary layout of a second magnified region M2 within the first magnified region M1 of FIG. 33 at a first metal line level and a first metal via level according to an embodiment of the present disclosure.
Figure 35:
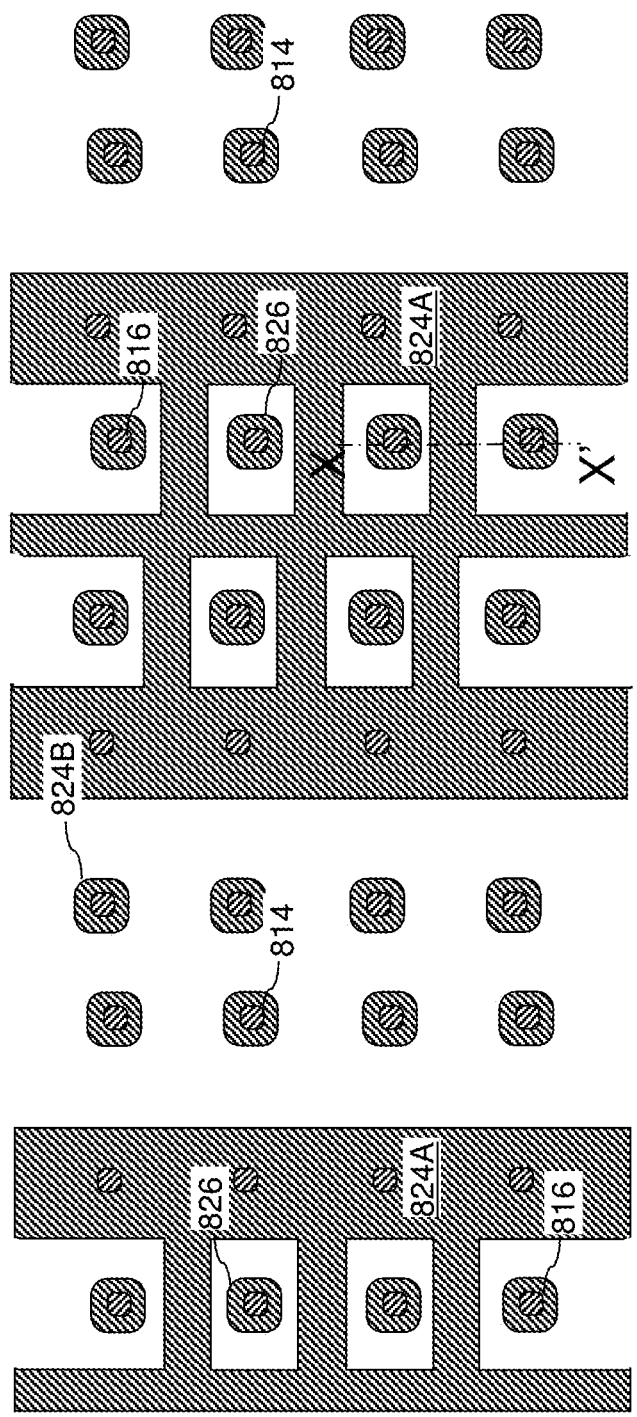
FIG. 35 is the first exemplary layout of the second magnified region M2 at the first metal via level and at a second metal line level according to an embodiment of the present disclosure.
Figure 36:
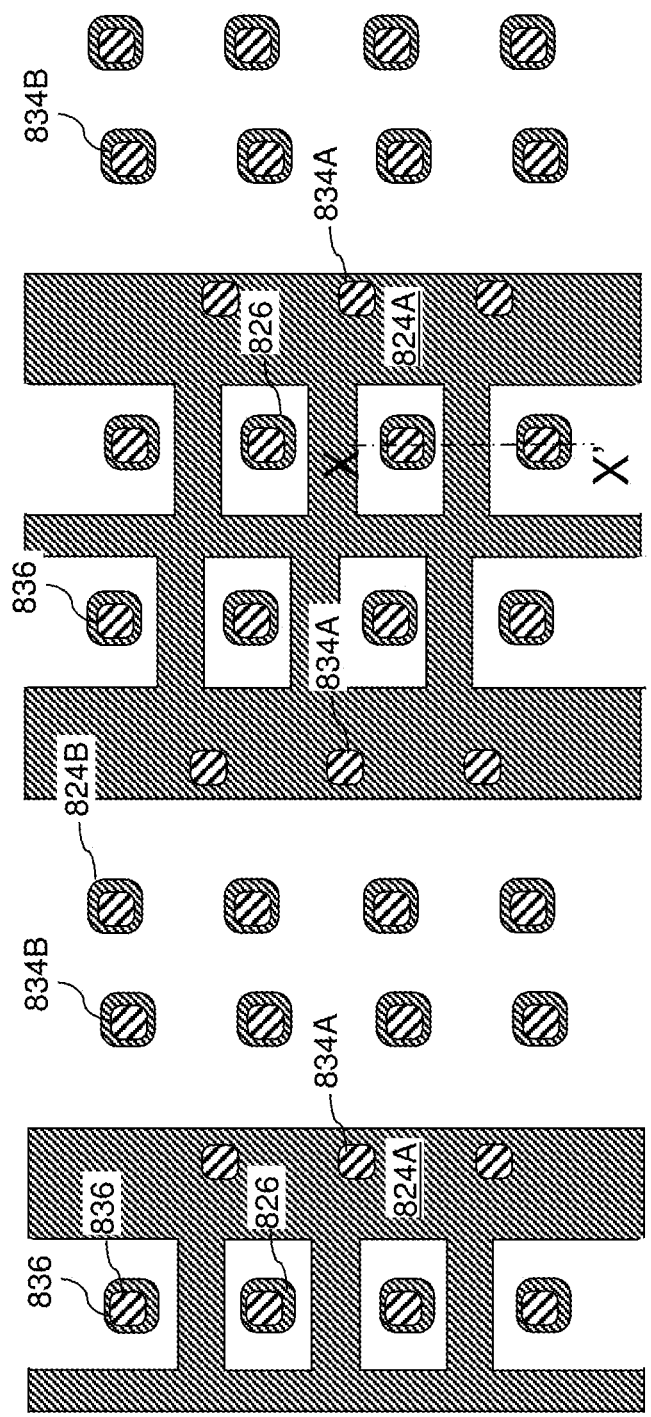
FIG. 36 is the first exemplary layout of the second magnified region M2 at the second metal line level and at a pad connection level according to an embodiment of the present disclosure.
Figure 37:
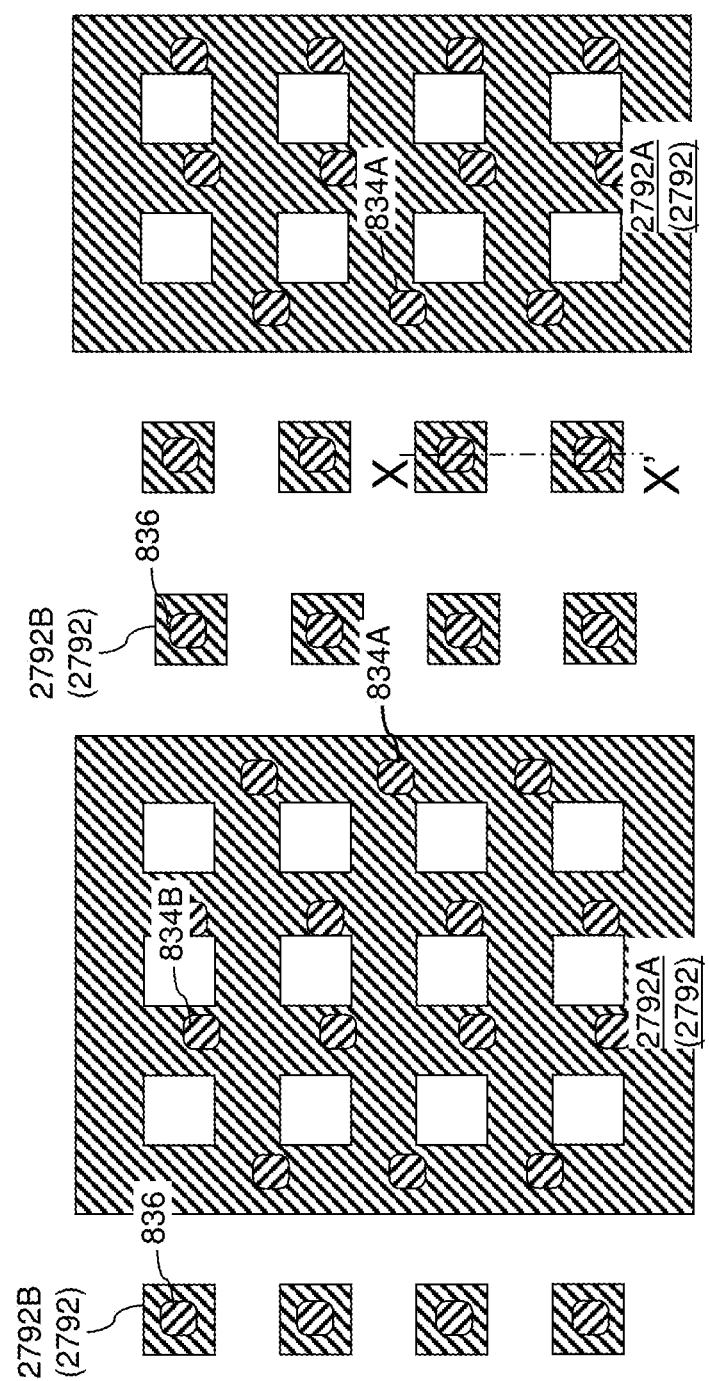
FIG. 37 is the first exemplary layout of the second magnified region M2 at the pad connection level and at a metal pad level according to an embodiment of the present disclosure.
Figure 38:
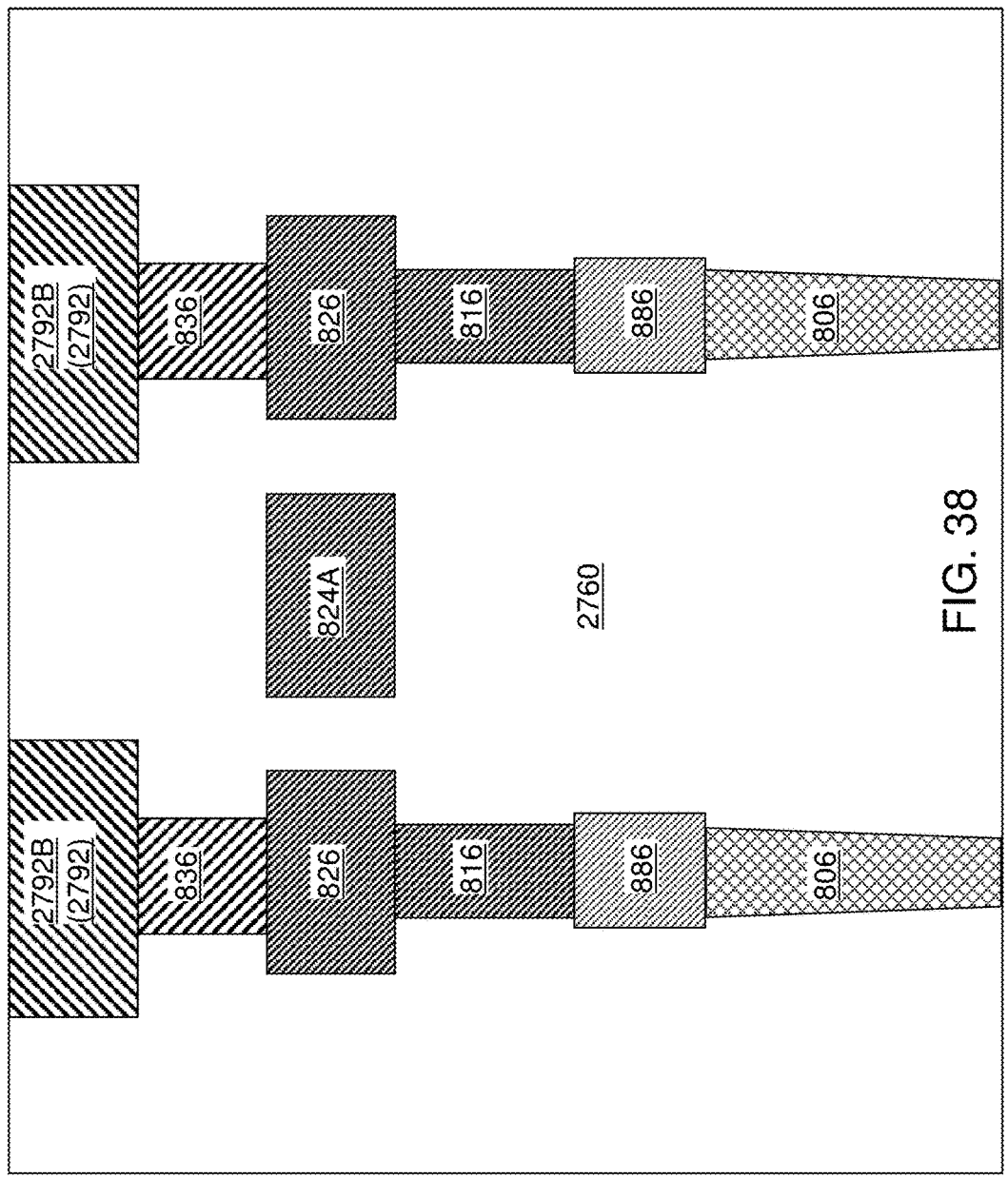
FIG. 38 is a vertical cross-sectional view along the vertical cross-sectional plane X-X' of FIGS. 34, 35, 36, and 37 of the second magnified region M2 according to an embodiment of the present disclosure.
Figure 39:
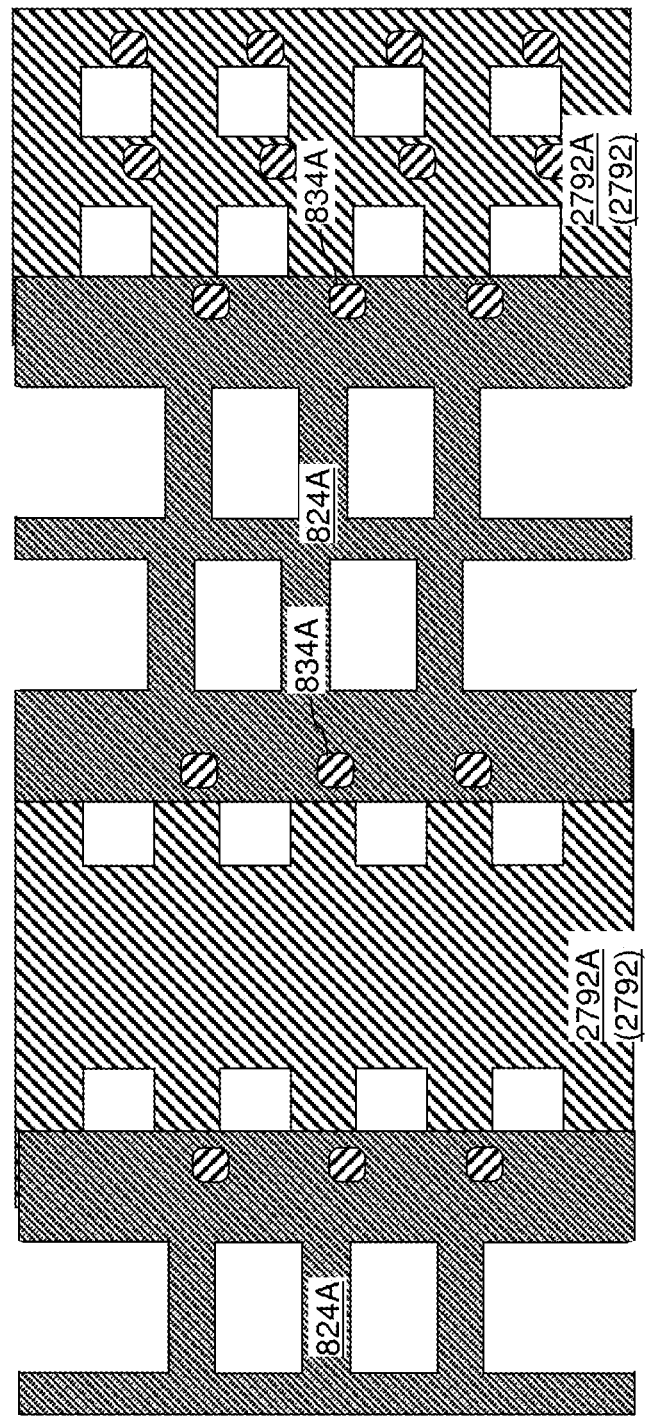
FIG. 39 is a plan view of components of a source power distribution network at the levels of the second metal line level, the pad connection level, and the metal pad level within the second magnified region M2 according to an embodiment of the present disclosure.

Referring to FIGS. 34-39, a first exemplary configuration of a second magnified region M2 within the first magnified region M1 of FIG. 33 is illustrated. FIG. 34 illustrates the overlay between first metal line structures (884, 886) located at a first metal line level and first metal via structures (814, 816) located at a first metal via level that overlies the first metal line level. FIG. 35 illustrates the overlay between the first metal via structures (814, 816) located at the first metal via level and second metal line structures (824A, 824B, 826) located at a second metal line level that overlies the first metal line level. FIG. 36 illustrates the overlay between the second metal line structures (824A, 824B, 826) located at the second metal line level and pad-connection-level via structures (834A, 834B, 836) located at a pad connection level that overlies the second metal line level. FIG. 37 illustrates the overlay between the pad-connection-level via structures (834A, 834B, 836) located at the pad connection level and logic-side bonding pads 2792 located at a metal pad level that overlies the pad connection level. FIG. 38 is a vertical cross-sectional view along the vertical cross-sectional plane X-X' of FIGS. 34, 35, 36, and 37 of the second magnified region M2. FIG. 39 is a composite view illustrating a subset of metal interconnect structures in the second metal line level, the pad connection level, and the metal pad level.

Each of the first metal line structures (884, 886), the first metal via structures (814, 816), the second metal line structures (824A, 824B, 826), the pad-connection-level via structures (834A, 834B, 836), and the logic-side bonding pads 2792 can be included in the logic dielectric material layer 2760, which can include a stack of multiple dielectric material sublayers that are component layers of the logic dielectric material layer 2760.

The first metal line structures (884, 886) located at the first metal line level include first source-connection metal line structures 884 that are electrically connected to output nodes of the source power supply circuit in the peripheral circuitry of the logic die 2000, and first bit-line-connection metal line structures 886 that are electrically connected to nodes of a sense amplifier and bit line driver circuit, for example, through bit-line-connection contact via structures 806. The bit-line-connection contact via structures 806 can be electrically connected to gate electrodes, source regions, or drain regions of complementary metal oxide semiconductor (CMOS) transistors in a respective sense amplifier and bit line driver circuit.

The first metal via structures (814, 816) located at the first metal via level include first source-connection metal via structures 814 that contact a top surface of a respective one of the first source-connection metal line structures 884, and first bit-line-connection metal via structures 816 that contact a top surface of a respective one of the first bit-line-connection metal line structures 886.

The second metal line structures (824A, 824B, 826) located at a second metal line level include line-level mesh structures 824A that may optionally contact a top surface of a respective subset of the first source-connection metal via structures 814, isolated source-connection line-level structures 824B that contact a respective one of the first source-connection metal via structures 814, and second bit-line-connection metal line structures 826 that contact a top surface of a respective one of the bit-line-connection metal via structures 816. As used herein, a "mesh structure" refers to a structure having a general shape of a mesh in which at least two sets of laterally-extending segments that extend along different lateral directions are intertwined to provide a network including a plurality of openings therein. The line-level mesh structures 824A and subsets of the isolated source-connection line-level structures 824B may alternate along a horizontal direction of alternation of the sense amplifiers and sets of bit line drivers. In one embodiment, each line-level mesh structures 824A may contact a plurality of first source-connection metal via structures 814.

The pad-connection-level via structures (834A, 834B, 836) located at the pad connection level include mesh-interconnection via structures 834A that contact a top surface of a respective one of the line-level mesh structures 824A, second source-connection metal via structures 834B that contact a top surface of a respective one of the isolated source-connection line-level structures 824B, and second bit-line-connection metal via structures 836 that contact a top surface of a respective one of the second bit-line-connection metal line structures 826.

The logic-side bonding pads 2792 can include at least one pad-level mesh structure 2792A electrically connected to a source power supply circuit within the peripheral circuitry through a respective set of at least one second source-connection metal via structure 834B. Each pad-level mesh structure 2792A can be connected to a pair of line-level mesh structures 824A through a respective set of mesh-interconnection via structures 834A. Thus, each pad-level mesh structure 2792A can contact top surfaces of a subset of the mesh-interconnection via structures 834A and a subset of the second source-connection metal via structures 834B. Each of the at least one pad-level mesh structure 2792A may include an array of discrete openings therethrough. Further, the logic-side bonding pads 2792 can comprise discrete logic-side bonding pads 2792B electrically isolated one from another and from the at least one pad-level mesh structure 2792A. The discrete logic-side bonding pads 2792B can contact a top surface of a respective one of the second bit-line-connection metal line structures 826.

A memory-containing die (1000, 1000') described above can be provided with memory-side bonding pads 1792. The memory-side bonding pads 1792 can be arranged such that each of the memory-side bonding pads 1792 can bond with a respective one of the at least one pad-level mesh structure 2792A and the discrete logic-side bonding pads 2792B. The at least one pad-level mesh structure 2792A can be provided as a plurality of pad-level mesh structures 2792A that are laterally spaced apart by groups of discrete logic-side bonding pads 2792B. The logic-side bonding pads 2792 can be bonded to a respective one, or a respective subset, of the memory-side bonding pads 1792 using any of the methods described above. In one embodiment, each of the discrete logic-side bonding pads 2792B can be bonded to a respective one of the memory-side bonding pads 1792, and each of the at least one pad-level mesh structure 2792A can be bonded to a respective plurality of memory-side bonding pads 1792 that are electrically connected to the laterally-elongated contact via structure 76 that are configured to distribute the source power supply voltage that is provided by the source power supply circuits in the peripheral circuitry of the logic die 2000.

The line-level mesh structures 824A can be included within the logic dielectric material layers 2760, and can include a plurality of openings therethrough. A subset of the pad-connection-level via structures (834A, 834B, 836), such as the mesh-interconnection via structures 834A, can contact a respective one of the at least one pad-level mesh structure 2792A and a respective one of the line-level mesh structures 824A. Another subset of the pad-connection-level via structures (834A, 834B, 836) such as the second bit-line-connection metal via structures 836 can contact a respective one of the discrete logic-side bonding pads 2792B, and can be located at a same level as the mesh-interconnection via structures 834A. A plurality of the second bit-line-connection metal via structures 836 can be located between a neighboring pair of the line-level mesh structures 824A. In one embodiment, a plurality of pad-level mesh structures 2792A can contact a respective subset of the pad-connection-level via structures (834A, 834B, 836), which can include a respective subset of the mesh-interconnection via structures 834A and a respective subset of the second source-connection metal via structures 834B. Each of the plurality of pad-level mesh structures 2792A can be electrically connected to each of the line-level mesh structures 824A to provide a source power distribution network within the logic die 2000 that spans the entire area of a memory array region within the memory-containing die (1000, 1000') that is bonded to the logic die 2000.

Figure 40:
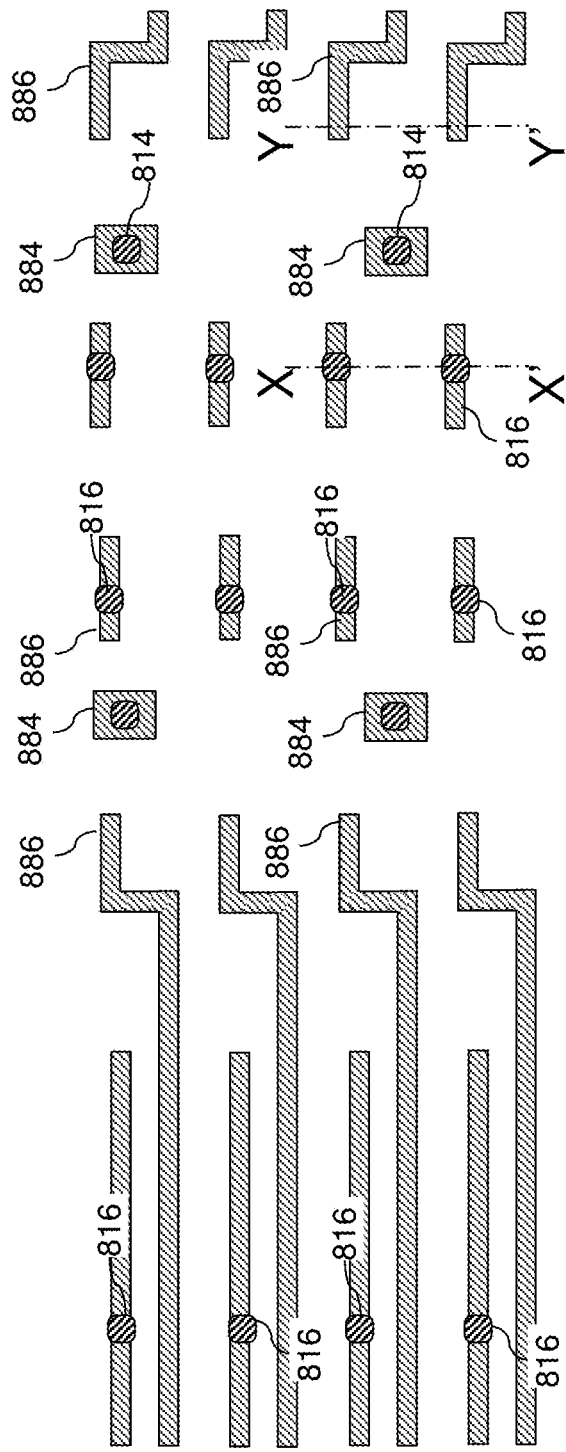
FIG. 40 is a second exemplary layout of the second magnified region M2 within the first magnified region M1 of FIG. 33 at a first metal line level and a first metal via level according to an embodiment of the present disclosure.
Figure 41:
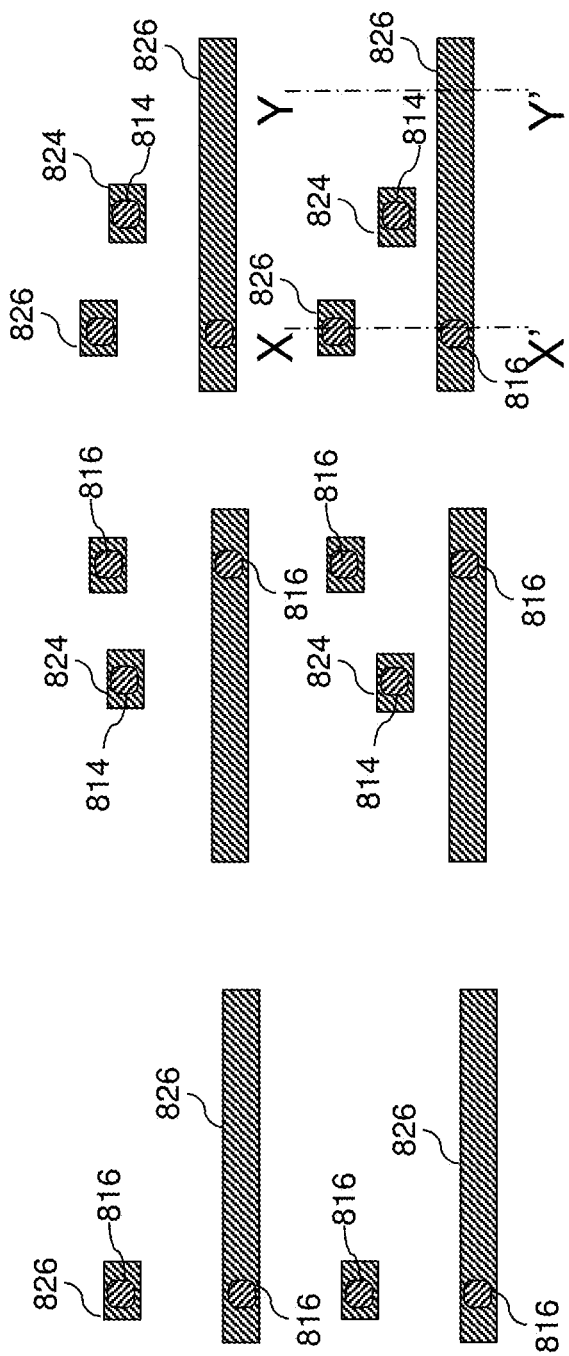
FIG. 41 is the second exemplary layout of the second magnified region M2 at the first metal via level and at a second metal line level according to an embodiment of the present disclosure.
Figure 42:
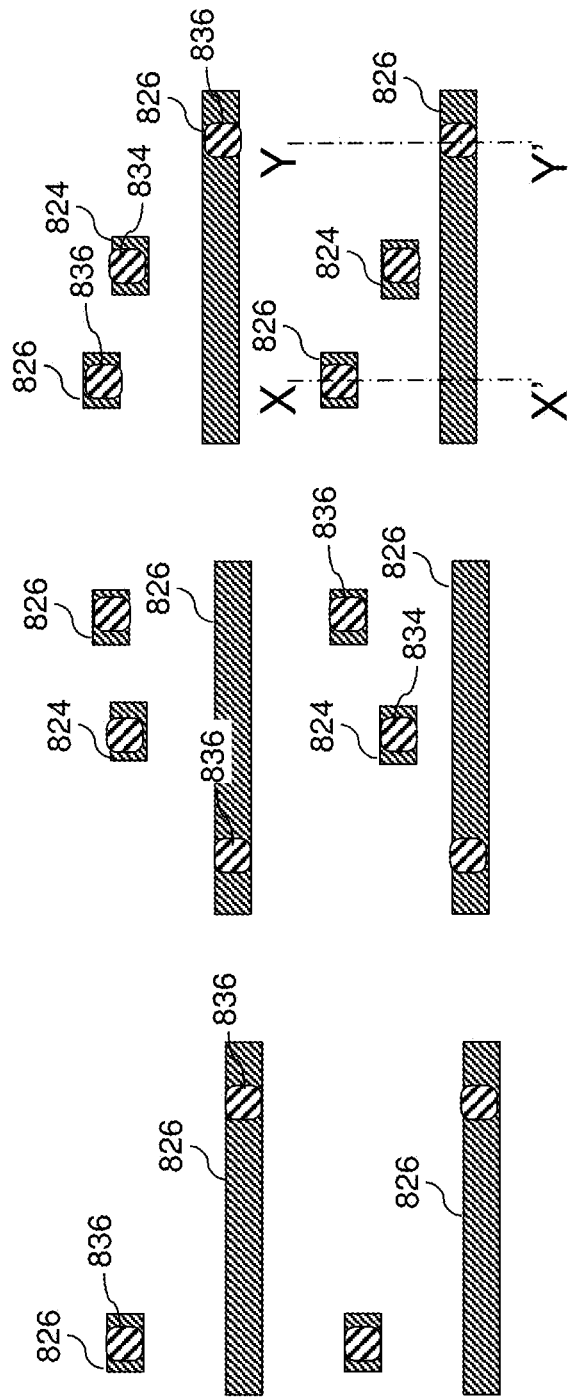
FIG. 42 is the second exemplary layout of the second magnified region M2 at the second metal line level and at a pad connection level according to an embodiment of the present disclosure.
Figure 43:
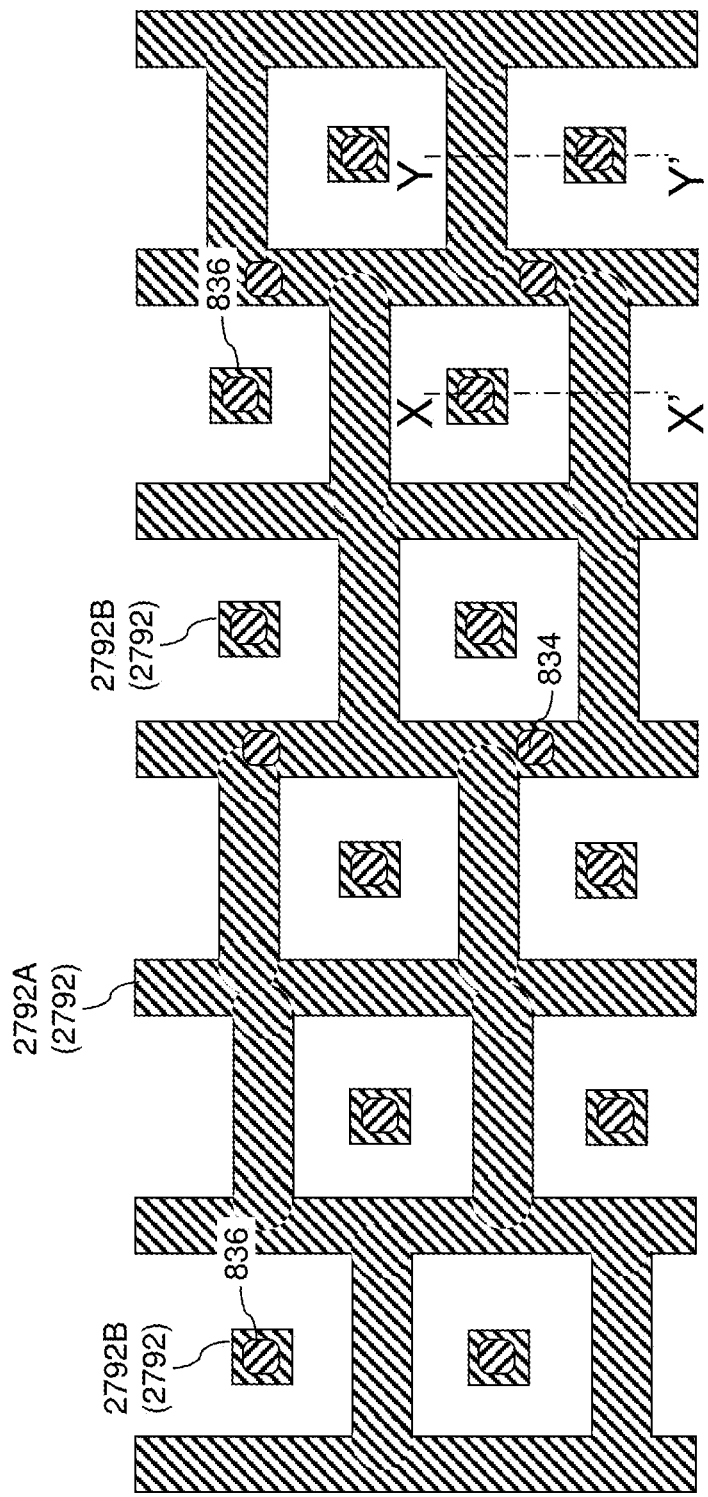
FIG. 43 is the second exemplary layout of the second magnified region M2 at the pad connection level and at a metal pad level according to an embodiment of the present disclosure.
Figure 44:
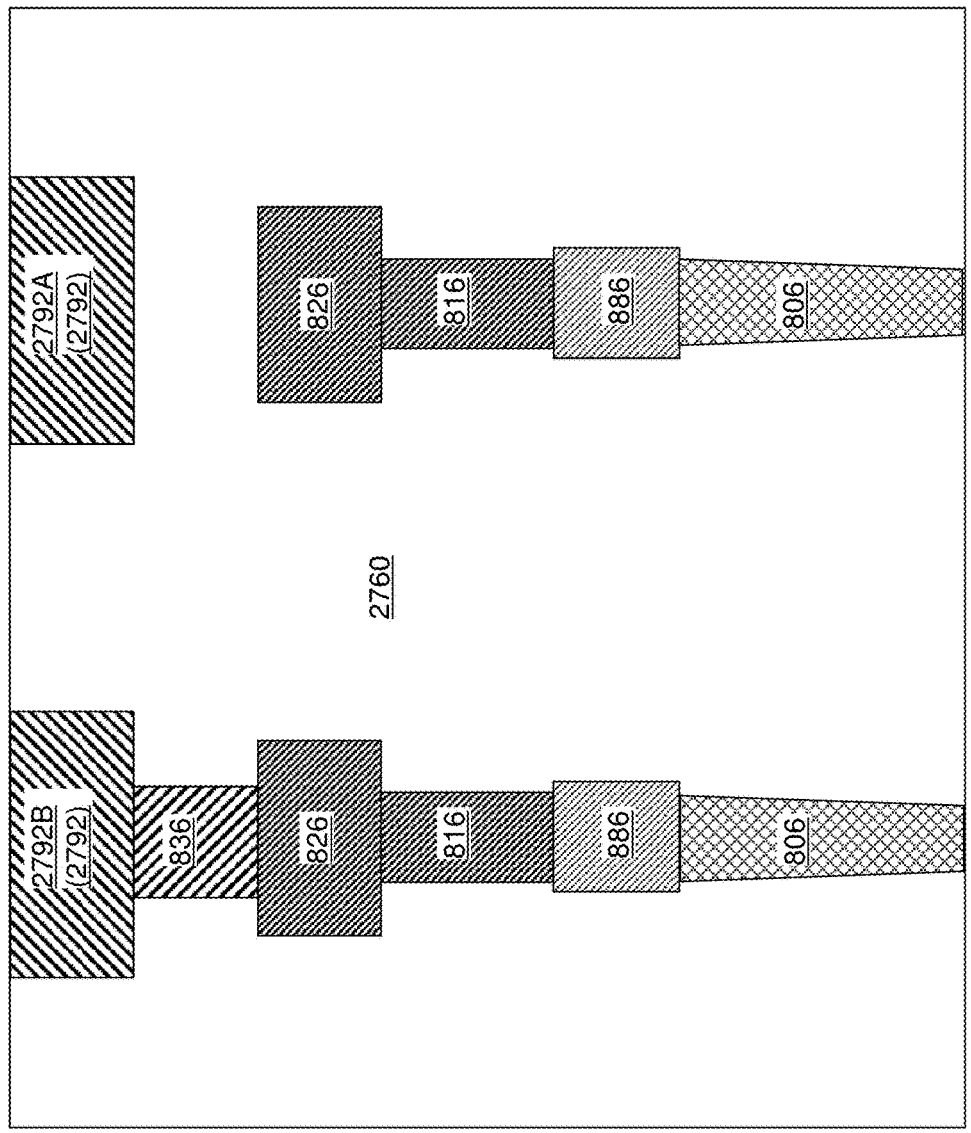
FIG. 44 is a vertical cross-sectional view along the vertical cross-sectional plane X-X' of FIGS. 40, 41, 42, and 43 of the second magnified region M2 according to an embodiment of the present disclosure.

Referring to FIGS. 40-45, a second exemplary configuration of a second magnified region M2 within the first magnified region M1 of FIG. 33 is illustrated. FIG. 40 illustrates the overlay between first metal line structures (884, 886) located at a first metal line level and first metal via structures (814, 816) located at a first metal via level that overlies the first metal line level. FIG. 41 illustrates the overlay between the first metal via structures (814, 816) located at the first metal via level and second metal line structures (824, 826) located at a second metal line level that overlies the first metal via level. FIG. 42 illustrates the overlay between the second metal line structures (824, 826) located at the second metal line level and pad-connection-level via structures (834, 836) located at a pad connection level that overlies the second metal line level. FIG. 43 illustrates the overlay between the pad-connection-level via structures (834, 836) located at the pad connection level and logic-side bonding pads 2792 located at a metal pad level that overlies the pad connection level. FIG. 44 is a vertical cross-sectional view along the vertical cross-sectional plane X-X' of FIGS. 40, 41, 42, and 43 of the second magnified region M2. FIG. 45 is a vertical cross-sectional view along the vertical cross-sectional plane Y-Y' of FIGS. 40, 41, 42, and 43 of the second magnified region M2.

Each of the first metal line structures (884, 886), the first metal via structures (814, 816), the second metal line structures (824, 826), the pad-connection-level via structures (834, 836), and the logic-side bonding pads 2792 can be included in the logic dielectric material layer 2760, which can include a stack of multiple dielectric material sublayers that are component layers of the logic dielectric material layer 2760.

The first metal line structures (884, 886) located at the first metal line level include first source-connection metal line structures 884 that are electrically connected to output nodes of the source power supply circuit in the peripheral circuitry of the logic die 2000, and first bit-line-connection metal line structures 886 that are electrically connected to nodes of a sense amplifier and bit line driver circuit, for example, through bit-line-connection contact via structures 806. The bit-line-connection contact via structures 806 can be electrically connected to gate electrodes, source regions, or drain regions of complementary metal oxide semiconductor (CMOS) transistors in a respective sense amplifier and bit line driver circuit.

The first metal via structures (814, 816) located at the first metal via level include first source-connection metal via structures 814 that contact a top surface of a respective one of the first source-connection metal line structures 884, and first bit-line-connection metal via structures 816 that contact a top surface of a respective one of the first bit-line-connection metal line structures 886.

The second metal line structures (824, 826) located at a second metal line level include isolated source-connection line-level structures 824 that contact a respective one of the first source-connection metal via structures 814, and second bit-line-connection metal line structures 826 that contact a top surface of a respective one of the bit-line-connection metal via structures 816.

The pad-connection-level via structures (834, 836) located at the pad connection level include second source-connection metal via structures 834 that contact a top surface of a respective one of the isolated source-connection line-level structures 824, and second bit-line-connection metal via structures 836 that contact a top surface of a respective one of the second bit-line-connection metal line structures 826.

The logic-side bonding pads 2792 can includes a pad-level mesh structure 2792A electrically connected to a source power supply circuit within the peripheral circuitry through the second source-connection metal via structures 834. The pad-level mesh structure 2792A can contact the top surface of each second source-connection metal via structure 834. The pad-level mesh structure 2792A may include an array of discrete openings therethrough. Further, the logic-side bonding pads 2792 can comprise discrete logic-side bonding pads 2792B electrically isolated one from another and from the pad-level mesh structure 2792A. The discrete logic-side bonding pads 2792B can contact a top surface of a respective one of the second bit-line-connection metal line structures 826.

A memory-containing die (1000, 1000') described above can be provided with memory-side bonding pads 1792. The memory-side bonding pads 1792 can be arranged such that the each of the memory-side bonding pads 1792 can bond with the pad-level mesh structure 2792A or one of the discrete logic-side bonding pads 2792B. The pad-level mesh structure 2792A can be provided as a plurality of pad-level mesh structures 2792A that are laterally spaced apart by groups of discrete logic-side bonding pads 2792B. The logic-side bonding pads 2792 can be bonded to a respective one, or a respective subset, of the memory-side bonding pads 1792 using any of the methods described above. In one embodiment, each of the discrete logic-side bonding pads 2792B can be bonded to a respective one of the memory-side bonding pads 1792, and the pad-level mesh structure 2792A can be bonded to a respective plurality of memory-side bonding pads 1792 that are electrically connected to the laterally-elongated contact via structure 76 that are configured to distribute the source power supply voltage that is provided by the source power supply circuits in the peripheral circuitry of the logic die 2000.

In one embodiment, a second bit-line-connection metal via structure 836 (as illustrated in FIG. 45) can contact one of the discrete logic-side bonding pads 2792B. A second bit-line-connection metal line structure 826 can contact a bottom surface of the second bit-line-connection metal via structure 836 and can laterally extend to a region underneath a portion of the pad-level mesh structure 2792A, such as the region in which the second bit-line-connection metal line structure 826 underlies the pad-level mesh structure 2792A as illustrated in FIG. 44. A first bit-line-connection metal via structure 816 can contact a bottom surface of the second bit-line-connection metal line structure 826 (as illustrated in FIG. 44), and can be electrically connected to a sense amplifier within the peripheral circuitry. The second bit-line-connection metal line structure 826, the pad-level mesh structure 2792A, and the first bit-line-connection metal via structure 816 can overlap one another in a plan view (such as the view of FIG. 41) along a direction perpendicular to an interface between the memory-containing die (1000 or 1000') and the logic die 2000 as illustrated in FIG. 44. The sense amplifiers that underlie the areas of the pad-level mesh structure 2792A can be connected to the bit lines 98 in the memory-containing die (1000 or 1000') without disrupting the lateral extent of the pad-level mesh structure 2792A.

A subset of the pad-connection-level via structures (834, 836), such as the second bit-line-connection metal via structures 836, can contact a respective one of the discrete logic-side bonding pads 2792B. In one embodiment, a single pad-level mesh structure 2792A can contact each of the second source-connection metal via structures 834. The single pad-level mesh structure 2792A can provide a source power distribution network within the logic die 2000 that spans the entire area of a memory array region within the memory-containing die (1000, 1000') that is bonded to the logic die 2000. In one embodiment, each of the discrete logic-side bonding pads 2792B can be located within a respective opening through the pad-level mesh structure 2792A.

Referring to all drawings and according to various embodiments of the present disclosure, a three-dimensional memory device having a bonded assembly is provided, which comprises: a memory-containing die (1000 or 1000') comprising a three-dimensional memory array of memory elements (which may be embodied, for example, as portions of charge storage layers 54 located at levels of electrically conductive layers (146, 246)), a memory dielectric material layer 1760 located on a first side of the three-dimensional memory array, and memory-side bonding pads 1792 included in the memory dielectric material layer 1760 and electrically connected to a respective node within the three-dimensional memory array; and a logic die 2000 comprising a peripheral circuitry configured to control operation of the three-dimensional memory array, logic dielectric material layers 2760 located on a first side of the peripheral circuitry, and logic-side bonding pads 2792 included in the logic dielectric material layers 2760 and electrically connected to a respective node of the peripheral circuitry and bonded to a respective one, or a respective subset, of the memory-side bonding pads 1792. The logic-side bonding pads 2792 comprise: a pad-level mesh structure 2792A electrically connected to a source power supply circuit within the peripheral circuitry and including an array of discrete openings therethrough; and discrete logic-side bonding pads 2792B electrically isolated one from another and from the pad-level mesh structure 2792A.

In one embodiment, the discrete logic-side bonding pads 2792B are electrically connected to a sense circuit within the peripheral circuitry through a subset of metal interconnect structures (836, 826, 816, 886, 806) included within the logic dielectric material layers 2760.

In one embodiment, the sense circuit comprises multiple groups of sense amplifiers (each of which may be located in an area labeled "2-SA") that are laterally spaced apart one from another; each group (such as a group located within four contiguous areas labeled "2-SA") among the multiple groups of sense amplifiers includes plural sense amplifiers; discrete logic-side bonding pads 2792B are arranged as groups of logic-side bonding pads 2792B that overlie a respective group of sense amplifiers; and each group of logic-side bonding pads 2792B includes plural logic-side bonding pads that are connected to an input node of a respective one of the sense amplifiers. Each among the multiple groups of sense amplifiers can include two through sixteen, such as six through twelve, for example eight sense amplifiers. The number of sense amplifiers can be selected based on transistor pitch, bit line pitch and other factors. Each group of logic-side bonding pads 2792B can include the same number (e.g., two through sixteen, such as six through twelve, for example eight) of logic-side bonding pads as there are sense amplifiers.

In one embodiment, the subset of metal interconnect structures (836, 826, 816, 886, 806) comprises: pad-connection-level via structures (such as second bit-line-connection metal via structures 836) contacting a respective one of the discrete logic-side bonding pads 2792B; interconnect metal line structures (such as second bit-line-connection metal line structures 826) contacting a respective one of the pad-connection-level via structures; and interconnect metal via structures (such as first bit-line-connection metal via structures 816) contacting a respective one of the interconnect metal line structures.

In one embodiment, the memory-side bonding pads 1792 comprise: a plurality of memory-side source connection bonding pads electrically connected to source regions 61 within the memory-containing die (1000 or 1000') and bonded to the pad-level mesh structure 2792A; and a plurality of memory-side bit line connection bonding pads electrically connected to bit lines 98 within the memory-containing die (1000 or 1000') and bonded to a respective one of the discrete logic-side bonding pads 2792B.

In one embodiment, the logic die 2000 comprises: a pad-connection-level via structure (such as a second bit-line-connection metal via structure 836) contacting one of the discrete logic-side bonding pads 2792B; an interconnect metal line structure (such as a second bit-line-connection metal line structure 826) contacting a bottom surface of the pad-connection-level via structure and laterally extending to a region underneath a portion of the pad-level mesh structure 2792A (such as the region in which a second bit-line-connection metal line structure 826 underlies the pad-level mesh structure 2792A as illustrated in FIG. 44); an interconnect metal via structure (such as a first bit-line-connection metal via structure 816 illustrated in FIG. 44) contacting a bottom surface of the interconnect metal line structure and electrically connected to a sense amplifier within the peripheral circuitry. The interconnect metal line structure (such as the second bit-line-connection metal line structure 826 of FIG. 44), the pad-level mesh structure 2792A, and the interconnect metal via structure (such as the first bit-line-connection metal via structure 816 illustrated in FIG. 44) overlap one another in a plan view (such as the view of FIG. 41) along a direction perpendicular to an interface between the memory-containing die (1000 or 1000') and the logic die 2000, and the pad-level mesh structure 2792A is electrically isolated from the interconnect metal via structure and the interconnect metal line structure.

In one embodiment, the memory-containing die (1000 or 1000') comprises: a two-dimensional array of memory stack structures 55 including a respective vertical semiconductor channel 60 and a respective vertical stack of memory elements (comprising portions of charge storage layers 54 located at levels of the electrically conductive layers (146, 246)); source regions 61 electrically connected to a first end of the vertical semiconductor channels 60; and a first subset of memory-side metal interconnect structures 1780 electrically connecting the source regions 61 to a first subset of the memory-side bonding pads 1792 that is bonded to the pad-level mesh structure 2792A.

In one embodiment, the memory-containing die (1000 or 1000') comprises: bit lines 98 electrically connected to a second end of a respective subset of the vertical semiconductor channels 60; and a second subset of memory-side metal interconnect structures 1780 connecting the bit lines 98 to a second subset of the memory-side bonding pads 1792 that is bonded to the discrete logic-side bonding pads 2792B.

In one embodiment, the three-dimensional memory array includes a two-dimensional array of vertical NAND strings located in the memory die; each vertical NAND string in the array of vertical NAND strings comprises charge storage elements (such as portions of charge storage layers 54 located at the levels of the electrically conductive layers (146, 246)) controlled by word lines (comprising a subset of the electrically conductive layers (146, 246)) and a vertical semiconductor channel 60; a first end portion of each vertical semiconductor channel is electrically connected to a respective source region 61 (for example, through a horizontal channel portion 59); a second end portion of each vertical semiconductor channel 60 is electrically connected to a respective bit line; the pad-level mesh structure 2792A is electrically connected to each of the source regions 61; and the discrete logic-side bonding pads 2792B is electrically connected to a respective one of the bit lines 98.

The various embodiments of the present disclosure provide a source power supply network within a logic die 2000, and minimizes the electrical wiring requirement for source power distribution within the memory-containing die (1000 or 1000'). The electrical connections for the bit lines 98 to the nodes of sense amplifiers and bit line drivers in the periphery circuitry of the logic die 2000 can be provided by using openings within a pad-level mesh structure 2792A or by using gaps between neighboring pairs of pad-level mesh structures 2792A, thereby minimizing disruption of the source power supply network on the side of the logic die 2000.

The various embodiments of the present disclosure provide stacking of a memory-containing die and a logic die for incorporation into a single semiconductor package, thereby reducing the packaging cost and increasing the data transfer speed between the memory-containing die and the logic die. Furthermore, thermal cycling on the CMOS devices can be reduced by separately manufacturing the memory-containing die and the logic die, and by bonding the dies together after manufacturing the dies.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
a memory-containing die comprising a three-dimensional memory array, a memory dielectric material layer located on a first side of the three-dimensional memory array, and memory-side bonding pads included in the memory dielectric material layer and electrically connected to a respective node within the three-dimensional memory array; and
a logic die comprising a peripheral circuitry configured to control operation of the three-dimensional memory array, logic dielectric material layers located on a first side of the peripheral circuitry, and logic-side bonding pads included in the logic dielectric material layers and electrically connected to a respective node of the peripheral circuitry and bonded to a respective one, or a respective subset, of the memory-side bonding pads, wherein the logic-side bonding pads comprise:

a pad-level mesh structure electrically connected to a source power supply circuit within the peripheral circuitry and including an array of discrete openings therethrough; and discrete logic-side bonding pads electrically isolated one from another and from the pad-level mesh structure.

2. The three-dimensional memory device of claim 1, wherein the discrete logic-side bonding pads are electrically connected to a sense circuit within the peripheral circuitry through a subset of metal interconnect structures included within the logic dielectric material layers.

3. The three-dimensional memory device of claim 2, wherein:
the sense circuit comprises multiple groups of sense amplifiers that are laterally spaced apart one from another;
each group among the multiple group of sense amplifiers includes plural sense amplifiers;
discrete logic-side bonding pads are arranged as groups of logic-side bonding pads that overlie a respective group of sense amplifiers; and
each group of logic-side bonding pads includes plural logic-side bonding pads that are connected to an input node of a respective one of the sense amplifiers.

4. The three-dimensional memory device of claim 2, wherein the subset of metal interconnect structures comprises:
pad-connection-level via structures contacting a respective one of the discrete logic-side bonding pads;
interconnect metal line structures contacting a respective one of the pad-connection-level via structures; and
interconnect metal via structures contacting a respective one of the interconnect metal line structures.

5. The three-dimensional memory device of claim 1, wherein the logic die comprises:
line-level mesh structures included within the logic dielectric material layers and including a plurality of openings therethrough; and
pad-connection-level via structures contacting the pad-level mesh structure and a respective one of the line-level mesh structures.

6. The three-dimensional memory device of claim 5, wherein the logic die comprises additional pad-connection-level via structures contacting a respective one of the discrete logic-side bonding pads and located at a same level as the pad-connection-level via structures.

7. The three-dimensional memory device of claim 6, wherein a plurality of the additional pad-connection-level via structures is located between a neighboring pair of line-level mesh structures among the line-level mesh structures.

8. The three-dimensional memory device of claim 5, wherein:
the logic die further comprises additional pad-level mesh structures contacting a respective subset of the pad-connection-level via structures; and
each of additional pad-level mesh structures is electrically connected to the line-level mesh structures.

9. The three-dimensional memory device of claim 1, wherein each of the discrete logic-side bonding pads is located within a respective opening through the pad-level mesh structure.

10. The three-dimensional memory device of claim 9, wherein the memory-side bonding pads comprise:

a plurality of memory-side source connection bonding pads electrically connected to source regions within the memory-containing die and bonded to the pad-level mesh structure; and a plurality of memory-side bit line connection bonding pads electrically connected to bit lines within the memory-containing die and bonded to a respective one of the discrete logic-side bonding pads.

11. The three-dimensional memory device of claim 9, wherein the logic die comprises:
a pad-connection-level via structure contacting one of the discrete logic-side bonding pads;
an interconnect metal line structure contacting a bottom surface of the pad-connection-level via structure and laterally extending to a region underneath a portion of the pad-level mesh structure; and
an interconnect metal via structure contacting a bottom surface of the interconnect metal line structure and electrically connected to a sense amplifier within the peripheral circuitry,
wherein the interconnect metal line structure, the pad-level mesh structure, and the interconnect metal via structure overlap one another in a plan view along a direction perpendicular to an interface between the memory-containing die and the logic die; and
wherein the pad-level mesh structure is electrically isolated from the interconnect metal via structure and the interconnect metal line structure.

12. The three-dimensional memory device of claim 1, wherein the memory-containing die comprises:
a two-dimensional array of memory stack structures including a respective vertical semiconductor channel and a respective vertical stack of memory elements;
source regions electrically connected to a first end of the vertical semiconductor channels; and
a first subset of memory-side metal interconnect structures electrically connecting the source regions to a first subset of the memory-side bonding pads that is bonded to the pad-level mesh structure.

13. The three-dimensional memory device of claim 12, wherein the memory-containing die comprises:
bit lines electrically connected to a second end of a respective subset of the vertical semiconductor channel; and
a second subset of memory-side metal interconnect structures connecting the bit lines to a second subset of the memory-side bonding pads that is bonded to the discrete logic-side bonding pads.

14. The three-dimensional memory device of claim 1, wherein:
the three-dimensional memory array comprises a two-dimensional array of vertical NAND strings located in the memory die;
each vertical NAND string in the array of vertical NAND strings comprises charge storage elements controlled by word lines and a vertical semiconductor channel;
a first end portion of each vertical semiconductor channel is connected to a respective source region;
a second end portion of each vertical semiconductor channel is connected to a respective bit line;
the pad-level mesh structure is electrically connected to each of the source regions; and
the discrete logic-side bonding pads is electrically connected to a respective one of the bit lines.

15. A method of forming a three-dimensional memory device, comprising:
- providing a memory-containing die comprising a three-dimensional memory array, a memory dielectric material layer located on a first side of the three-dimensional memory array, and memory-side bonding pads included in the memory dielectric material layer and electrically connected to a respective node within the three-dimensional memory array;
- providing a logic die comprising a peripheral circuitry configured to control operation of the three-dimensional memory array, logic dielectric material layers located on a first side of the peripheral circuitry, and logic-side bonding pads included in the logic dielectric material layers and electrically connected to a respective node of the peripheral circuitry, wherein the logic-side bonding pads comprise a pad-level mesh structure electrically connected to a source power supply circuit within the peripheral circuitry and including an array of discrete openings therethrough, and discrete logic-side bonding pads electrically isolated one from another and from the pad-level mesh structure; and
- bonding the logic-side bonding pads to a respective one, or a respective subset, of the memory-side bonding pads.

16. The method of claim 15, wherein the logic die comprises:
- line-level mesh structures included within the logic dielectric material layers and including a plurality of openings therethrough; and
- pad-connection-level via structures contacting the pad-level mesh structure and a respective one of the line-level mesh structures.

17. The method of claim 16, wherein:
- the logic die comprises additional pad-connection-level via structures contacting a respective one of the discrete logic-side bonding pads and located at a same level as the pad-connection-level via structures; and
- a plurality of the additional pad-connection-level via structures is located between a neighboring pair of line-level mesh structures among the line-level mesh structures.

18. The method of claim 16, wherein:
- the logic die further comprises additional pad-level mesh structures contacting a respective subset of the pad-connection-level via structures; and
- each of additional pad-level mesh structures is electrically connected to the line-level mesh structures.

19. The method of claim 15, wherein:
- each of the discrete logic-side bonding pads is formed within a respective opening through the pad-level mesh structure by patterning a conductive bonding material; and
- the memory-side bonding pads comprise a plurality of memory-side source connection bonding pads electrically connected to source regions within the memory-containing die and bonded to the pad-level mesh structure, and a plurality of memory-side bit line connection bonding pads electrically connected to bit lines within the memory-containing die and bonded to a respective one of the discrete logic-side bonding pads.

20. The method of claim 19, wherein the logic die comprises:
- a pad-connection-level via structure contacting one of the discrete logic-side bonding pads;
- an interconnect metal line structure contacting a bottom surface of the pad-connection-level via structures and laterally extending to a region underneath a portion of the pad-level mesh structure; and
- an interconnect metal via structure contacting a bottom surface of the interconnect metal line structure and electrically connected to a sense amplifier within the peripheral circuitry,
- wherein the interconnect metal line structure, the pad-level mesh structure, and the interconnect metal via structure overlap one another in a plan view along a direction perpendicular to an interface between the memory-containing die and the logic die; and
- wherein the pad-level mesh structure is electrically isolated from the interconnect metal via structure and the interconnect metal line structure.

* * * * *